(12) United States Patent
Song

(10) Patent No.: US 12,238,928 B2
(45) Date of Patent: Feb. 25, 2025

(54) THREE-DIMENSIONAL FLASH MEMORY WITH REDUCED WIRE LENGTH AND MANUFACTURING METHOD THEREFOR

(71) Applicant: Samsung Electronics Co., Ltd., Suwon-si (KR)

(72) Inventor: Yun Heub Song, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 43 days.

(21) Appl. No.: 18/154,210

(22) Filed: Jan. 13, 2023

(65) Prior Publication Data

US 2023/0143256 A1    May 11, 2023

Related U.S. Application Data

(63) Continuation of application No. 16/634,762, filed as application No. PCT/KR2018/006516 on Jun. 8, 2018, now Pat. No. 11,581,327.

(30) Foreign Application Priority Data

Jul. 28, 2017   (KR) ......................... 10-2017-0095792

(51) Int. Cl.
*H10B 43/27*   (2023.01)
*H10B 43/35*   (2023.01)
*H10B 43/40*   (2023.01)

(52) U.S. Cl.
CPC ............. *H10B 43/27* (2023.02); *H10B 43/35* (2023.02); *H10B 43/40* (2023.02)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS 8,996,838 B1    3/2015   D'Abreu et al.
2007/0252201 A1  11/2007  Kito et al.
(Continued)

FOREIGN PATENT DOCUMENTS

KR    10-2009-0047614 A    5/2009
KR    10-2013-0076372 A    7/2013
(Continued)

OTHER PUBLICATIONS

Written Opinion of the International Searching Authority of PCT/KR2018/006516 dated Sep. 19, 2018.
(Continued)

*Primary Examiner* — Didarul A Mazumder
*Assistant Examiner* — Gustavo G Ramallo
(74) *Attorney, Agent, or Firm* — Harness, Dickey & Pierce, P.L.C.

(57) ABSTRACT

A three-dimensional flash memory is provided, and technique to suppress interference caused by an inter-cell insulation layer in a vertical cell and to form a stable vertical channel layer, a technique to reduce a length of wire than a conventional three-dimensional flash memory for overcoming problems of deterioration of chip characteristics such as operation speed and power consumption and difficulty of wiring technique in the manufacturing process, and a technique to improve horizontal density of channel layers and ONO layers are proposed.

17 Claims, 65 Drawing Sheets

(58) Field of Classification Search
CPC ........ H10B 53/50; H10B 41/00; H10B 41/10;
H10B 41/20; H10B 41/23; H10B 41/27;
H10B 41/30; H10B 41/35; H10B
41/40–44; H10B 41/46–50; H10B 41/60;
H10B 41/70; H10B 43/00; H10B 43/10;
H10B 43/20; H10B 43/23; H10B 43/27;
H10B 43/30; H10B 43/35; H10B 43/40;
H10B 43/50; H10B 51/00; H10B 51/10;
H10B 51/20; H10B 51/30; H10B 51/40;
H10B 51/50

See application file for complete search history.

(56) References Cited

U.S. PATENT DOCUMENTS

| | | | |
|---|---|---|---|
| 2009/0121271 A1 | 5/2009 | Son et al. | |
| 2010/0213537 A1 | 8/2010 | Fukuzumi et al. | |
| 2011/0018051 A1 | 1/2011 | Kim et al. | |
| 2013/0170303 A1 | 7/2013 | Ahn et al. | |
| 2013/0328005 A1 | 12/2013 | Shin et al. | |
| 2014/0035025 A1 | 2/2014 | Kwak | |
| 2014/0239376 A1* | 8/2014 | Zhang | H01L 29/7827 438/591 |
| 2015/0294980 A1* | 10/2015 | Lee | H10B 43/27 438/591 |
| 2015/0380431 A1 | 12/2015 | Kanamori et al. | |
| 2016/0141419 A1* | 5/2016 | Baenninger | H10B 41/20 257/314 |
| 2016/0181259 A1* | 6/2016 | Van Houdt | H10B 51/30 257/295 |
| 2017/0040337 A1 | 2/2017 | Kim et al. | |
| 2017/0062459 A1 | 3/2017 | Yoshimizu et al. | |
| 2017/0069731 A1 | 3/2017 | Kim et al. | |
| 2018/0350606 A1* | 12/2018 | Chen | H01L 21/02274 |
| 2018/0350830 A1* | 12/2018 | Lim | H01L 29/0657 |

FOREIGN PATENT DOCUMENTS

| | | |
|---|---|---|
| KR | 10-2014-0018544 A | 2/2014 |
| KR | 10-2016-0000703 A | 1/2016 |

OTHER PUBLICATIONS

International Search Report of PCT/KR2018/006516 dated Sep. 19, 2018.

Non-Final Office Action issued Jun. 10, 2021 in U.S. Appl. No. 16/634,762.

Final Office Action issued Nov. 19, 2021 in U.S. Appl. No. 16/634,762.

Non-Final Office Action issued Aug. 4, 2022 in U.S. Appl. No. 16/634,762.

Notice of Allowance issued Oct. 14, 2022 in U.S. Appl. No. 16/634,762.

* cited by examiner

FIG. 2D
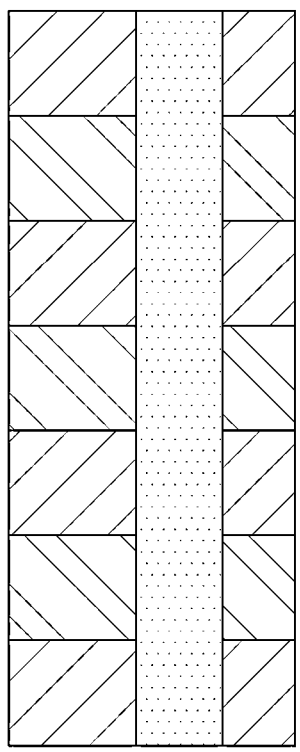
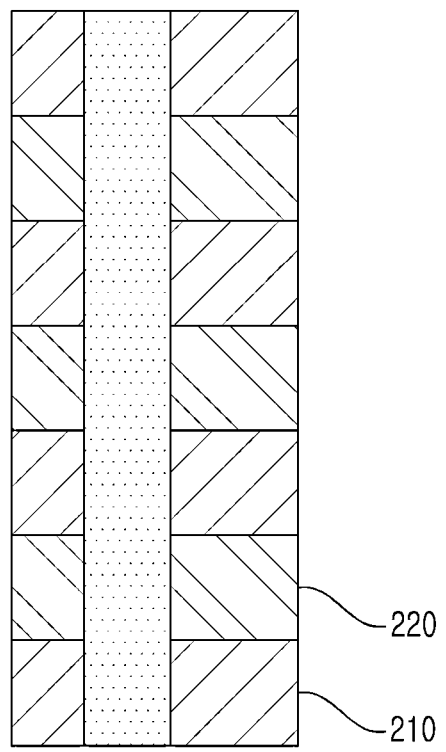

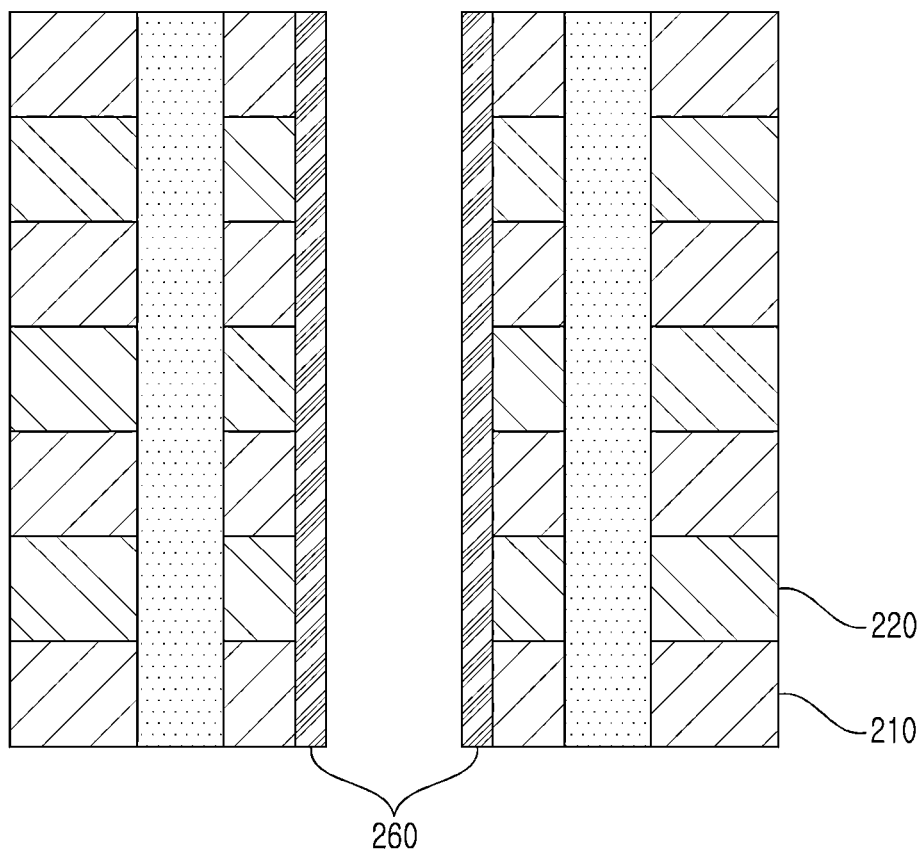

FIG. 2F
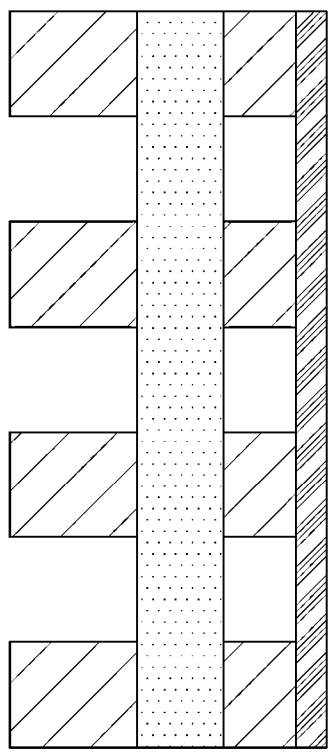
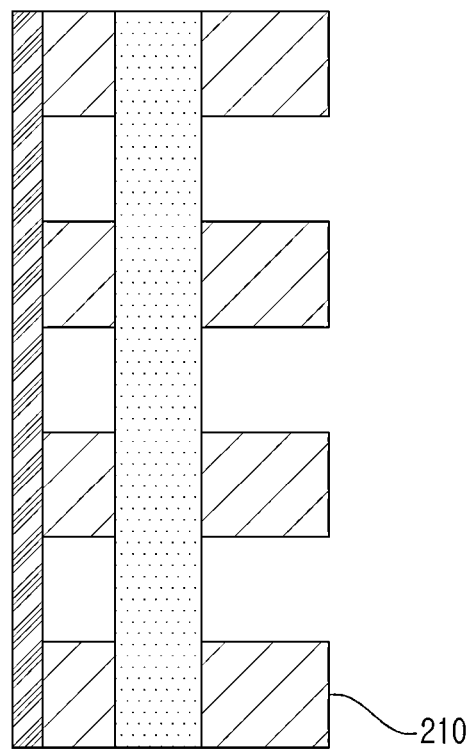
200
210

FIG. 3F
300
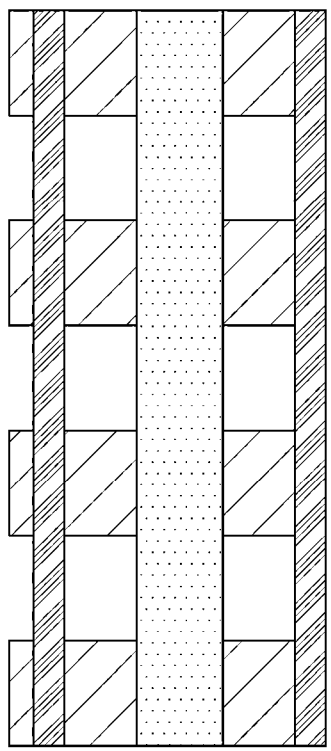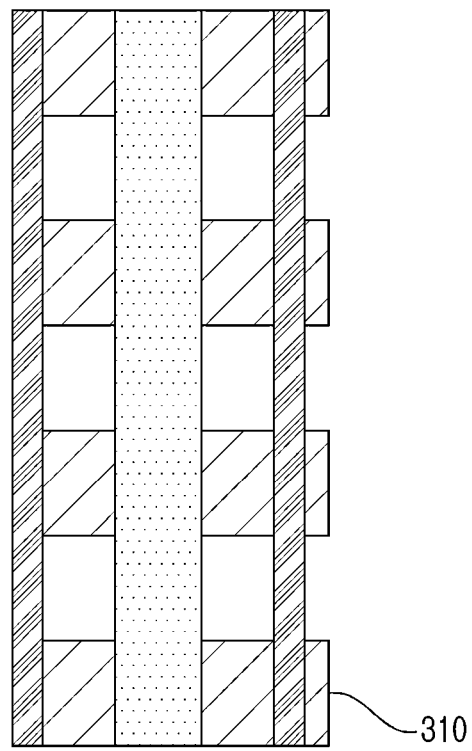
310

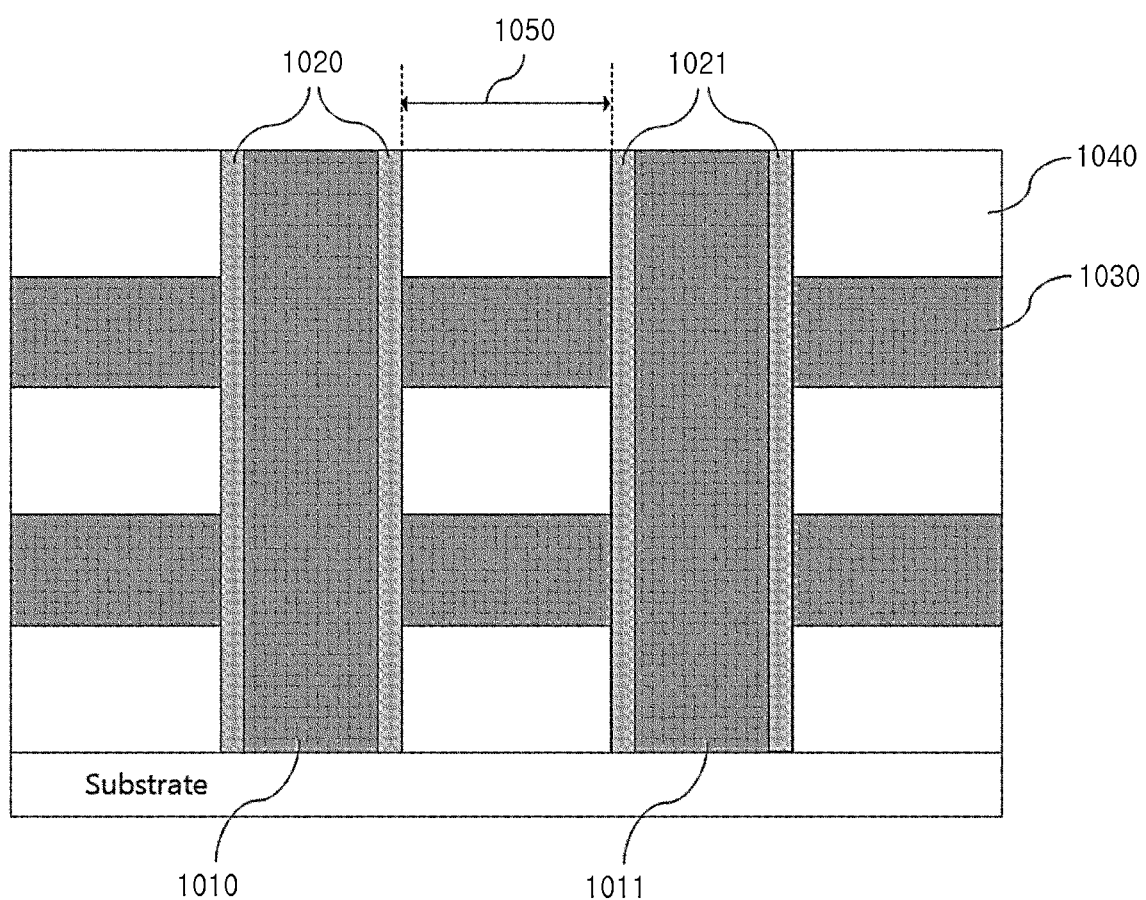

1200

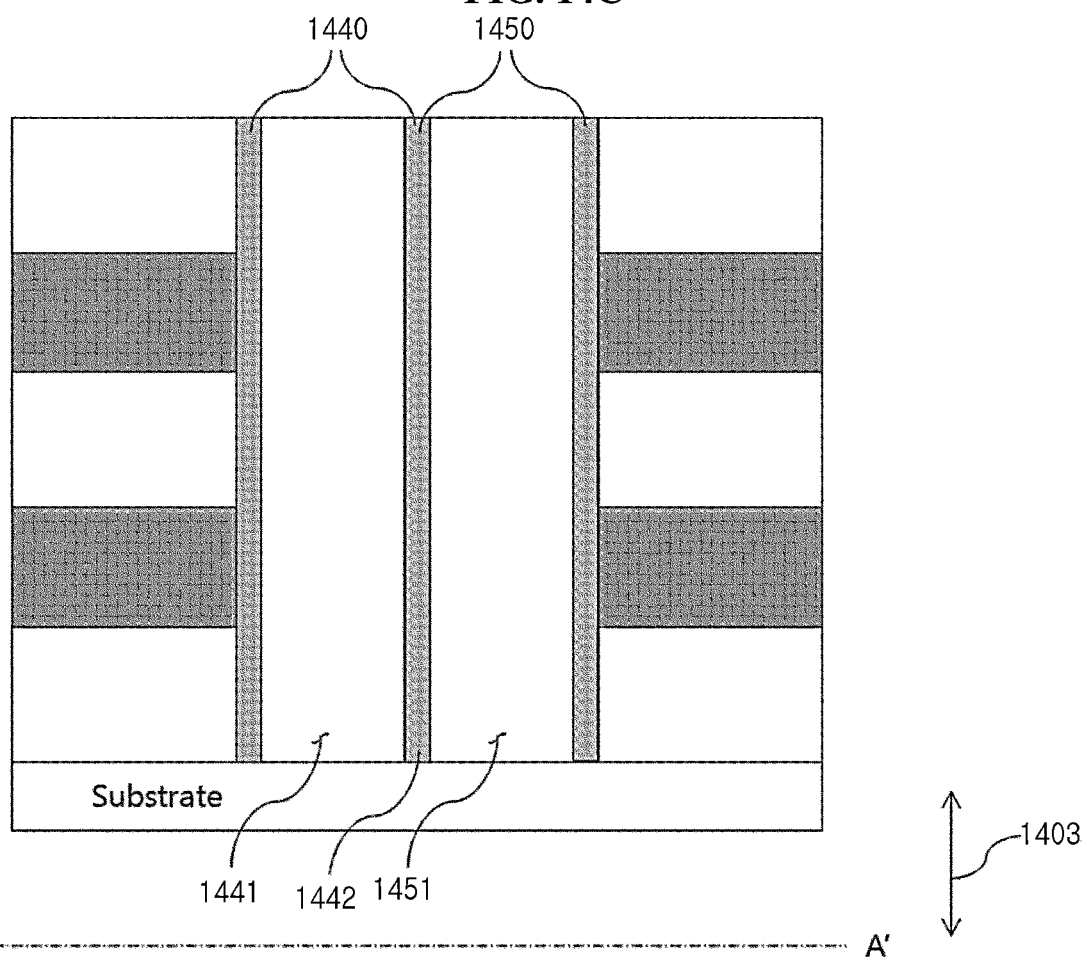

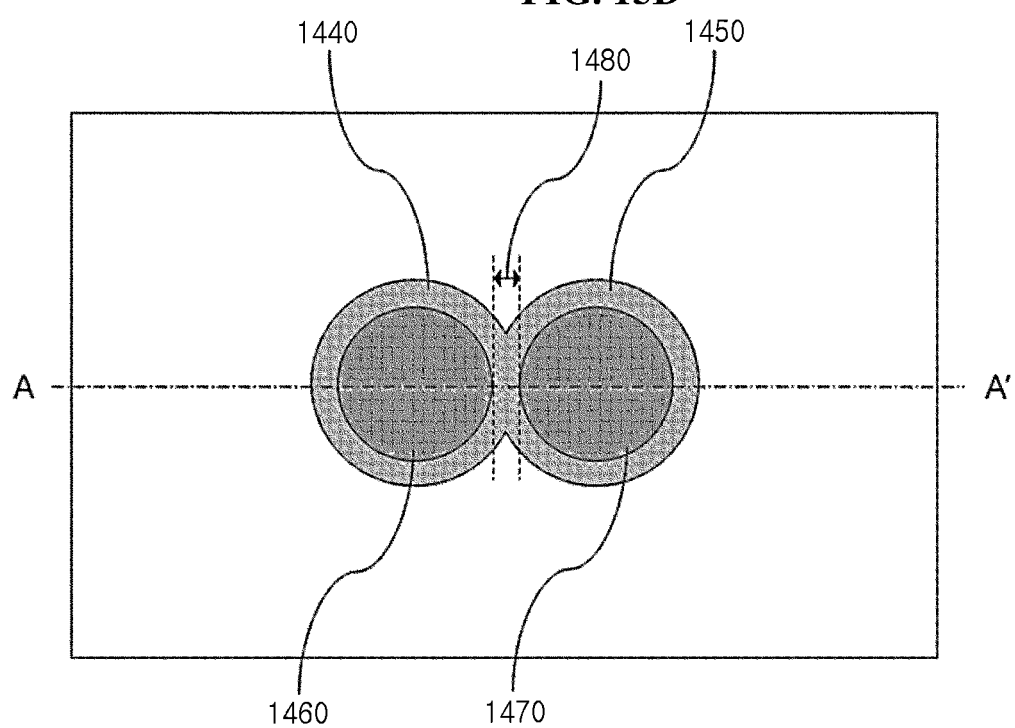

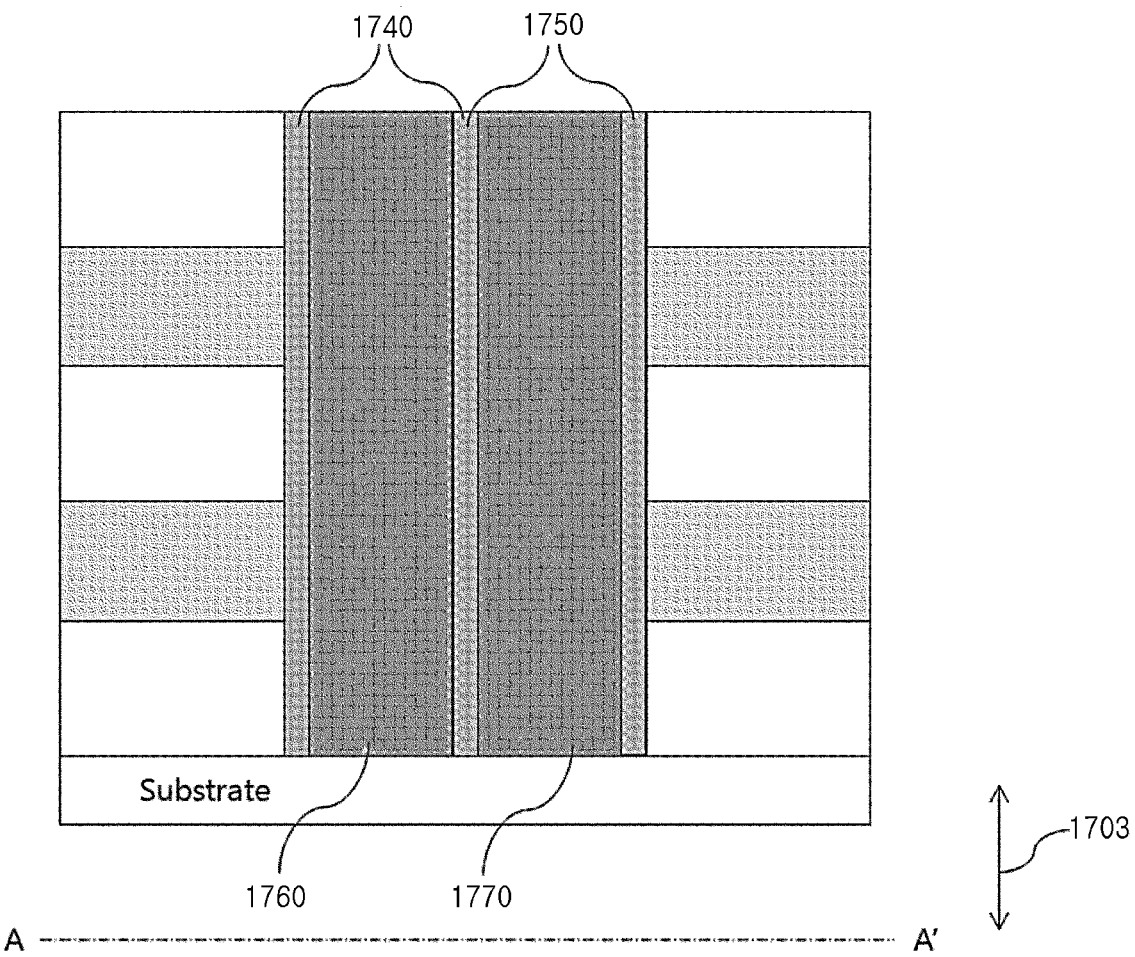

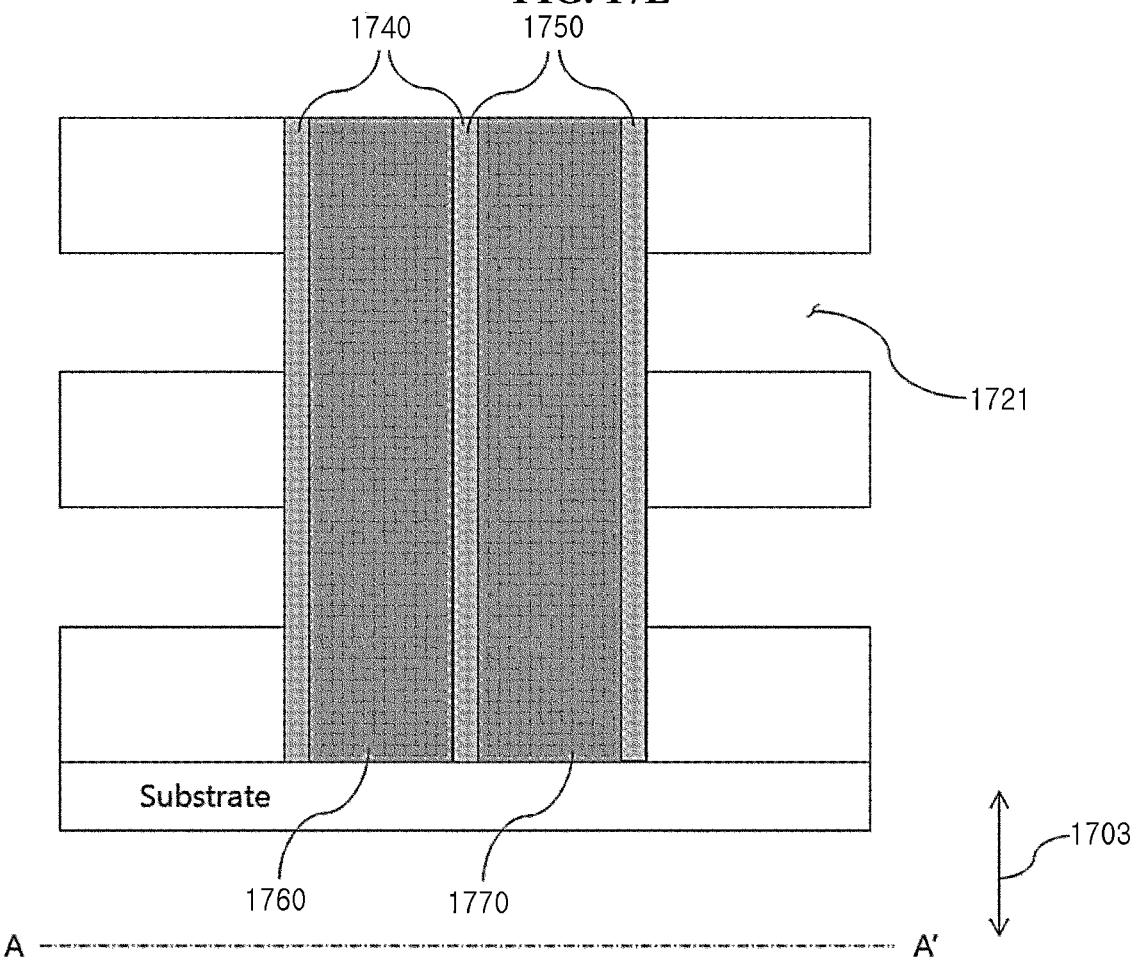

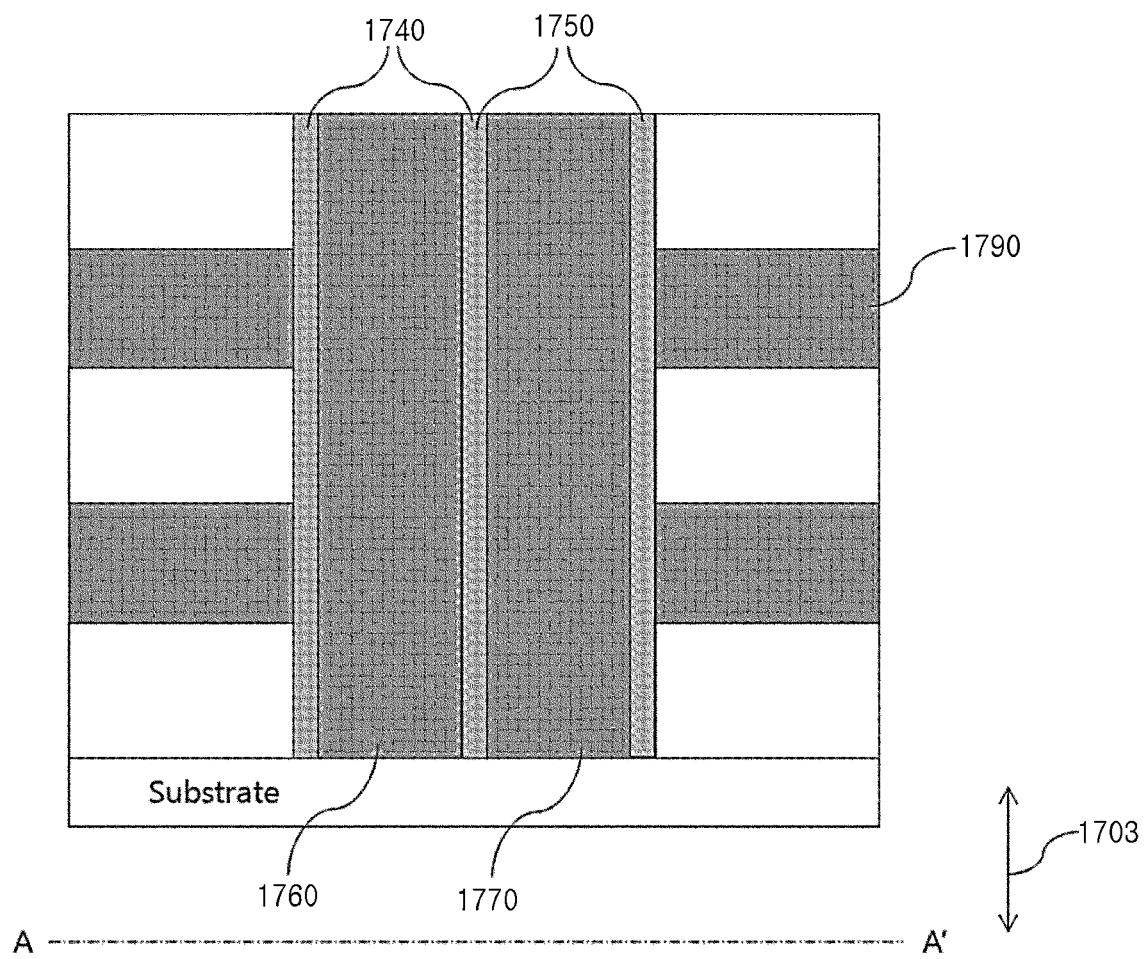

2100

THREE-DIMENSIONAL FLASH MEMORY WITH REDUCED WIRE LENGTH AND MANUFACTURING METHOD THEREFOR

CROSS REFERENCE TO RELATED APPLICATIONS

This application is a Continuation of U.S. application Ser. No. 16/634,762, filed on May 26, 2020, which is a National Stage of International Application No. PCT/KR2018/006516 filed Jun. 8, 2018, claiming priority based on Korean Patent Application No. 10-2017-0095792 filed Jul. 28, 2017, the entire contents of each of which are incorporated herein by reference.

TECHNICAL FIELD

The following embodiments relate to a three dimensional flash memory and a manufacturing method thereof.

BACKGROUND ART

A flash Memory device may be an electrically erasable programmable read only memory (EEPROM) and may be commonly used for, for example, a computer, a digital camera, an MP3 player, a game system, a memory stick, and the like. The flash memory electrically controls input/output of data by Fowler-Nordheim (F-N) tunneling or hot electron injection.

The flash memory device has been high-capacity by continuous scaling to be used as a storage memory in various fields. Currently, it is expected to mass-produce 32 Gbit products of 30 nm class, and it is expected to be scaled to below 10 nm with floating gate technology.

For achieving high integration of the flash memory device, it is necessary to replace a two-dimensional structure with a three-dimensional structure. A NAND flash memory device may connect memory cells in a string form without a need for contact formation per memory cell, which is advantageous for implementing various three-dimensional structures in a vertical direction. Accordingly, a three-dimensional NAND flash memory has been recently studied in various ways.

For example, referring to FIG. 19 illustrating an array of a conventional three-dimensional flash memory, the array of three-dimensional flash memory may include common source lines CSL, bit lines BL, and a plurality of cell strings CSTR between each common source line CSL and each bit line BL.

The bit lines are arranged in two dimensions, and the plurality of cell strings CSTR are connected in parallel thereto. The cell strings CSTR may be commonly connected to the common source line CSL. That is, the plurality of cell strings CSTR may be disposed between the plurality of bit lines and one common source line CSL. In this case, the common source line CSL may be plural and the plurality of common source lines CSL may be two-dimensionally arranged. Here, the same voltage may be applied to the plurality of common source lines CSL, or each of the plurality of common source lines CSL may be electrically controlled.

Each of the cell strings CSTR may include a ground select transistor GST connected to the common source line CSL, a string select transistor SST connected to the bit line BL, and a plurality of memory cell transistors MCT between the ground and string select transistors GST and SST. In addition, the ground select transistor GST, the string select transistor SST, and the memory cell transistors MCT may be connected in series.

The common source line CSL may be commonly connected in common to sources of the ground select transistors GST. In addition, the ground select line GSL, the plurality of word lines WL0 to WL3, and the plurality of string select lines SSL, which are disposed between the common source line CSL and the bit lines BL, may be used as electrode layers of the ground select transistor GST, the memory cell transistors MCT, and the string select transistors SST, respectively. In addition, each of the memory cell transistors MCT includes a memory element.

Meanwhile, for meeting high performance and low price demanded by consumers, the conventional three-dimensional flash memory may allow cells to be vertically stacked to increase integration.

For example, referring to FIG. 20 illustrating a structure of a conventional three-dimensional flash memory, the conventional three-dimensional flash memory is manufactured to allow an electrode structure 2015, in which interlayer insulating layers 2011 and horizontal structures 2040 are formed on a substrate 2000, alternately and repeatedly. The interlayer insulating layers 2011 and the horizontal structures 2040 may extend in a first direction. For example, each of the interlayer insulating layers 2011 may be a silicon oxide layer, and the lowermost interlayer insulating layer 2011a of the interlayer insulating layers 2011 may have a thickness thinner than those of the other interlayer insulating layers 2011. Each of horizontal structures 2040 may include first and second blocking insulating layers 2042 and 2043 and an electrode layer 2045. The electrode structure 2015 may be provided in plurality, and the plurality of electrode structures 2015 may be disposed to face each other in a second direction crossing the first direction. The first and second directions may correspond to an x-axis and a y-axis of FIG. 2, respectively. A common source line CSL of a highly doped impurity region, which is disposed between the plurality of electrode structures 2015 to be spaced apart from the plurality of electrode structures 2015 may extend in a vertical direction. The vertical direction may correspond to a z-axis.

Vertical structures 2030 penetrating the electrode structure 2015 may be disposed. As an example, in plan view, the vertical structures 2030 may be arranged in a matrix form aligned along the first and second directions. As another example, the vertical structures 2030 may be aligned in the second direction, but may be disposed in a zigzag shape in the first direction. Each of the vertical structures 2030 may include a passivation layer 2024, a charge storage layer 2025, a tunnel insulation layer 2026, and a channel layer 2027. For example, the channel layer 2027 may be disposed in a hollow tubular shape, and in this case, a buried layer 2028 may be further disposed to fill an inner portion of the channel layer 2027. A drain region "D" is disposed on the channel layer 2027 and a conductive pattern 2029 is formed on the drain region "D" to be connected to a bit line BL. The bit line BL may extend in a direction crossing the horizontal electrodes 2045, for example, in the second direction. For example, the vertical structures 2030 aligned in the second direction may be connected to one bit line BL.

The first and second blocking insulating layers 2042 and 2043 included in the horizontal structure 2040 and the charge storage layer 2025 and the tunnel insulating layer 2026 included in the vertical structures 2030 may be defined as an oxide-nitride-oxide (ONO) layer which is a storage information element of the three-dimensional flash memory.

That is, some of the information storage elements may be included in the vertical structures 2030 and the other information storage elements may be included in the horizontal structures 2040. In an example, the charge storage layer 2025 and the tunnel insulating layer 2026 of the information storage element may be included in the vertical structures 2030 and the first and second blocking insulating layers 2042 and 2043 may be included in the horizontal structures 2040.

Epitaxial patterns 2022 may be disposed between the substrate 2000 and the vertical structures 2030. The epitaxial patterns 2022 connect the substrate 2000 to the vertical structures 2030. The epitaxial patterns 2022 may be in contact with at least one layer of horizontal structures 2040. That is, the epitaxial patterns 2022 may be disposed to be in contact with the lowermost horizontal structure 2040a. According to another embodiment, the epitaxial patterns 2022 may be disposed to be in contact with a plurality of layers, for example, two layers of the horizontal structures 2040. Meanwhile, when the epitaxial patterns 2022 are disposed to be in contact with the lowermost horizontal structure 2040a, the lowermost horizontal structure 2040a may be thicker than the other horizontal structures 2040. The lowermost horizontal structure 2040a in contact with the epitaxial patterns 2022 may correspond to the ground selection line GSL of the array of the three-dimensional flash memory described with reference to FIG. 19 and the other horizontal structures 2040 in contact with the vertical structures 2030 may correspond to the plurality of word lines WL0 to WL3.

Each of the epitaxial patterns 2022 has a recessed sidewall 2022a. Accordingly, the lowermost horizontal structure 2040a in contact with the epitaxial patterns 2022 is disposed along a profile of the recessed sidewall 2022a. That is, the lowermost horizontal structure 2040a may be disposed in an inward convex shape along the recessed sidewall 2022a of each epitaxial pattern 2022.

In the conventional three-dimensional flash memory of the above-described structure, because circuit elements such as a transistor, a diode, or a capacitor for the electrode structure 2015 are formed on the substrate 2000 below the electrode structure 2015, as the number of stages in which the horizontal structures 2040 are vertically stacked increases, a length of wires also may become longer, and thus problems such as deterioration of chip characteristics such as operation speed and power consumption may occur and difficulties in wiring technology may be expected in a manufacturing process.

Accordingly, the following embodiments provide a technique for overcoming the above-mentioned problems and difficulties by reducing a length of the wire.

Meanwhile, referring to FIG. 10 illustrating a structure of a conventional three-dimensional flash memory, the conventional three-dimensional flash memory cell includes a channel layer 1010 extending in one direction, an oxide-nitride-oxide (ONO) layer 1020 extending in one direction to surround the channel layer 1010, a plurality of electrode layers 1030 stacked to be perpendicular to the ONO layer 1020, and a plurality of interlayer insulating layers 1040 disposed alternately with the plurality of electrode layers 1030.

A plurality of three-dimensional flash memory cells of the above-described structure are provided to constitute a three-dimensional flash memory. When the three-dimensional flash memory includes two cells as shown in the drawing, two ONO layers 1020 and 1021 included in the conventional three-dimensional flash memory are not adjacent to each other and are spaced apart by a specific distance or more. Accordingly, the two channel layers 1010 and 1011 are also not adjacent to each other and are spaced apart by a specific distance (e.g., an inter-surface distance 1050 between the two channel layers 1010 and 1021 is 100 nm apart).

Therefore, the conventional three-dimensional flash memory has a disadvantage in that horizontal integration of the channel layers 1010 and 1011 and the ONO layers 1020 and 1021 are inferior, and thus it is necessary to propose a technique for solving the problem.

In addition, as the three-dimensional flash memory is integrated at a high stage, there is a process problem in manufacturing a vertical hole. To this end, scaling of each vertical cell is important and a pitch between the vertical cells is very important to reduce a thickness of the electrode layer between the horizontal cells and a thickness of the insulation layer between the vertical cells. Meanwhile, it is difficult to reduce the thickness of the electrode layer in the horizontal direction due to a short channel effect problem and it is difficult to reduce the thickness of the insulating layer in the vertical direction because there is a problem in that inter-cell interference effect is large and the cell characteristics are degraded.

In general, an insulating layer of a silicon oxide layer and a silicon nitride layer is used as the interlayer insulating layer, and the layer has a dielectric constant of 3.9 to 7.5.

Therefore, there has been a problem that, the interference effect of neighboring cells becomes a major obstacle to the pitch scaling of the vertical cells due to the dielectric constant of the interlayer insulating layer during cell operation.

In addition, as the three-dimensional flash memory is integrated at a high stage, a large process problem occurs in manufacturing the vertical hole. Currently, as the number of vertical cells increases, a vertical step is gradually increased such as the vertical step of about 3 um in the vertical cells having 64 stages and the vertical step of about 4 um in 100 stages.

Therefore, considering a hole size of 70 nm to 100 nm, it is difficult to form a vertical polycrystalline silicon channel having a very large aspect ratio (A/R) after a deposition process of polycrystalline silicon (poly-silicon). In addition, when the vertical step is increased, the vertical hole is formed ununiformly in some vertical region or the hole size is changed in the vertical direction during forming the vertical hole, thereby affecting cell characteristics (e.g., cell Vth change).

Accordingly, a stable vertical polycrystalline silicon formation method and a differentiated chip operation method for vertical cells having different hole sizes are required to secure stable vertical cell characteristics in high-stage three-dimensional NAND flash memories of 100 or more stages.

DETAILED DESCRIPTION OF THE INVENTION

Technical Problem

Embodiments includes at least one intermediate circuit layer disposed between a plurality of electrode layers in an intermediate region of a common source line to reduce a length of a wire than a conventional three-dimensional flash memory, thereby proposing a technique to overcome a problem of degradation of chip characteristics such as operation speed and power consumption and difficulty of wiring technology in a manufacturing process.

In addition, for solving drawback of the conventional three-dimensional flash memory and improving the horizontal integration of the channel layer and the ONO layer, embodiments propose a three-dimensional flash memory and a method of manufacturing the same are provided in which at least two ONO layers extending in one direction to respectively surround at least two channel layers are in contact with each other or at least partially overlap each other.

Furthermore, embodiments provide a technique in which an insulating layer between cells including a surrounding gate in a three-dimensional device is etched to from air gaps and vacuum gaps, thereby suppressing interference caused by the inter-cell insulating layer in a vertical cell.

Furthermore, embodiments provide a technique in which a structure including different hole sizes in one vertical channel layer is formed to stably apply a channel material such as poly-silicon through one layer forming process.

In addition, embodiments provide a technique in which a structure including different hole sizes for each vertical cell group is formed to form a stable vertical channel layer in a high-level three-dimensional flash memory architecture having 100 or more stages.

Technical Solution

A three-dimensional device of a three-dimensional flash memory according to an embodiment includes a plurality of horizontal electrode layers including a plurality of air gaps and a plurality of vertical channel layers connected to the plurality of horizontal electrode layers, and perpendicular to the plurality of horizontal electrode layers, and the plurality of air gaps are formed between the plurality of horizontal electrode layers.

According to an aspect, the three-dimensional device may further include a string line formed in a contact hole penetrating between the plurality of vertical channel layers and applied with a conductive material between insulating walls of the contact hole.

A three-dimensional device of a three-dimensional flash memory according to an embodiment includes a plurality of horizontal electrode layers including a plurality of air gaps, a plurality of vertical channel layers connected to the plurality of horizontal electrode layers and perpendicular to the plurality of horizontal electrode layers, and a stand preventing a short circuit between the plurality of horizontal electrode layers, and the plurality of air gaps are formed between the plurality of horizontal electrode layers.

According to an aspect, the stand may be formed by forming an arbitrary hole formed through edges of the plurality of vertical channel layers in a plurality of interlayer insulating layers and a plurality of passivation layers formed alternately stacked on a device formation substrate and applying an insulating material in the formed arbitrary hole.

A method of manufacturing a three-dimensional device of a three-dimensional flash memory according to an embodiment includes alternately stacking a plurality of interlayer insulating layers and a plurality of passivation layers on a device formation substrate, forming a plurality of through holes penetrating outsides of the plurality of interlayer insulating layers and the plurality of passivation layers to form vertical channel layers in the through holes, forming a contact hole penetrating a center of the plurality of interlayer insulating layers and the plurality of passivation layers on which the vertical channel layers are formed to form a string line including insulating walls of the contact hole, etching the plurality of passivation layers to apply a conductive material on the etched plurality of passivation layers and the string line, and etching the plurality of interlayer insulating layers to form the three-dimensional device including a plurality of air gaps.

A three-dimensional device of a three-dimensional flash memory according to an embodiment includes a plurality of horizontal electrode layers stacked to be configured for each vertical cell group and a plurality of vertical channel layers formed in different hole sizes for each vertical cell group and perpendicular to the plurality of horizontal electrode layers.

According to an aspect, the hole size of the vertical channel layer located above the three-dimensional device may be greater than a hole size of the vertical channel layer located below the three-dimensional device.

A three-dimensional device of a three-dimensional flash memory according to an embodiment includes a plurality of horizontal electrode layers stacked to constitute each vertical cell group and a plurality of vertical channel layers having different hole sizes by each vertical cell group and perpendicular to the plurality of horizontal electrode layers, and each of the vertical channel layer maintains a hole size constant within one vertical cell group.

A method of manufacturing a three-dimensional device of a three-dimensional flash memory according to an embodiment includes forming a through hole in a plurality of horizontal electrode layers stacked to constitute each vertical cell group and forming a stand of the through hole and filling the through hole with a channel material to form a vertical channel layer.

According to an embodiment, a three-dimensional flash memory includes a common source line formed to extend in one direction, a plurality of electrode layers stacked vertically with respect to the common source line, and at least one intermediate circuit layer disposed between the plurality of electrode layers in an intermediate region of the common source line.

According to an aspect, the three-dimensional flash memory may further include a lower circuit layer disposed in a lower region of the common source line, and the at least one intermediate circuit layer and the lower circuit layer correspond to a plurality of blocks grouped with the plurality of electrode layers divided by the at least one intermediate circuit layer, respectively.

According to another aspect, the lower circuit layer may be in charge of a block positioned the lowermost region of a plurality of blocks and the at least one intermediate circuit layer may be in charge of at least one block positioned above the block positioned the lowermost region of a plurality of blocks.

According to an embodiment, a method of manufacturing a three-dimensional flash memory includes preparing at least two structures including a plurality of electrode layers and a plurality of interlayer insulating layers which are alternately stacked, and a hole penetrating the plurality of electrode layers and the plurality of interlayer insulating layers to extend in one direction, forming an intermediate circuit layer of silicon on one of the at least two structures, stacking the other of the at least two structures on the one structure, and filling a metal material in a hole of the one structure and a hole of the other structure to form a common source line.

According to an embodiment, a three-dimensional flash memory improving integration includes at least two channel layers formed to extend in one direction, at least two oxide-nitride-oxide (ONO) layers formed to extend in the one direction to surround the at least two channel layers, respectively, and a plurality of electrode layers stacked to be perpendicularly connected to each of the at least two ONO layers, and the at least two ONO layers are formed to be in contact with each other or to overlap at least a portion of the at least two ONO layers.

According to an embodiment, a method of manufacturing a three-dimensional flash memory improving integration includes preparing a mold structure in which a plurality of interlayer insulating layers and a plurality of electrode layers are alternately stacked on a substrate, forming at least two string holes penetrating the mold structure to expose the substrate and extending in one direction, applying oxide-nitride-oxide (ONO) in the at least two string holes to form at least two ONO layers each including a vertical hole therein and extending in the one direction, and forming at least two channel layers in the vertical hole of each of the at least two ONO layers and extending in the one direction, and the at least two ONO layers are formed to be in contact with each other or to overlap at least a portion of the at least two ONO layers.

According to an embodiment, a method of manufacturing a three-dimensional flash memory improving integration includes preparing a mold structure in which a plurality of sacrificial layers and a plurality of electrode layers are alternately stacked on a substrate, forming at least two string holes penetrating the mold structure to expose the substrate and extending in one direction, applying oxide-nitride-oxide (ONO) in the at least two string holes to form at least two ONO layers each including a vertical hole therein and extending in the one direction, and forming at least two channel layers in the vertical hole of each of the at least two ONO layers and extending in the one direction, removing the plurality of sacrificial layers, and filling spaces from which the plurality of sacrificial layers is removed with a plurality of electrode layers, and the forming of the at least two string holes to extend in the one direction includes extending the at least two string holes in the one direction such that the at least two string holes are in contact with each other or a portion of the at least two string holes overlap.

According to an embodiment, a three-dimensional flash memory improving integration includes at least two channel layers formed to extend in one direction, at least two charge storage layers formed to extend in the one direction to surround the at least two channel layers, respectively, and a plurality of electrode layers stacked to be perpendicularly connected to each of the at least two charge storage layers, and the at least two charge storage layers are formed to be in contact with each other or at least a portion of the at least two charge storage layers overlap.

According to an embodiment, a method of manufacturing a three-dimensional flash memory improving integration includes preparing a mold structure in which a plurality of interlayer insulating layers and a plurality of electrode layers are alternately stacked on a substrate, forming at least two string holes penetrating the mold structure to expose the substrate and extending in one direction, applying a charge storage material in the at least two string holes to form at least two charge storage layers each including a vertical hole therein and extending in the one direction, and forming at least two channel layers in the vertical hole of each of the at least two charge storage layers and extending in the one direction, and the forming of the at least two string holes to extend in the one direction includes extending the at least two string holes in the one direction such that the at least two string holes are in contact with each other or a portion of the at least two string holes overlap.

According to an embodiment, a method of manufacturing a three-dimensional flash memory improving integration includes preparing a mold structure in which a plurality of sacrificial layers and a plurality of electrode layers are alternately stacked on a substrate, forming at least two string holes penetrating the mold structure to expose the substrate and extending in one direction, applying a charge storage material in the at least two string holes to form at least two charge storage layers each including a vertical hole therein and extending in the one direction, forming at least two channel layers in the vertical hole of each of the at least two charge storage layers and extending in the one direction, removing the plurality of sacrificial layers, and filling spaces from which the plurality of sacrificial layers is removed with a plurality of electrode layers, and wherein the forming of the at least two string holes to extend in the one direction includes extending the at least two string holes in the one direction such that the at least two string holes are in contact with each other or a portion of the at least two string holes overlap.

ADVANTAGEOUS EFFECTS OF THE INVENTION

Embodiments may propose a technique in which at least one intermediate circuit layer disposed between a plurality of electrode layers in an intermediate region of a common source line to reduce a length of a wire compared to the conventional three-dimensional flash memory, thereby overcoming the problem of deterioration of the characteristics such as operation speed and power consumption and the difficulty of the wiring technique in the manufacturing process.

Embodiments may propose a three-dimensional flash memory and a method of manufacturing the same in which at least two ONO layers extending in one direction to surround each of the at least two channel layers are formed to be in contact with each other or to at least partially overlap each other.

Accordingly, embodiments may propose a technique which solves the disadvantages of the conventional three-dimensional flash memory and improves the horizontal integration of the channel layer and the ONO layer.

In addition, according to embodiments, an insulating layer between cells including a surrounding gate in a three-dimensional device may be etched to form an air gap and a vacuum gap, thereby suppressing an interference caused by an inter-cell insulating layer in a vertical cell.

Furthermore, in embodiments, a structure including different hole sizes in one vertical channel layer is formed to stably apply a channel material such as poly-silicon through one layer forming process.

Furthermore, in embodiments, a structure including different hole sizes for each vertical cell group is formed to form a stable vertical channel layer in a high-level three-dimensional flash memory architecture having 100 or more stages.

DESCRIPTION OF THE DRAWINGS

FIGS. 2A to 2H illustrate a process of a three-dimensional device according to an embodiment.

FIGS. 3A to 3H illustrate a process of a three-dimensional device including a stand according to an embodiment.

FIG. 10 is a cross-sectional view illustrating a structure of a conventional three-dimensional flash memory.

FIGS. 14A to 14D are cross-sectional views illustrating a method of manufacturing a three-dimensional flash memory according to an embodiment.

FIGS. 15A to 15D are top views illustrating a method of manufacturing a three-dimensional flash memory according to an embodiment.

FIGS. 17A to 17F are cross-sectional views illustrating a method of manufacturing a three-dimensional flash memory according to another embodiment.

BEST MODE FOR CARRYING OUT THE INVENTION

Figure 1A:
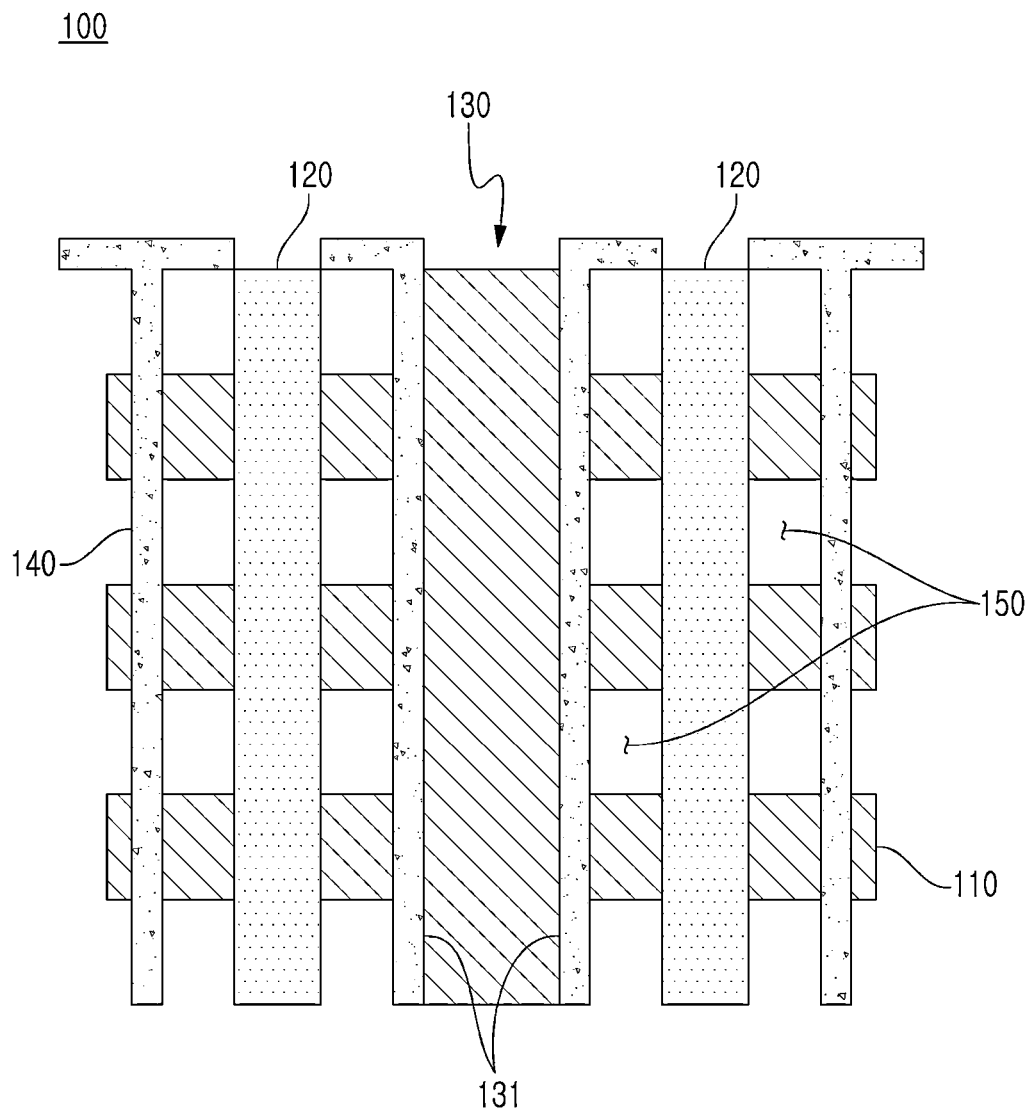
FIGS. 1A and 1B illustrate cross-sectional views of a three-dimensional device including an air gap according to one embodiment.

Hereinafter, embodiments of the present invention will be described in detail with reference to the accompanying drawings. However, the present invention is not limited or restricted by embodiments. Also, like reference numerals in the drawings denote like elements.

It is an object of embodiments to provide a technique for forming an air gap or a vacuum gap, which is formed by etching an insulating layer between cells to suppress interference caused by the inter-cell insulating layer in a vertical cell having a surrounding gate used in a three-dimensional device.

In addition, when the three-dimensional device includes the air gap or vacuum gap, a short circuit may be caused between horizontal electrodes, and thus embodiments include a layout where supports (hereinafter, referred to as a 'stand') is formed at appropriate intervals to prevent the short circuit between the cells.

In addition, although the three-dimensional device according to an embodiment is explained and described as being a three-dimensional flash memory device, but it is not limited to a flash memory, and any device in the form of a three-dimensional structure may be applied.

Embodiments relates to a stable vertical channel structure which guarantees cell characteristics in a three-dimensional NAND flash and it is an object of embodiments to form different sizes (or areas) of holes filled with vertical channels depending on vertical heights.

In addition, embodiments are characterized in that sizes of holes are different for each group of the horizontal electrodes and sizes of holes are kept constant in one group, and therefore channel materials, such as poly-silicon, may be stably deposited in a deposition process at once and may form stable vertical channel structures in more than 100 high stage three-dimensional flash memory architectures.

Figure 1B:
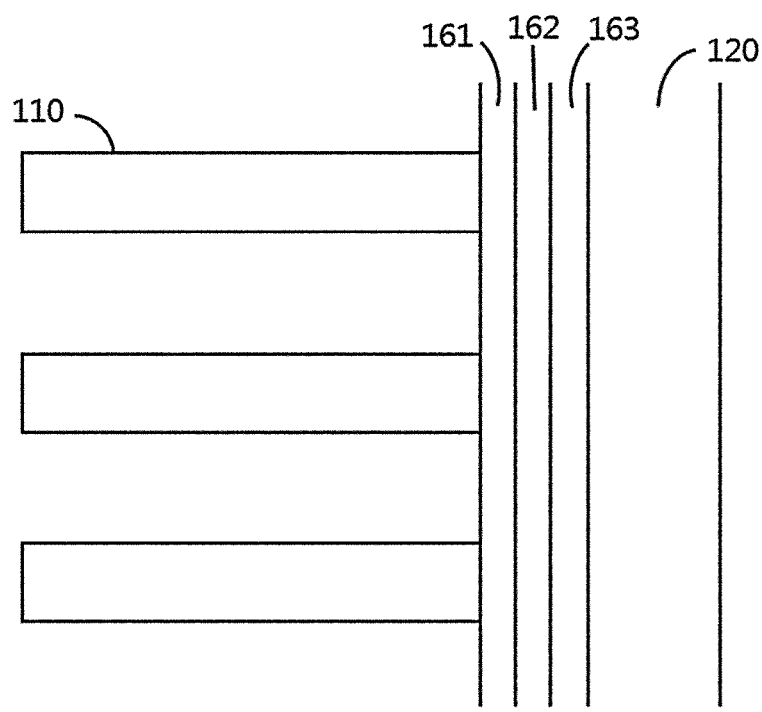

FIGS. 1A and 1B illustrate cross-sectional views of a three-dimensional device including an air gap according to an embodiment.

In detail, FIG. 1A illustrates the cross-sectional view of the three-dimensional device including the air gap according to an embodiment, and FIG. 1B illustrates a detailed cross-sectional view of the three-dimensional device according to an embodiment.

A three-dimensional device 100 according to an embodiment includes a plurality of air gaps 150 (or vacuum gaps) formed between a plurality of horizontal electrode layers 110.

To this end, the three-dimensional device 100 according to an embodiment includes the horizontal electrode layer 110 and a vertical channel layer 120.

The horizontal electrode layer 110 includes the plurality of air gaps 150. In addition, the horizontal electrode layer 110 may be formed by alternately stacked on a device formation substrate (not shown). Although not shown in FIG. 1A, a plurality of interlayer insulating layers alternately disposed between the plurality of horizontal electrode layers 110 may have an etched form.

For example, the horizontal electrode layers 110 may be formed of a conductive material and may be polycrystalline silicon, tungsten (W), titanium (Ti), tantalum (Ta), or an alloy thereof. In this case, a plurality of passivation layers among the plurality of interlayer insulating layers and the plurality of passivation layers formed to be alternately stacked on the device formation substrate may be etched and a conductive material may be applied to the etched plurality of passivation layers to form the horizontal electrode layers 110.

Here, the interlayer insulating layers may be used as long as a material has an electrically non-conductive property, and for example, silicon nitride (SiN), silicon oxynitride (SiON), silicon oxide (SiO2), or metallic oxide may be used. In addition, the interlayer insulating layers may be used for planarization or insulation and may include a gas material such as DSG (SiOF), TFOS, BPSG, or the like, formed by chemical vapor deposition (CVD), and a coating material (SOD) represented by SOG (spin-on glass/Siloxane). These various materials may have various material characteristics such as mechanical strength, dielectric constant, dielectric loss, chemical stability, thermal stability, conductivity, and the like, and these characteristics may determine durability against internal stress or external stress.

In addition, the passivation layers may be formed of silicon nitride (Si3N4), or may be formed of a dielectric material such as magnesium oxide (MgO).

Referring to FIG. 1A, the horizontal electrode layers 110 may be alternately stacked on the device formation substrate, and may be separated from one another on the plurality of interlayer insulating layers.

The horizontal electrode layers 110 of the three-dimensional device 100 according to an embodiment may be in contact with a gate used as a word line and may be in a shape of a surrounding gate of the three-dimensional device 100.

In addition, the three-dimensional device 100 according to an embodiment may include vertical channel layers 120, each which is connected to the plurality of horizontal electrode layers 110 and perpendicular to the plurality of horizontal electrode layers 110. For example, each vertical channel layer 120 is formed perpendicular to the device formation substrate (not shown). Here, the vertical channel layer 120 may be formed of single crystalline silicon, and may be formed, for example, by a selective epitaxial growth process or a phase change epitaxial process using the device formation substrate as a seed.

Referring to FIG. 1A, the vertical channel layers 120 may be formed in a direction perpendicular to the device formation substrate, and may be formed in each of a plurality of through holes penetrating outsides of the plurality of horizontal electrode layers 110 to be connected to the plurality of horizontal electrode layers 110.

For example, the vertical channel layers 120 may be formed in the plurality of through holes penetrating opposite outsides of the plurality of interlayer insulating layers and the plurality of passivation layers, which are alternately stacked on the device formation substrate, and the vertical channel layers 120 each which is formed at the opposite outsides may be connected to the plurality of horizontal electrode layers 110. In this case, the through holes may be formed by line etching.

The three-dimensional device 100 according to an embodiment may further include a string line 130. The string line 130 may be formed in a direction perpendicular to the device formation substrate, may be formed in a contact hole penetrating a center of the horizontal electrode layers 110, and may be deposited with a conductive material between insulating walls 131 formed on opposite sides of the contact hole. In this case, the contact hole may be formed by line etching. According to an embodiment, FIG. 1A is the cross-sectional view of the three-dimensional device 100 and illustrates the insulating walls 131 in a form disposed at the opposite sides of the contact hole, but when a three-dimensional structure of the three-dimensional device 100 is formed, the contact hole may be in a form of surrounding the contact hole.

For example, the string line 130 may be formed in the contact hole penetrating a center in the plurality of interlayer insulating layers and the plurality of passivation layers in which the vertical channel layers 120 are formed, and may include the insulating walls 131 vertically formed on the opposite sides of the contact hole. In this case, the string line 130 may be formed by applying a conductive material including polycrystalline silicon, tungsten (W), titanium (Ti), tantalum (Ta), or an alloy thereof, between the insulating walls 131.

The three-dimensional device 100 according to an embodiment may include a plurality of air gaps 150 formed between the plurality of horizontal electrode layers 110 and vertical channel layers 120, and the string line 130 based on the plurality of interlayer insulating layers and the horizontal electrode layers 110 which are separated from each other.

In addition, the three-dimensional device 100 according to another embodiment may form an arbitrary hole which is formed by line etching through the plurality of interlayer insulating layers and the plurality of passivation layers formed by being alternately stacked on the device formation substrate and may include a stand 140 formed by applying an insulating material in the arbitrary hole.

For example, a short circuit between the horizontal electrode layers 110 may be caused by the plurality of air gaps 150 formed in the three-dimensional device 100. Accordingly, the three-dimensional device 100 according to the embodiment may include the plurality of stands 140 serving as a support, thereby preventing the short circuit between cells.

Referring to FIG. 1B, the three-dimensional device 100 according to an embodiment includes the plurality of horizontal electrode layers 110, and the plurality of vertical channel layers 120 connected to and perpendicular to the plurality of horizontal electrode layers 110. That is, the vertical channel layers 120 are formed perpendicular to the device formation substrate (not shown). In this case, a tunnel oxide layer 163, a silicon nitride layer 162, and an interlayer oxide layer 161 may be formed around the plurality of vertical channel layers 120, and the plurality of horizontal electrode layers 110 may be vertically stacked with respect to the vertical channel layers 120.

The three-dimensional device 100 according to an embodiment illustrated in FIG. 1B may use an ONO (Oxide/Nitride/Oxide) structure such as the tunnel oxide layer 163, the silicon nitride layer 162, and the interlayer oxide layer 161 for a charge storage. Meanwhile, the three-dimensional device 100 according to an embodiment may include a floating gate instead of the ONO structure, and the plurality of horizontal electrode layers 110 may be connected to the plurality of vertical channel layers 120 by a charge trap layer such as an ONO structure or a floating gate.

In this case, the floating gate may be formed of a single crystalline group 3-5 semiconductor or a single crystalline silicon semiconductor, and the tunnel oxide layer 163 and the interlayer oxide layer 161 may be disposed around the floating gate.

FIGS. 2A to 2H illustrate a process of a three-dimensional device according to an embodiment.

FIGS. 2A to 2H illustrate a process of forming a three-dimensional device 200 in time order, but the order of the process may vary depending on embodiments.

Figure 2A:
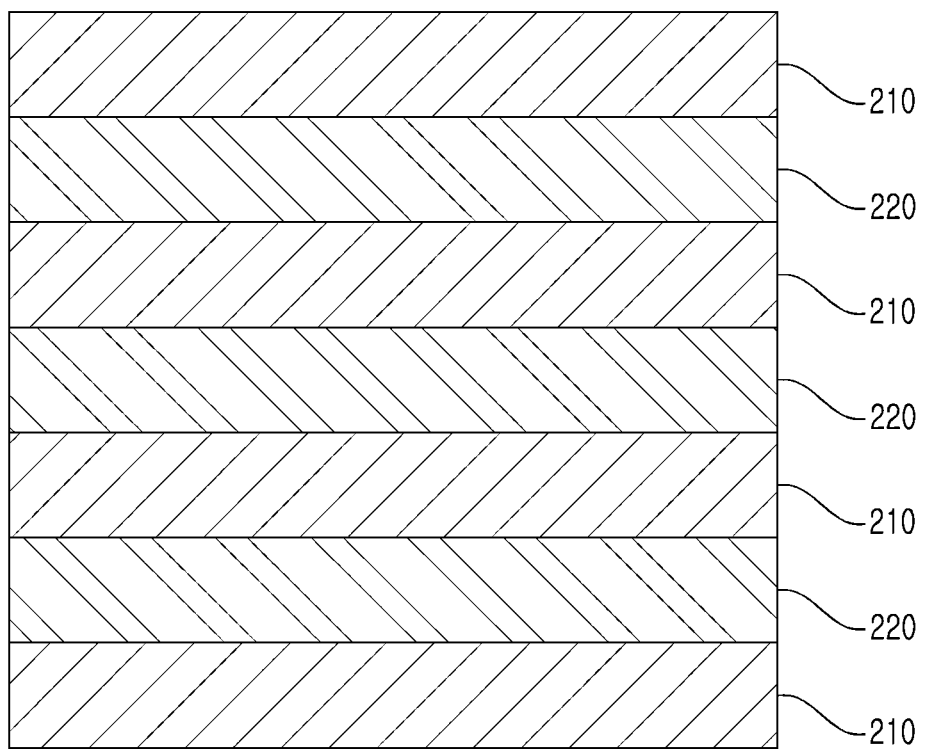

Referring to FIG. 2A, a plurality of interlayer insulating layers 210 and a plurality of passivation layers 220 are alternately stacked on a device formation substrate (not shown).

In this case, the device formation substrate may be a silicon substrate, but is not limited to a semiconductor material such as silicon. In addition, the interlayer insulating layers 210 may be used as long as a material has an electrically non-conductive property, and for example, silicon nitride (SiN), silicon oxynitride (SiON), silicon oxide (SiO2), or metallic oxide may be used. In addition, the passivation layers 220 may be formed of silicon nitride (Si3N4), or may be formed of a dielectric material such as magnesium oxide (MgO).

Subsequently, referring to FIG. 2B, a plurality of through holes 230 penetrating outsides of the plurality of interlayer insulating layers 210 and the plurality of passivation layers 220 formed in FIG. 2A are formed.

For example, the through holes 230 may be formed in a direction perpendicular to the device formation substrate, may be formed as a hole penetrating opposite outsides of the plurality of interlayer insulating layers 210 and the plurality of passivation layers 220, and may be formed by etching (line etching). In this case, thickness, size, position, and number of the through holes 230 may vary depending on embodiments to which the three-dimensional device 200 according to an embodiment is applied, but not to be limited.

Figure 2B:
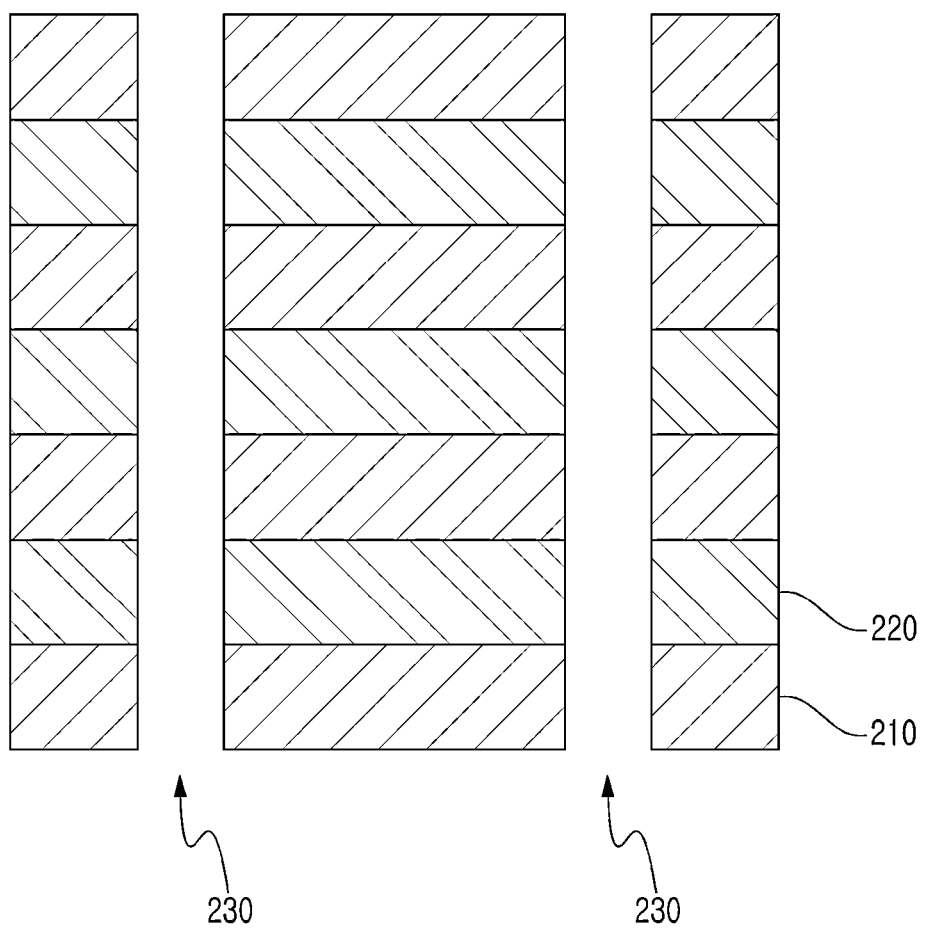
Figure 2C:
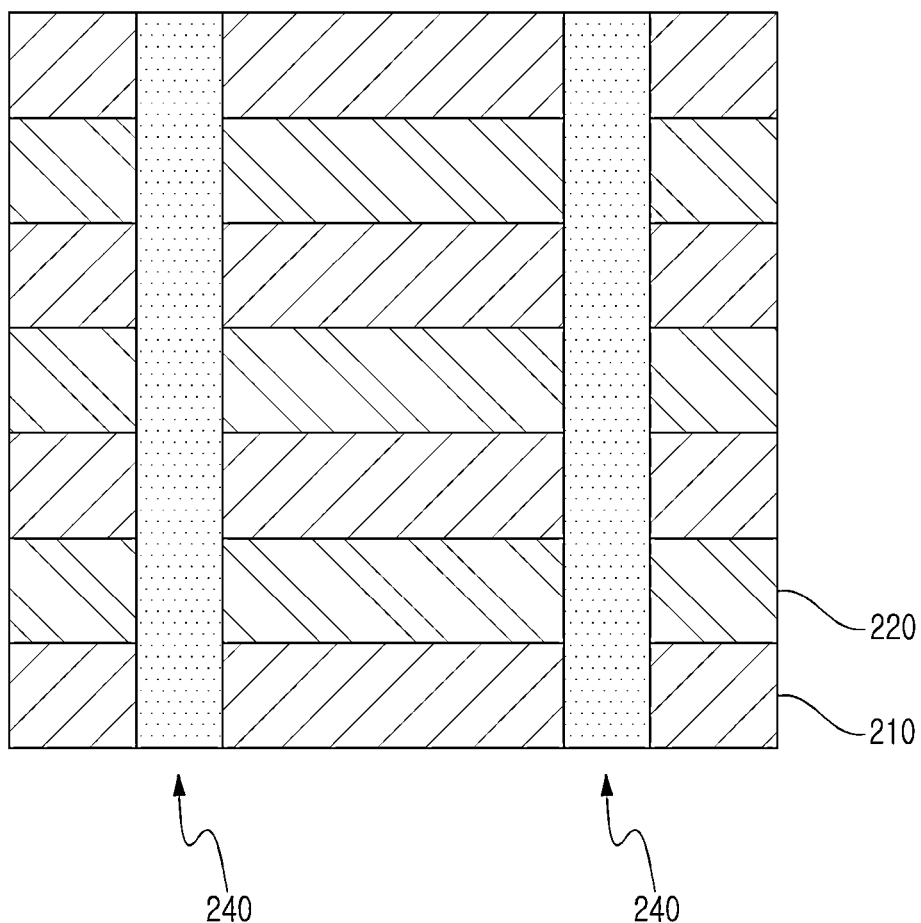

Referring to FIG. 2C, vertical channel layers 240 of vertical structures are formed in the plurality of through holes 230 formed in FIG. 2B. In this case, the vertical channel layers 240 may be formed of single crystalline silicon, but a type is not limited.

Subsequently, the three-dimensional device 200 according to an embodiment of FIG. 2D includes a contact hole 250 passing through a center of the plurality of interlayer insulating layers 210 and the plurality of passivation layers 220 in which the vertical channel layers 240 are formed.

For example, the contact hole 250 may be formed by line etching in the same manner as the through holes 230, but thickness, size, and position of the contact hole 250 may vary depending on embodiments to which the three-dimensional device 200 according to an embodiment is applied, but not to be limited.

Afterwards, referring to FIG. 2E, insulating walls 260 are provided on opposite sides of the contact hole 250. In this case, the insulating walls 260 may be in a form surrounding the contact hole 250 and may be formed of a material used for planarization or insulation. For example, the insulating walls 260 may be formed of silicon nitride (SiN), silicon oxynitride (SiON), silicon oxide (SiO2), or metallic oxide.

Thereafter, the plurality of passivation layers 220 are etched in FIG. 2F.

For example, the plurality of passivation layers 220 of the three-dimensional device 200 may be partially etched using a photolithography process and a dry etching process. However, a method of partially etching the passivation layers 220 is not limited thereto, and a method used in the existing technology is used.

Figure 2G:
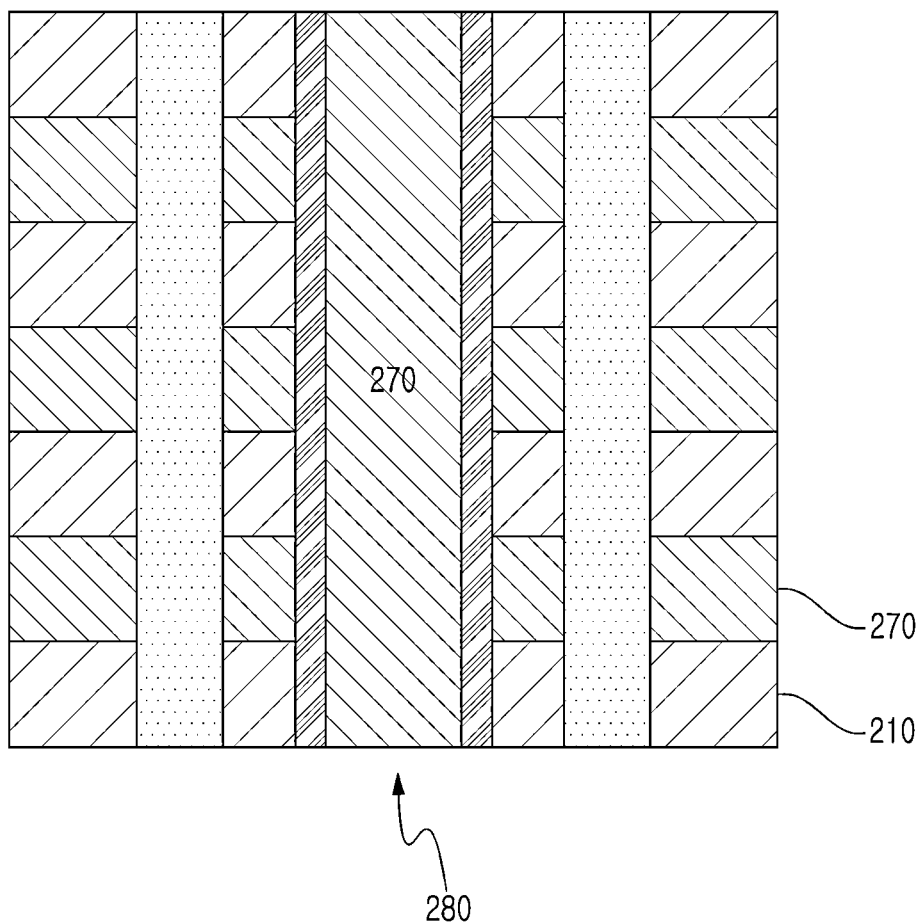

Referring to FIG. 2G, a conductive material is applied on a cell in which the plurality of passivation layers 220 are etched and a string line 280 formed in the contact hole 250.

For example, the cell in which the plurality of passivation layers 220 are etched may apply a conductive material to form a plurality of horizontal electrode layers 270. In addition, in FIG. 2G, the conductive material may be applied between the contact hole 250 and the insulating walls 260 formed on the opposite sides of the contact hole 250 to form the string line 280. In this case, the conductive material may include polycrystalline silicon, tungsten (W), titanium (Ti), tantalum (Ta), or an alloy thereof.

Figure 2H:
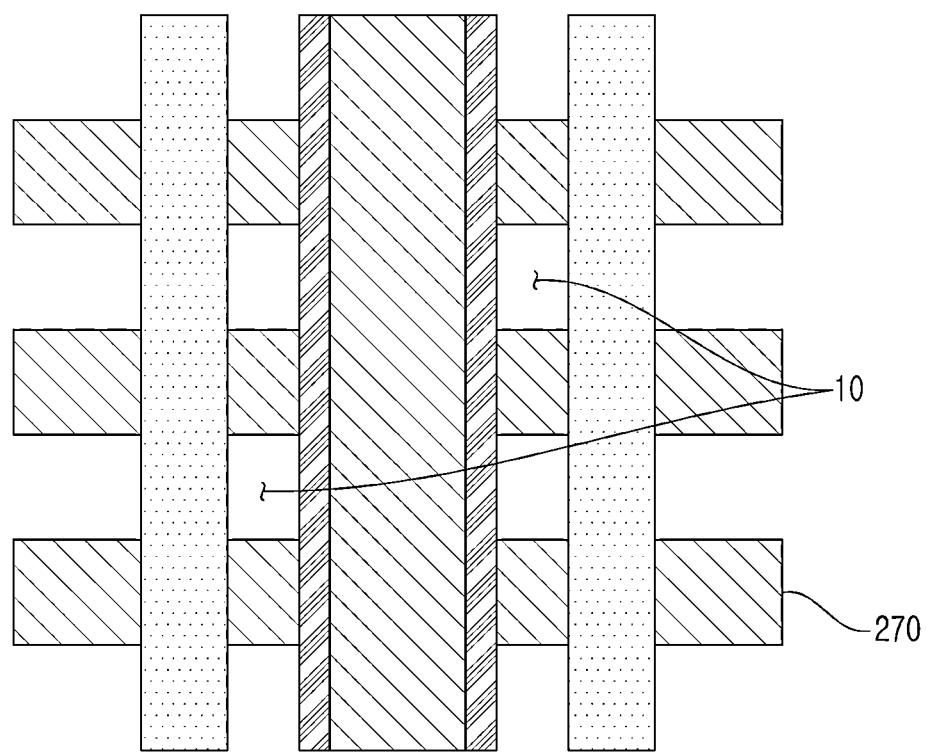

Thereafter, referring to FIG. 2H, the plurality of interlayer insulating layers 210 are etched. In this case, the plurality of interlayer insulating layers 210 may be partially etched through a photolithography process and a dry etching process. However, a process method of partially etching the interlayer insulating layers 210 is not limited thereto, and the method used in the existing technology is used.

Accordingly, it is characterized in that the three-dimensional device 200 according to an embodiment includes the plurality of horizontal electrode layers 270 and the plurality of vertical channel layers 240 perpendicular to the plurality of horizontal electrode layers 270 and includes a plurality of air gaps 10 between the plurality of horizontal electrode layers 270.

FIGS. 3A to 3H illustrate a process of a three-dimensional device including a stand according to an embodiment.

FIGS. 3A to 3H illustrate a process of forming a three-dimensional device 300 including a stand 370 in time order, but the order of the process may be changed.

Figure 3A:
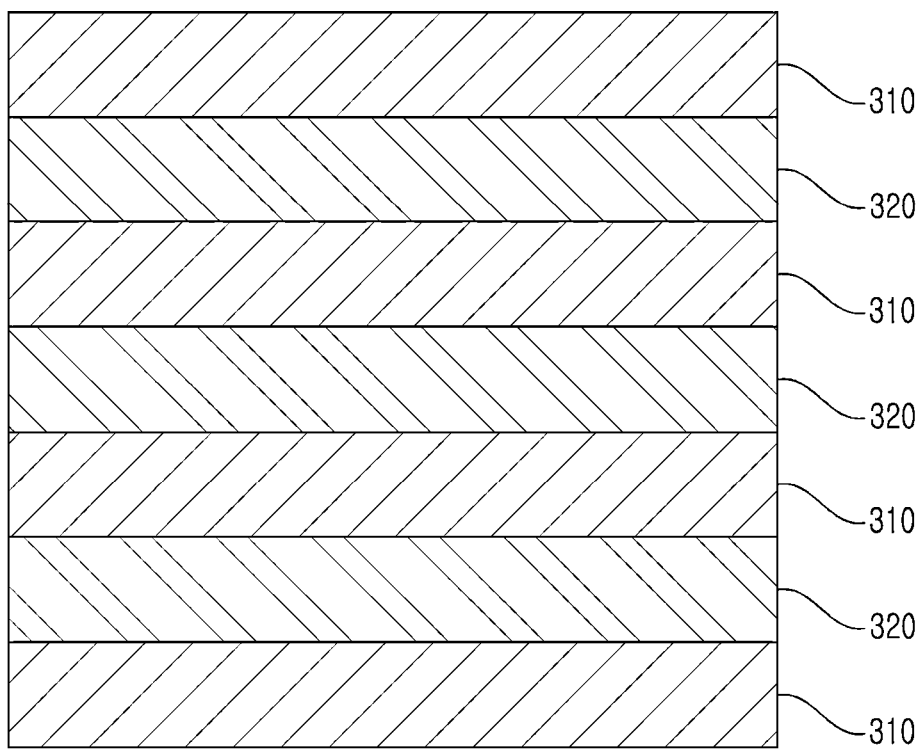

Referring to FIG. 3A, a plurality of interlayer insulating layers 310 and a plurality of passivation layers 320 are alternately stacked on a device formation substrate (not shown).

In this case, the device formation substrate may be a silicon substrate, but is not limited to a semiconductor material such as silicon. In addition, the interlayer insulating layers 310 may be used as long as a material has an electrically non-conductive property, and for example, silicon nitride (SiN), silicon oxynitride (SiON), silicon oxide (SiO2), or metallic oxide may be used. In addition, the passivation layers 320 may be formed of silicon nitride (Si3N4), or may be formed of a dielectric material such as magnesium oxide (MgO).

Subsequently, referring to FIG. 3B, a plurality of through holes 330 penetrating outsides of the plurality of interlayer insulating layers 310 and the plurality of passivation layers 320 formed in FIG. 3A are formed.

For example, the through holes 330 may be formed in a direction perpendicular to the device formation substrate, may be formed as a hole penetrating opposite outsides of the plurality of interlayer insulating layers 310 and the plurality of passivation layers 320, and may be formed by etching (line etching). In this case, thickness, size, position, and number of the through holes 330 may vary depending on embodiments to which the three-dimensional device 300 according to an embodiment is applied, but not to be limited.

Figure 3B:
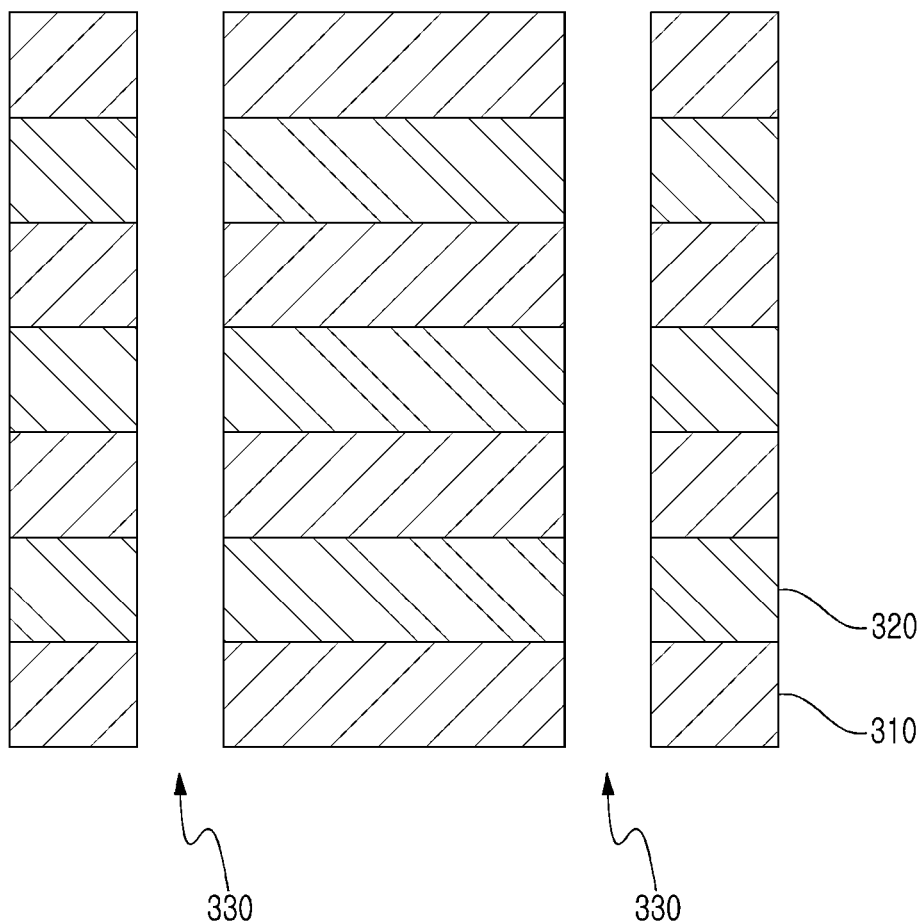
Figure 3C:
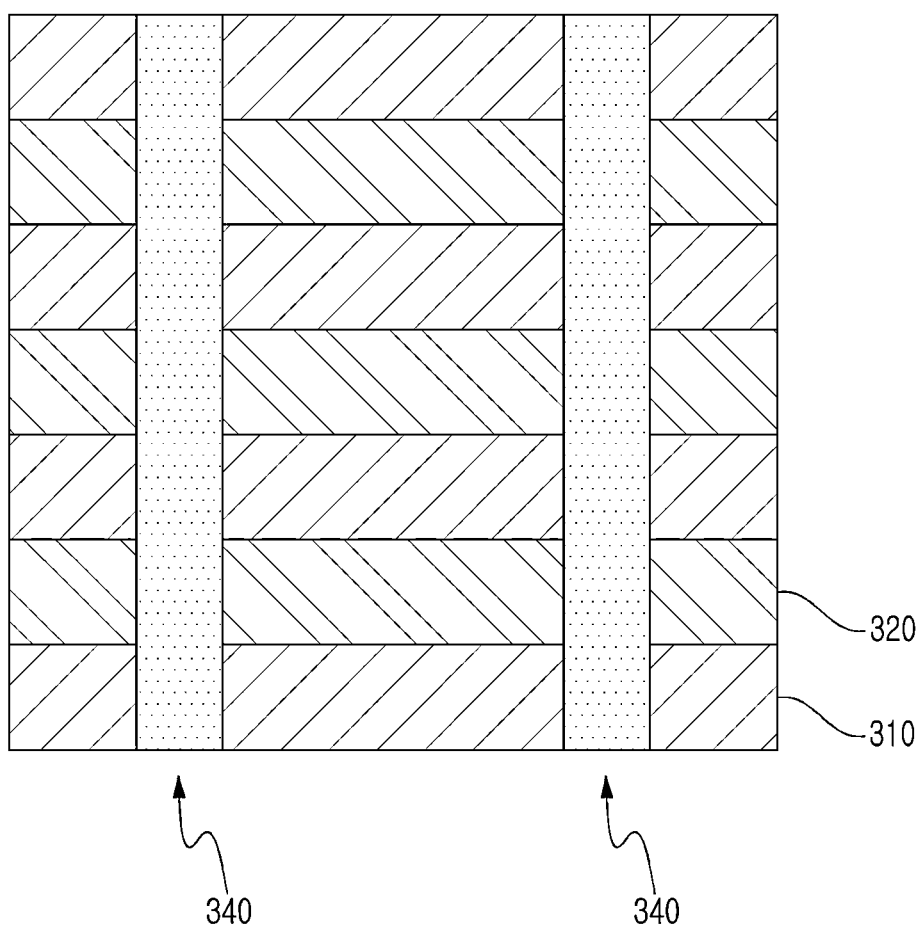

Referring to FIG. 3C, vertical channel layers 340 of vertical structures are formed in the plurality of through holes 330 formed in FIG. 3B. In this case, the vertical channel layers 340 may be formed of single crystalline silicon, but a type is not limited.

Figure 3D:
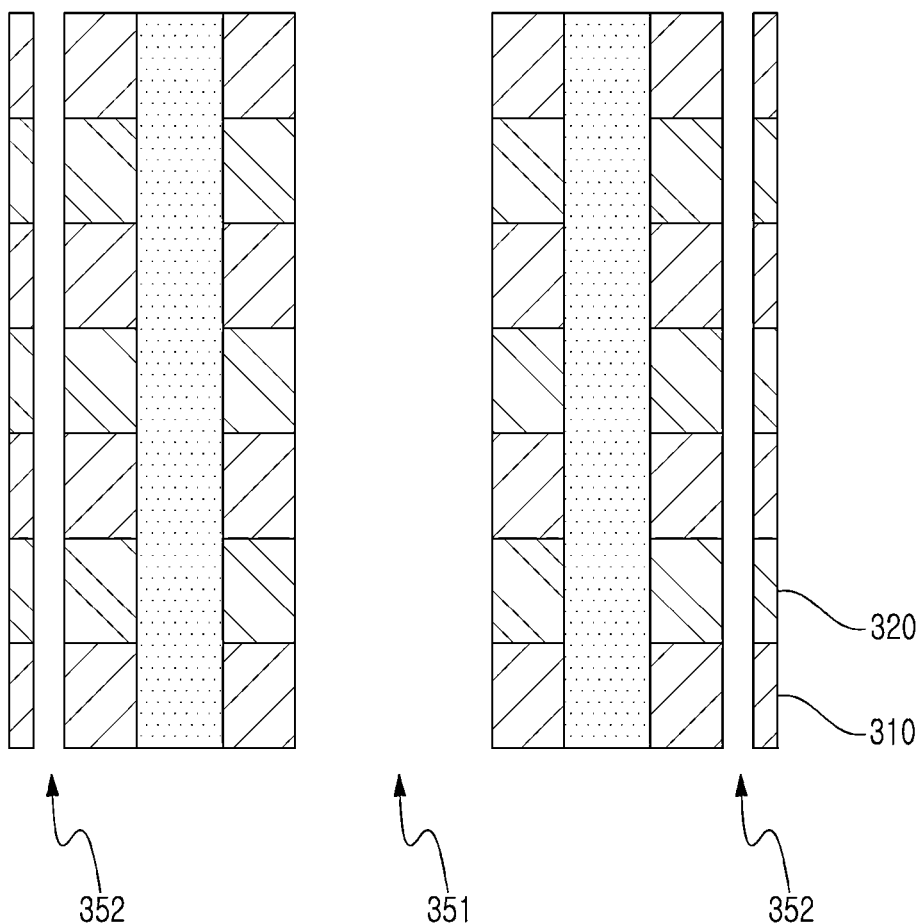

Subsequently, in FIG. 3D, the three-dimensional device 300 according to an embodiment may include a contact hole 351 passing through a center of the plurality of interlayer insulating layers 310 and the plurality of passivation layers 320 in which the vertical channel layers 340 are formed and arbitrary holes 352 penetrating edges.

For example, the contact hole 351 may be formed to be penetrated between the plurality of vertical channel layers 340 by line etching, same as the through holes 330, and the arbitrary hole 352 may be formed passing through the edges of the plurality of vertical channel layers 340 by line etching. In this case, the arbitrary hole 352 may be formed at opposite edges of the plurality of vertical channel layers 340, and is a hole in which the stand 370 is formed to have relatively smaller thickness than the contact hole 351. Meanwhile, thicknesses, sizes, and positions of the contact hole 351 and the arbitrary holes 352 may vary depending on embodiments to which the three-dimensional device 300 according to an embodiment is applied, but not to be limited thereto.

Figure 3E:
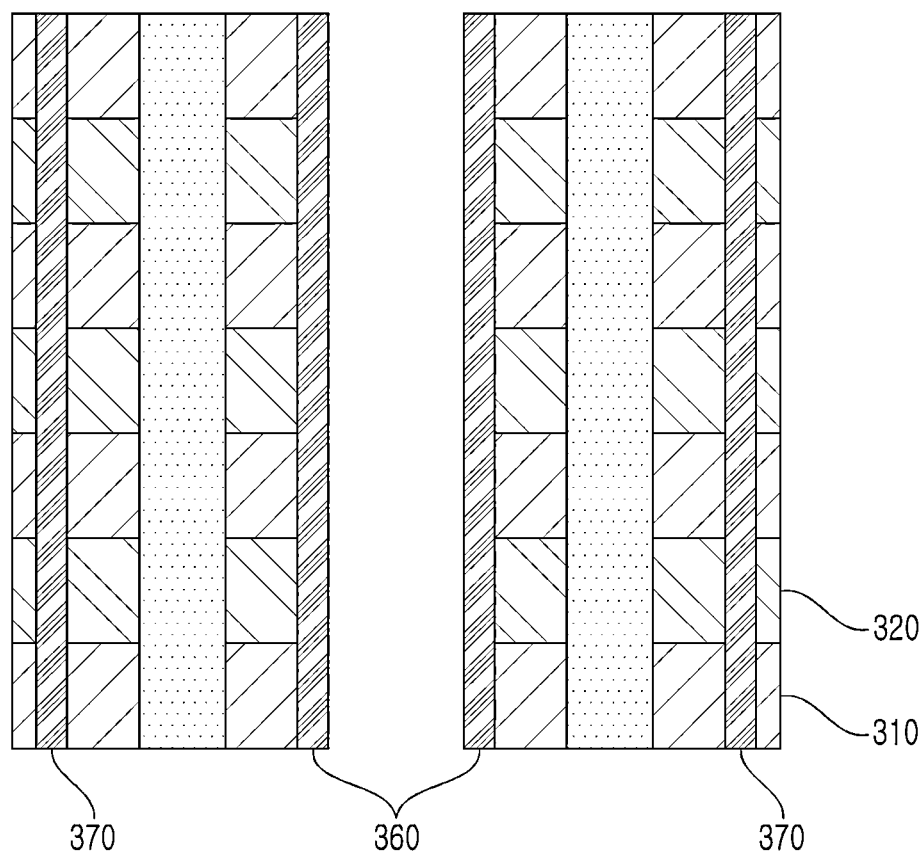

Thereafter, referring to FIG. 3E, insulating walls 360 are provided on the opposite sides of the contact hole 351 and the stands 370 formed in the arbitrary holes 352 are provided. Here, the insulating walls 360 may be in a form surrounding the contact hole 351. For example, the insulating walls 360 and the stands 370 may be formed of a material used for planarization or insulation, and may include silicon nitride (SiN), silicon oxynitride (SiON), silicon oxide (SiO2), or metallic oxide. However, thicknesses and types of the insulating walls 360 and the stands 370 are not limited thereto.

Thereafter, the plurality of passivation layers 320 are etched in FIG. 3F.

For example, the plurality of passivation layers 320 of the three-dimensional device 300 may be partially etched using a photolithography process and a dry etching process. However, a method of partially etching the passivation layer 320 is not limited thereto, and the method used in the existing technology is used.

Figure 3G:
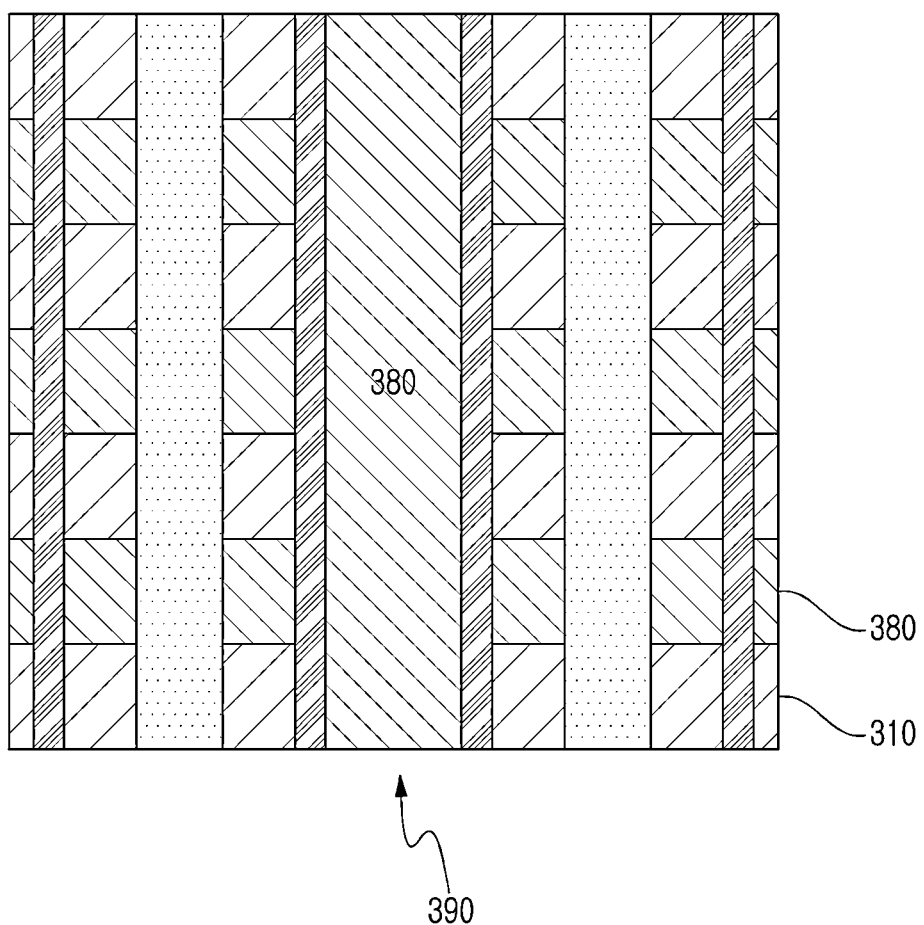

Referring to FIG. 3G, a conductive material is applied on a cell in which the plurality of passivation layers 320 are etched and a string line 390 formed in the contact hole 351.

For example, the cell in which the plurality of passivation layers 320 is etched may apply the conductive material to form a plurality of horizontal electrode layers 380. In addition, in FIG. 3G, the conductive material may be applied between the contact hole 351 and the insulating walls 360 formed on opposite sides of the contact hole 351 to form the string line 390. In this case, the conductive material may include polycrystalline silicon, tungsten (W), titanium (Ti), tantalum (Ta), or an alloy thereof.

Figure 3H:
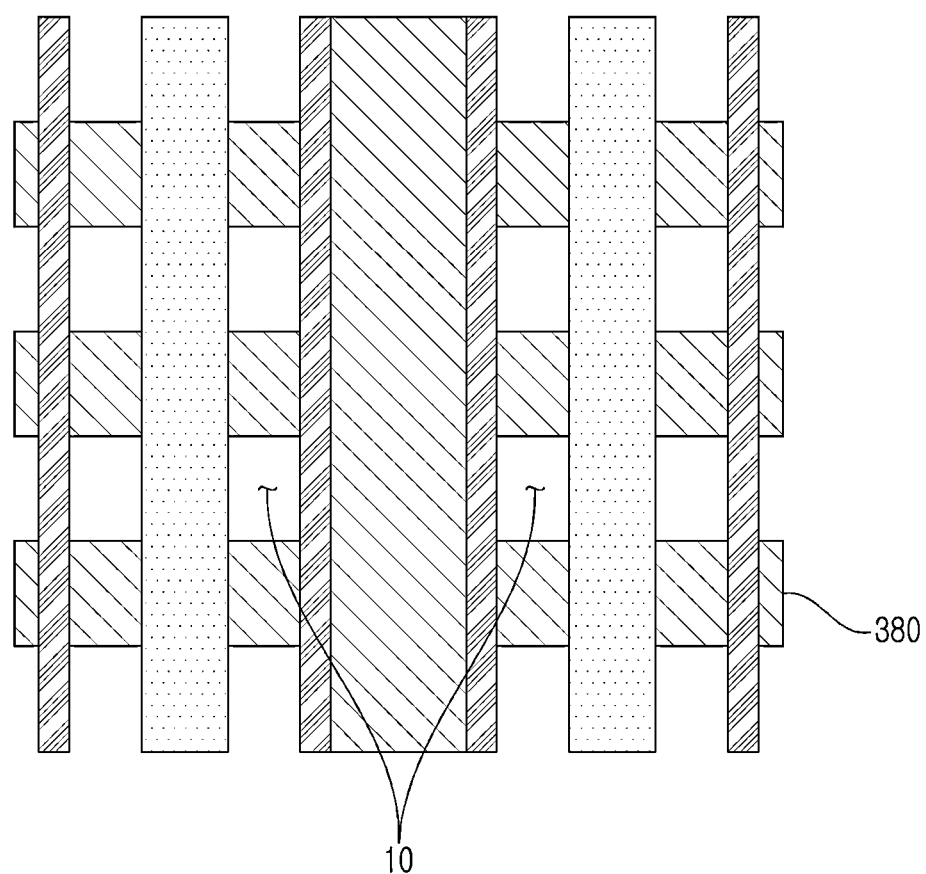

Then, referring to FIG. 3H, the plurality of interlayer insulating layers 310 is etched. In this case, the plurality of interlayer insulating layers 310 may be partially etched through a photolithography process and a dry etching process. However, a method of partially etching the interlayer insulating layer 310 is not limited thereto, and the method used in the existing technology is used.

Accordingly, it is characterized in that the three-dimensional device 300 according to an embodiment includes the stands 370 to prevent short circuit between the plurality of horizontal electrode layers 380 and the plurality of vertical channel layers 340 perpendicular to the plurality of horizontal electrode layers 380 and includes a plurality of air gaps 10 configured between the plurality of horizontal electrode layers 380.

Accordingly, the three-dimensional devices 200 and 300 according to an embodiment may include the plurality of air gaps 10, thereby suppressing interference due to an inter-cell insulating layer in the vertical cell. In addition, in the three-dimensional device 300 according to an embodiment illustrated in FIGS. 3A to 3H, the plurality of stands 370 may be formed at appropriate intervals, and thus the short circuit which is capable of being caused to inter-cell electrode layers in the horizontal cell may be prevented.

Figure 4:
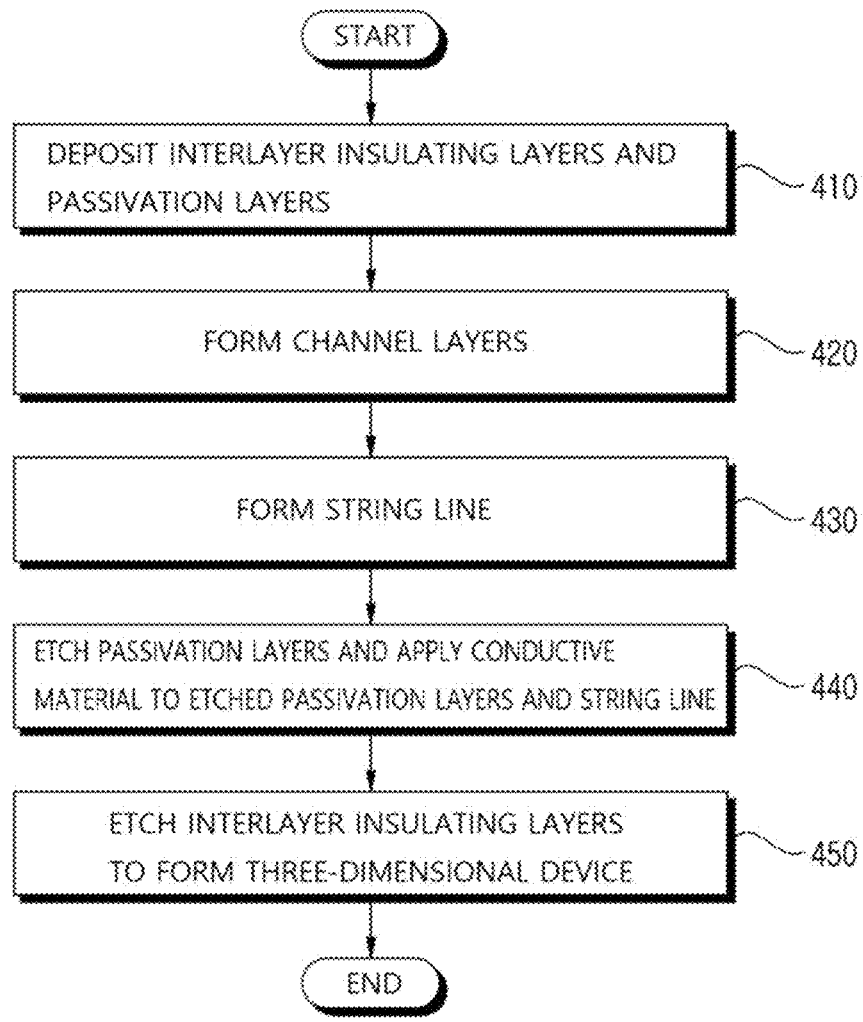
FIG. 4 illustrates a flowchart of a method of manufacturing a three-dimensional device including an air gap, according to an embodiment.

FIG. 4 illustrates a flowchart of a method of manufacturing a three-dimensional device including an air gap, according to an embodiment.

Referring to FIG. 4, in the method of manufacturing the three-dimensional device according to an embodiment, in operation 410, a plurality of interlayer insulating layers and a plurality of passivation layers are alternately stacked on a device formation substrate.

In this case, the device formation substrate may be a silicon substrate, but is not limited to a semiconductor material such as silicon. In addition, the interlayer insulating layers may be used as long as a material has an electrically conductive property, and for example, silicon nitride (SiN), silicon oxynitride (SiON), silicon oxide (SiO2), or metallic oxide may be used. In addition, the passivation layers may be formed of silicon nitride (Si3N4), or may be formed of a dielectric material such as magnesium oxide (MgO).

In operation 420, a plurality of through holes penetrating outsides of the plurality of interlayer insulating layers and the plurality of passivation layers are formed and vertical channel layers are formed in the through holes.

For example, the through holes may be formed in a direction perpendicular to the device formation substrate, may be formed as a hole penetrating opposite outsides of the plurality of interlayer insulating layers and the plurality of passivation layers, and may be formed by etching (line etching). In this case, thickness, size, position, and number of the through holes may vary depending on embodiments to which the three-dimensional device according to an embodiment is applied, but not to be limited thereto.

Here, operation 420 may be a step of forming vertical channel layers of vertical structures in the plurality of through holes formed. At this case, the vertical channel layers may be formed of single crystalline silicon, but a type is not limited thereto.

Thereafter, in operation 430, a contact hole passing through a center of the plurality of interlayer insulating layers and the plurality of passivation layers in which the vertical channel layers are formed and a string line including insulating walls formed on opposite sides of the contact hole are formed. For example, the string line in operation 430 may be formed in the contact hole to have a form including the insulating walls, and may be in a form before a conductive material is applied.

In operation 430, same as operation 420, the contact hole may be formed in the center of the plurality of interlayer insulating layers and the plurality of passivation layers using line etching.

According to an embodiment, operation 430 may be a step of forming the contact hole penetrating the plurality of interlayer insulating layers and the plurality of vertical channel layers which are vertically stacked and formed on the device formation substrate and arbitrary holes penetrating edges of the plurality of the vertical channel layers formed, using line etching. Then, operation 430 may be a step of vertically forming the insulating walls on the opposite sides of the contact hole to form the string line and applying an insulating material in the arbitrary holes to form stands.

In this case, the insulating walls and the stands may be formed of a material used for planarization or insulation, and may be formed of silicon nitride (SiN), silicon oxynitride (SiON), silicon oxide (SiO2), or metallic oxide. However, thicknesses and types of the insulating walls and the stands are not limited.

Thereafter, in operation 440, the plurality of passivation layers are etched, and a conductive material is applied on the etched plurality of passivation layers and string line.

For example, operation 440 may be a step of partially etching the passivation layers using a photolithography process and a dry etching process. Thereafter, operation 440 may be a step of applying the conductive material on the plurality of etched passivation layers and the string line. In this case, the conductive material may be applied on the etched plurality of passivation layers to form horizontal electrode layers, and the horizontal electrode layers may be separated from one another on the plurality of interlayer insulating layers.

However, an order of applying the conductive material on each of the etched plurality of passivation layers and the string line, respectively, is not limited, and different conductive materials may be used. In this case, the conductive material may include polycrystalline silicon, tungsten (W), titanium (Ti), tantalum (Ta), or an alloy thereof.

In operation 450, a plurality of interlayer insulating layers are etched to form the three-dimensional device including a plurality of air gaps.

For example, operation 450 may be a step of partially etching the plurality of interlayer insulating layers using a photolithography process and a dry etching process. Thereafter, operation 450 may be a step of forming the three-dimensional device including the plurality of horizontal electrode layers and a plurality of vertical channel layers perpendicular to the plurality of horizontal electrode layers. Here, it is characterized in that the three-dimensional device includes a plurality of air gaps disposed between the plurality of horizontal electrode layers.

Figure 5:
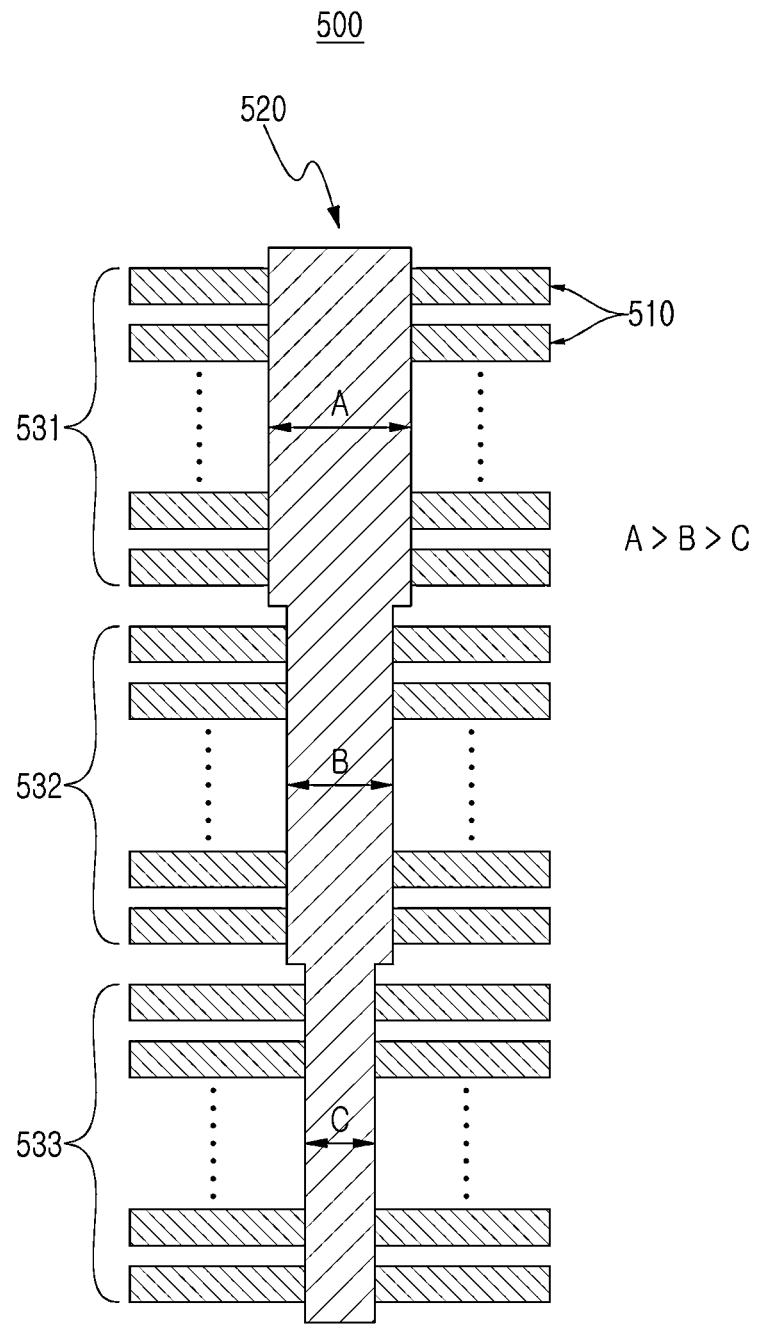
FIG. 5 illustrates a cross-sectional view of a three-dimensional device according to an embodiment.

FIG. 5 illustrates a cross-sectional view of a three-dimensional device according to an embodiment.

A three-dimensional device 500 of a three-dimensional flash memory according to an embodiment includes horizontal electrode layers 510 and a vertical channel layer 520 having a vertical channel structure having different hole sizes.

The horizontal electrode layers 510 are stacked to form vertical cell groups. The horizontal electrode layers 510 may be formed by being stacked on a device formation substrate (not shown). Although not illustrated in FIG. 5, a plurality of interlayer insulating layers alternately disposed between the plurality of horizontal electrode layers 510 may be etched.

The horizontal electrode layers 510 may be grouped into vertical cell groups 531, 532, and 533 including the plurality of horizontal electrode layers 510. For example, in a high-level three-dimensional flash memory architecture having 100 or more stages, the plurality of horizontal electrode layers 510 may be grouped into a predetermined number. However, number, size, shape and type of the horizontal electrode layers 510 grouped into the vertical cell groups 531, 532, and 533, and a number of vertical cell groups are not limited.

In this case, the horizontal electrode layers 510 may be formed of a conductive material, and may be polycrystalline silicon, tungsten (W), titanium (Ti), tantalum (Ta), or an alloy thereof. The plurality of passivation layers among the plurality of interlayer insulating layers and a plurality of passivation layers formed by being alternately stacked on the device formation substrate may be etched and the conductive material may be applied on a cell in which the passivation layers are etched to form the horizontal electrode layers 510.

The interlayer insulating layer may be used as long as a material has an electrically non-conductive property, and for example, silicon nitride (SiN), silicon oxynitride (SiON), silicon oxide (SiO2), or metallic oxide may be used. In addition, the interlayer insulating layer may be used for planarization or insulation and may include a gas material such as DSG (SiOF), TFOS, BPSG, or the like, formed by chemical vapor deposition (CVD), and a coating material (SOD) represented by SOG (spin-on glass/Shiroki acid). These various materials may have various material characteristics such as mechanical strength, dielectric constant, dielectric loss, chemical stability, thermal stability, conductivity, and the like, and these characteristics may determine durability against internal stress or external stress.

The passivation layer may be formed of silicon nitride (Si3N4), or may be formed of a dielectric material such as magnesium oxide (MgO).

Furthermore, in the three-dimensional device 500 according to an embodiment, the horizontal electrode layers 510 may be in contact with a gate used as a word line, and may be in a shape of a surrounding gate of the three-dimensional device 500.

The vertical channel layer 520 are formed in different hole sizes by the vertical cell groups 531, 532, and 533, and are orthogonal to the plurality of horizontal electrode layers 510. The vertical channel layer 520 may be formed of single crystal silicon or poly-silicon. For example, a selective epitaxial growth process or a phase change epitaxial process using a device formation substrate (not shown) as a seed may be used to form the vertical channel layer 520.

The vertical channel layer 520 may be formed in a direction perpendicular to the device formation substrate and may be formed in a through hole penetrating the plurality of horizontal electrode layers 510 configured for the vertical cell groups 531, 532, and 533 to be connected to the plurality of horizontal electrode layers 510. In this case, the through hole represents different hole sizes for each vertical cell group.

For example, the vertical channel layer 520 may be formed in the through hole penetrating the plurality of horizontal electrode layers 510 configured for the vertical cell groups 531, 532, and 533, and the through hole may be formed to have the different hole sizes for the vertical cell groups 531, 532, and 533. In this case, the through hole may be formed by line etching.

Referring to FIG. 5, the vertical channel layer 520 formed in the first vertical cell group 531 may have a hole size of "A", the vertical channel layer 520 formed in the second vertical cell group 532 may have a hole size of "B", and the vertical channel layer 520 formed in the third vertical cell group 533 may have a hole size of "C", and the hole size may be "A">"B">"C" in that order. Here, in the vertical channel layer 520, it is characterized in that the hole size in one vertical cell group is kept constant. For example, the vertical channel layer 520 may keep the hole size of "A" constant in one first vertical cell group 531, the vertical channel layer 520 may keep the hole size of "B" constant in the second vertical cell group 532, and the vertical channel layer 520 may keep the hole size of "C" constant in the third vertical cell group 533.

Furthermore, each of the plurality of vertical channel layers 520 formed for each vertical cell group may be connected to each other, and a channel material may be filled into the hole. For example, a first through hole in the first vertical cell group 531, a second through hole in the second vertical cell group 532, and a third through hole in the third vertical cell group 533 may be connected to one another, and the channel material may be filled into the through holes having different hole sizes for each vertical cell group to form the vertical channel layer 520.

As illustrated in FIG. 5, the present invention may be characterized in that the hole size (e.g., "A") of the vertical channel layer 520 positioned above is larger than the hole size (e.g., "C") of the vertical channel layer 520 positioned below, of the three-dimensional device 500, and the channel material such as single crystalline silicon or polycrystalline silicon may be smoothly filled into the hole depending on the different hole sizes of the vertical channel layer 520.

That is, for forming a stable vertical channel structure in the high-level three-dimensional flash memory architecture having more than 100 stages, the three-dimensional device 500 according to an embodiment may have the different hole sizes "A", "B", and "C" in the vertical channel layer 520 for each vertical cell group 531, 532, and 533 to provide a structure in which the channel material is capable of being applied stably in one layer forming process even at the high stages. However, the vertical cell groups, the hole sizes, and the number, shape, type, and size of the horizontal electrode layers are not limited thereto.

In an embodiment, a tunnel oxide layer (not shown), a silicon nitride layer (not shown), and an interlayer oxide layer (not shown) may be formed around the plurality of vertical channel layers 520, and the plurality of horizontal electrode layers 510 may have a form vertically stacked with respect to the vertical channel layers 520.

In detail, the three-dimensional device 500 according to an embodiment may use an ONO (Oxide/Nitride/Oxide) structure such as a tunnel oxide layer, a silicon nitride layer, and an interlayer oxide layer for charge storage. However, the three-dimensional device 500 according to an embodiment may include a floating gate instead of the ONO structure, and the plurality of horizontal electrode layers 510 may be connected to the plurality of vertical channel layers 520 by a charge trap layer such as an ONO structure or a floating gate. In this case, the floating gate may be formed of a single crystalline group 3-5 semiconductor or a single crystalline silicon semiconductor, and the tunnel oxide layer and the interlayer oxide layer may be disposed around the floating gate.

Figure 6:
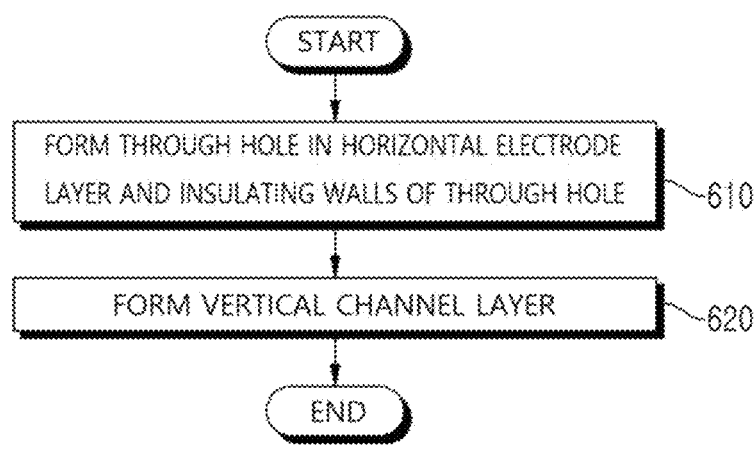
FIG. 6 illustrates a flowchart of a method of manufacturing a three-dimensional device, according to an embodiment.

FIG. 6 illustrates a flowchart of a method of manufacturing a three-dimensional device according to an embodiment.

Referring to FIG. 6, in operation 610, in the method of manufacturing the three-dimensional device, a through hole is formed in a plurality of horizontal electrode layers stacked and configured for each vertical cell group, and a stand is formed in the through hole.

For example, the plurality of horizontal electrode layers may be formed by alternately stacking a plurality of interlayer insulating layers and a plurality of passivation layers on a device formation substrate, etching the plurality of passivation layers to apply a conductive material in a cell in which the passivation layers are etched, and etching the plurality of interlayer insulating layers. The etching of the plurality of interlayer insulating layers may be a step of partially etching the interlayer insulating layers using a photolithography process and a dry etching process.

In this case, the device formation substrate may be a silicon substrate, but is not limited to a semiconductor material such as silicon. In addition, the interlayer insulating layers may be used as long as a material has an electrically non-conductive property, and for example, silicon nitride (SiN), silicon oxynitride (SiON), silicon oxide (SiO2), or metallic oxide may be used. In addition, the passivation layers may be formed of silicon nitride (Si3N4), or may be formed of a dielectric material such as magnesium oxide (MgO).

Operation 610 may include forming a first through hole penetrating and a stand of the first through hole, forming a second through hole penetrating the plurality of horizontal electrode layers formed of a second vertical cell group positioned below the first vertical cell group and a stand of the second through hole, and forming a third through hole penetrating the plurality of horizontal electrode layers formed of a third vertical cell group positioned below the second vertical cell group and a stand of the third through hole.

For example, the through hole may be formed in a direction perpendicular to the device formation substrate, and may be formed as a hole penetrating the horizontal electrode layers by line etching. However, the thickness, size, position, and number of through holes may vary depending on embodiments to which the three-dimensional device according to an embodiment is applied, but not to be limited thereto.

In operation 610, it is characterized in that, in each of the first vertical cell group, the second vertical cell group, and the third vertical cell group, a first through hole, a second through hole, and a third through hole maintaining a constant hole size may be formed. The hole size of the first through hole is larger than that of the third through hole. Due to the different hole sizes, a channel material such as single crystal silicon or poly-silicon may be smoothly filled into the first through hole, the second through hole, and the third through hole.

In operation 620, the channel material is filled into the through hole to form a vertical channel layer.

In operation 620, the channel material may be filled into the first through hole, the second through hole, and the third through hole connected to one another to form a plurality of vertical channel layers. In this case, the vertical channel layers may be formed of single crystal silicon, poly-silicon, or the like, but the type is not limited.

Thereafter, the method of manufacturing the three-dimensional device according to an embodiment may further include forming a three-dimensional device supported by the plurality of vertical channel layers perpendicular to the plurality of horizontal electrode layers. Here, the three-dimensional device is characterized in that the vertical channel structure formed to have the different hole sizes is included therein.

FIGS. 7A to 7D illustrate a process of a three-dimensional device according to an embodiment.

FIGS. 7A to 7D illustrate a process of forming a three-dimensional device 700 in time order, but the order of the process may be partially changed depending on embodiments.

The three-dimensional device 700 according to an embodiment may include a vertical cell group in which a plurality of stacked horizontal electrode layers 710 is grouped in an arbitrary number. For example, the vertical cell group may be classified into a first vertical cell group 731, a second vertical cell group 732, and a third vertical cell group 733, but the number of groups and the number of the plurality of horizontal electrode layers 710 grouped are not limited thereto.

In this case, a plurality of interlayer insulating layers alternately disposed between the plurality of horizontal electrode layers 710 may be etched. For example, a plurality of passivation layers among the plurality of interlayer insulating layers and the plurality of passivation layers, which are alternately stacked on a device formation substrate may be etched and a conductive material may be applied on a cell in which the passivation layers are etched to form the plurality of horizontal electrode layers 710.

The horizontal electrode layers 710 may be formed of the conductive material, and may be polycrystalline silicon, tungsten (W), titanium (Ti), tantalum (Ta), or an alloy thereof. In addition, the device formation substrate may be a silicon substrate, but is not limited to a semiconductor material such as silicon.

The interlayer insulating layer may be used as long as a material has an electrically non-conductive property, and for example, silicon nitride (SiN), silicon oxynitride (SiON), silicon oxide (SiO2), or metallic oxide may be used. In addition, the interlayer insulating layer may be used for planarization or insulation and may include a gas material such as DSG (SiOF), TFOS, BPSG, or the like, formed by chemical vapor deposition (CVD), and a coating material (SOD) represented by SOG (spin-on glass/Shiroki acid). These various materials may have various material characteristics such as mechanical strength, dielectric constant, dielectric loss, chemical stability, thermal stability, conductivity, and the like, and these characteristics may determine durability against internal stress or external stress.

The passivation layer may be formed of silicon nitride (Si3N4), or may be formed of a dielectric material such as magnesium oxide (MgO).

Figure 7A:
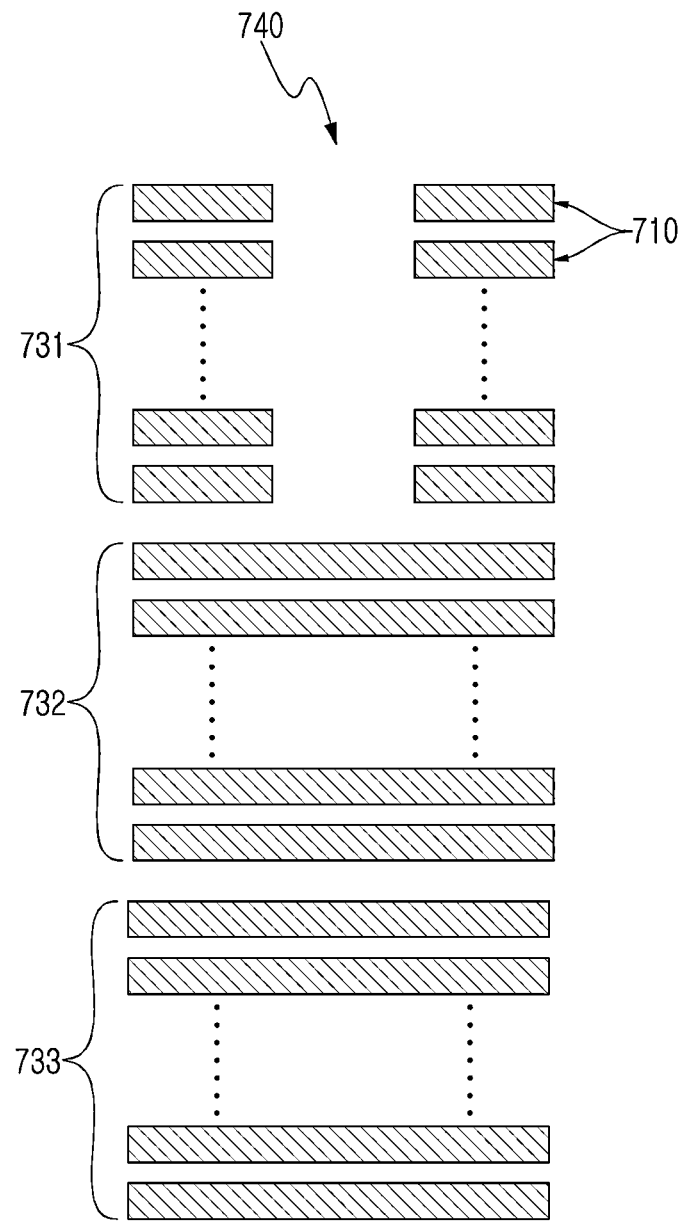
FIGS. 7A to 7D illustrate a process of a three-dimensional device according to an embodiment.

Referring to FIG. 7A, a first through hole 740 is formed to penetrate the plurality of horizontal electrode layers 710 stacked to be configured for the first vertical cell group 731.

For example, the first through hole 740 may be a hole penetrating the first vertical cell group 731 including the plurality of horizontal electrode layers 710 and may be formed to have a predetermined constant size by line etching.

Figure 7B:
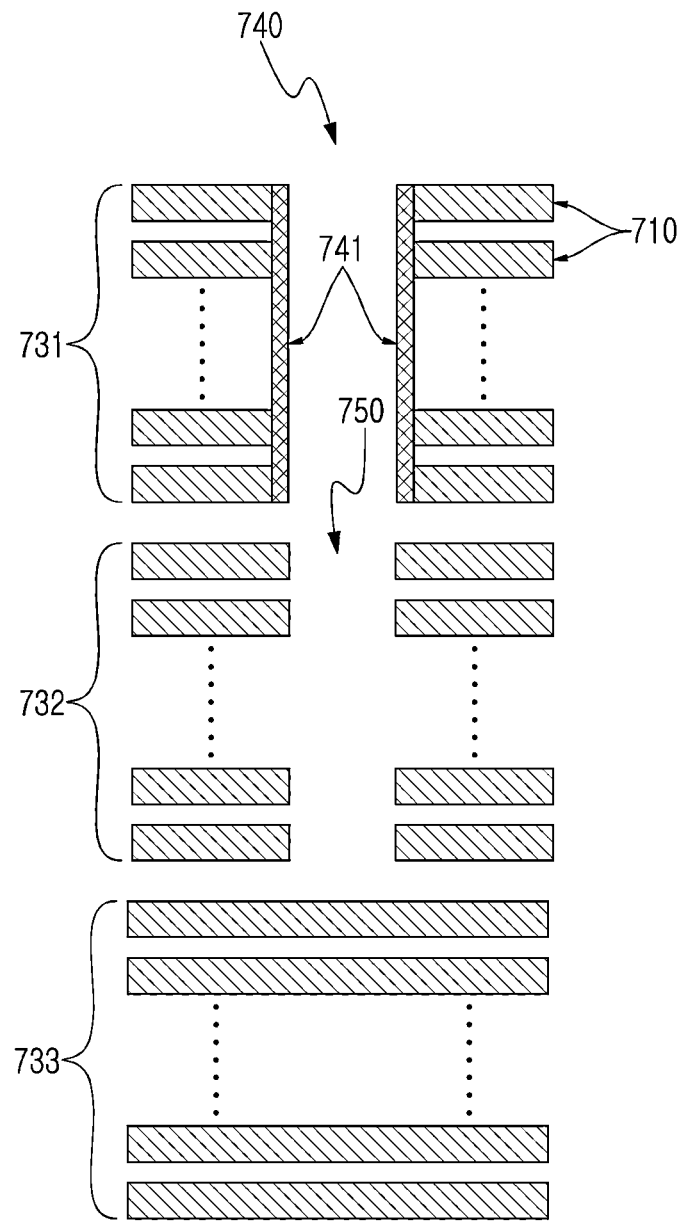

Referring to FIG. 7B, a stand 741 of the first through hole is provided in opposite sides of the first through hole 740 formed in FIG. 7A. In this case, the stand 741 of the first through hole may be in a form surrounding the first through hole 740 and may be formed of a material used for planarization or insulation. For example, the stand 741 of the first through hole may be formed of silicon nitride (SiN), silicon oxynitride (SiON), silicon oxide (SiO2), a metallic oxide, or the like, and may be formed of a channel material such as single crystal silicon or poly-silicon.

Thereafter, as shown in FIG. 7B, the stand 741 of the first through hole is formed, and a second through hole 750 penetrating the plurality of horizontal electrode layers 710 configured for the second vertical cell group 732 is formed.

For example, the second through hole 750 may be a hole penetrating the second vertical cell group 732 including plurality of horizontal electrode layers 710 and may be formed to have a predetermined constant size by line etching. Meanwhile, it is characterized in that a hole size of the second through hole 750 is smaller than a hole size of the first through hole 740.

Figure 7C:
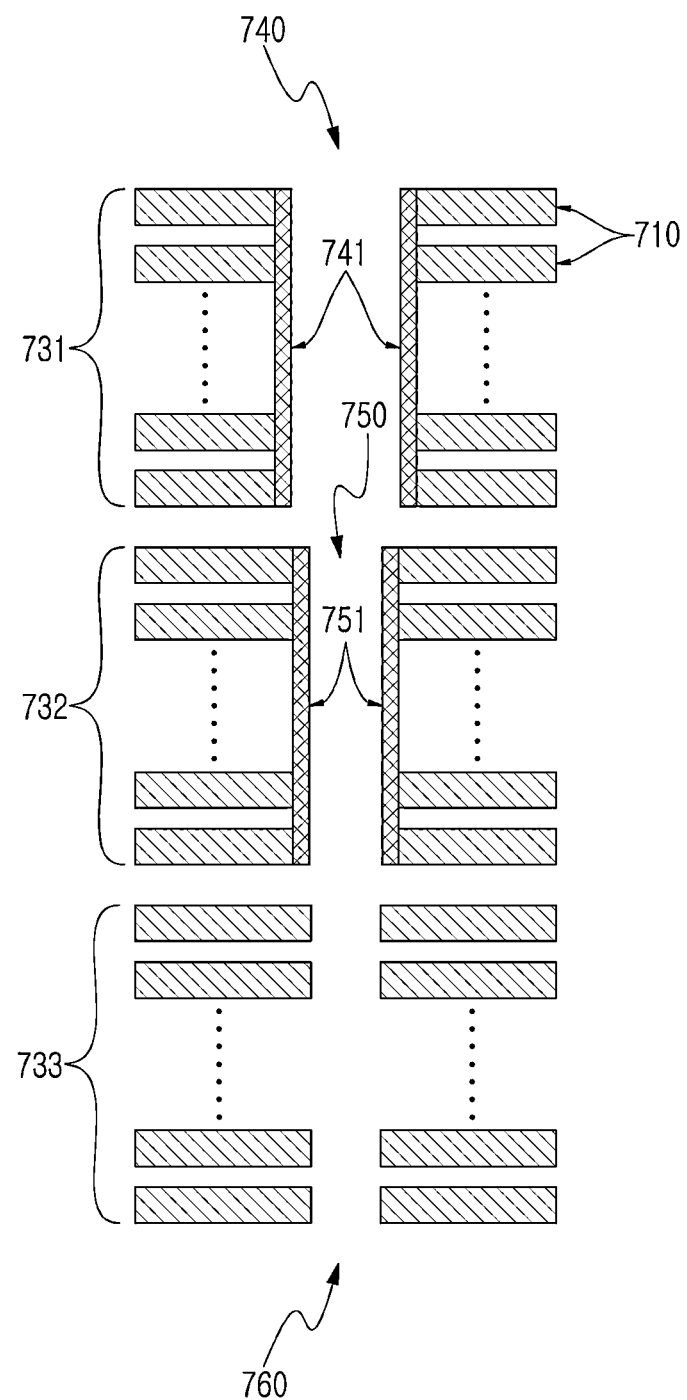

Referring to FIG. 7C, a stand 751 of the second through hole is provided in opposite sides of the second through hole 750 formed in FIG. 7B. In this case, the stand 751 of the second through hole may be formed of the same shape and material as the stand 741 of the first through hole.

Subsequently, as illustrated in FIG. 7C, the stand 751 of the second through hole is formed, and a third through hole 760 is formed to penetrate the plurality of horizontal electrode layers 710 configured for the third vertical cell group 733.

For example, the third through hole 760 may be a hole penetrating the third vertical cell group 733 including the plurality of horizontal electrode layers 710, and may formed to have a predetermined constant size by line etching. Meanwhile, it is characterized in that a hole size of the third through hole 760 is smaller than the hole size of the second through hole 750.

Figure 7D:
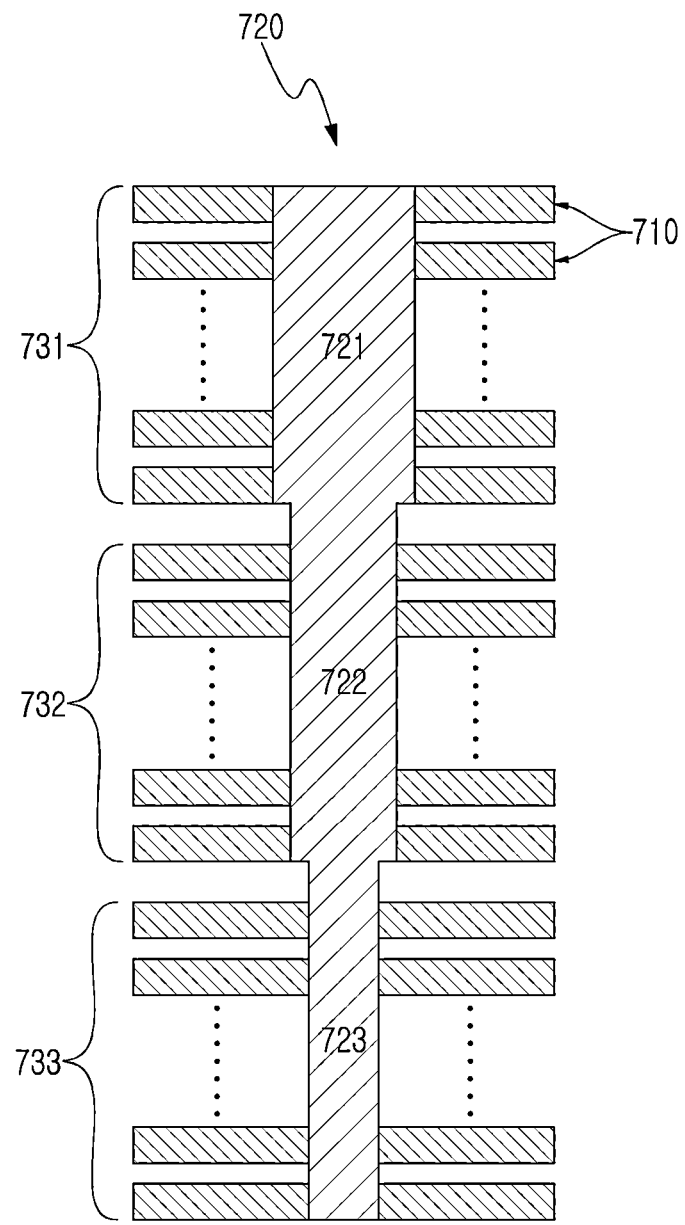

Referring to FIG. 7D, a channel material is filled into the first through hole 740, the second through hole 750, and the third through hole 760 to form a vertical channel layer 720. In this case, each of the first through hole 740, the second through hole 750, and the third through hole 760 has a different hole size, and the size gradually decreases in the order of the hole size of the first through hole 740, the hole size of the second through hole 750, and the hole size of the third through hole 760.

In addition, it is characterized in that each of the first through hole 740, the second through hole 750, and the third through hole 760 may maintain a constant hole size in the first vertical cell group 731, the second vertical cell group 732, and the third vertical cell group 733, respectively. For example, the first through hole 740 in the first vertical cell group 731 is the same sized hole size, the second through hole 750 in the second vertical cell group 732 is the same sized hole, and the third through hole 760 in the third vertical cell group 733 is the same sized hole.

Furthermore, in the three-dimensional device 700 according to an embodiment, the channel material such as single crystal silicon or poly-silicon may be smoothly filled into the hole, because the first through hole 740, the second through hole 750, and the third through hole 760, which have the different hole sizes from one another, are configured for the first vertical cell group 731, the second vertical cell group 732, and the third vertical cell group 733, respectively.

Accordingly, the three-dimensional device 700 according to an embodiment may include a first vertical channel layer 721 filled in the first through hole 740, a second vertical channel 722 filled in the second through hole 750, and a third vertical channel layer 723 filled in the third through hole 760, and the first vertical channel layer 721, the second vertical channel layer 722, and the third vertical channel layer 723 may be connected to one another to form the vertical channel layer 720.

That is, for forming a stable vertical channel structure in the high-level three-dimensional flash memory architecture having more than 100 stages, the three-dimensional device 700 according to an embodiment may have the different hole sizes in the vertical channel layer 720 for each vertical cell group 731, 732, and 733 to provide a structure in which the channel material is capable of being applied stably in one layer forming process even at the high stages.

Figure 8:
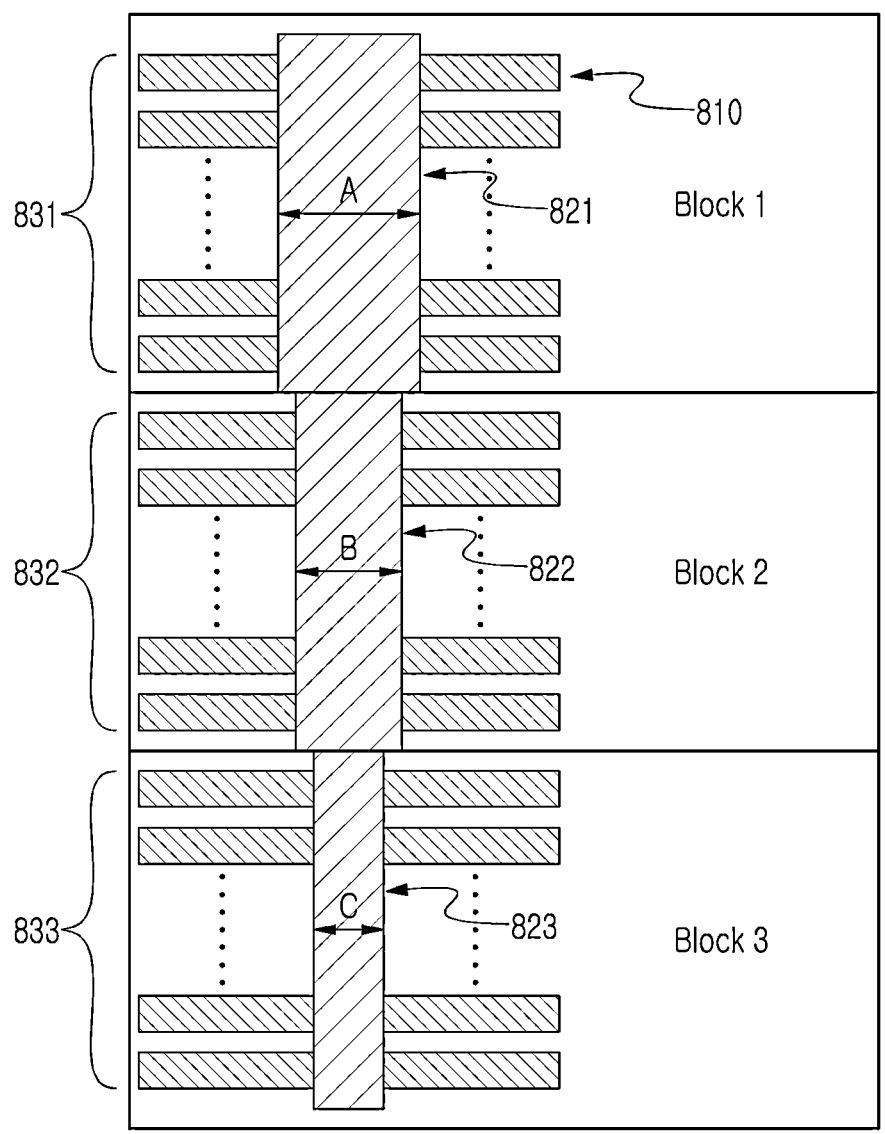
FIG. 8 illustrates an example of configuring an architecture for each vertical cell group according to an embodiment.

FIG. 8 illustrates an example of configuring an architecture for each vertical cell group according to an embodiment.

Referring to FIG. 8, a three-dimensional device 800 according to an embodiment includes a plurality of vertical channel layers 821, 822, and 823 filled with a channel material in through holes, and the through holes are holes stacked to penetrate a plurality of horizontal electrode layers 810 configured for vertical cell groups 831, 832, and 833.

For example, the three-dimensional device 800 may include the first vertical channel layer 821 in which a channel material is filled in a first through hole formed in the first vertical cell group 831, the second vertical channel layer 822 filled with a channel material in a second through hole formed in the second vertical cell group 832, and the third vertical channel layer 823 in which channel material is filled in third through holes formed in third vertical cell group 833. In this case, the first through hole, the second through hole, and the third through hole have different hole sizes, and are connected to one another to allow the channel material such as single crystal silicon or poly-silicon to be smoothly filled into the hole.

Referring to FIG. 8, the first through hole formed in the plurality of horizontal electrode layers 810 in the first vertical cell group 831 has a hole size of "A" size, the second through hole formed in the plurality of horizontal electrode layers 810 in the second vertical cell group 832 has a hole size of "B" size, and the third through hole formed in the plurality of horizontal electrode layers 810 in the third vertical cell group 833 has a hole size of "C" size. That is, it is characterized in that the hole size may be "A">"B">"C" in that order.

According to the present invention, the first vertical cell group 831, the second vertical cell group 832, and the third vertical cell group 833 in regions "A", "B", and "C" having the different hole sizes may constitute an architecture into different blocks or may be configured to complement cell characteristics predicted by an external circuit to stabilize overall cell characteristics.

FIGS. 9A to 9D illustrate a process of horizontal electrode layers according to an embodiment.

FIGS. 9A to 9D illustrate a process of forming the horizontal electrode layers in time order, but the order of the process may be partially changed depending on embodiments.

Figure 9A:
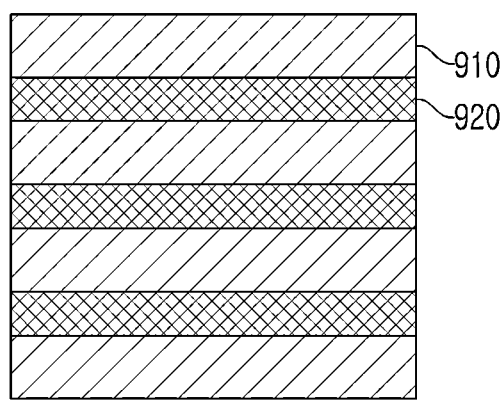
FIGS. 9A to 9D illustrate a process of a horizontal electrode layer according to an embodiment.

Referring to FIG. 9A, a plurality of interlayer insulating layers 910 and a plurality of passivation layers 920 are alternately stacked on a device formation substrate (not shown).

In this case, the device formation substrate may be a silicon substrate, but is not limited to a semiconductor material such as silicon. In addition the interlayer insulating layer 910 may be used as long as a material has an electrically non-conductive property, and for example, silicon nitride (SiN), silicon oxynitride (SiON), silicon oxide (SiO2), or metallic oxide may be used. In addition, the interlayer insulating layer 910 may be used for planarization or insulation and may include a gas material such as DSG (SiOF), TFOS, BPSG, or the like, formed by chemical vapor deposition (CVD), and a coating material (SOD) represented by SOG (spin-on glass/Shiroki acid). These various materials may have various material characteristics such as mechanical strength, dielectric constant, dielectric loss, chemical stability, thermal stability, conductivity, and the like, and these characteristics may determine durability against internal stress or external stress.

In addition, the passivation layer may be formed of silicon nitride (Si3N4), or may be formed of a dielectric material such as magnesium oxide (MgO).

Figure 9B:
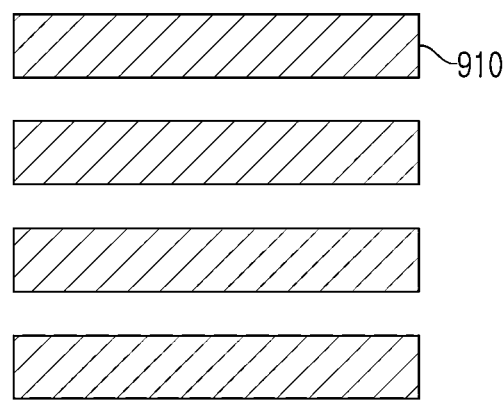

Thereafter, referring to FIG. 9B, the plurality of passivation layers 920 are etched. For example, the plurality of passivation layers 920 may be partially etched using a photolithography process and a dry etching process. However, a method of partially etching the passivation layers 920 is not limited thereto, and a method used in the existing technology is used.

Figure 9C:
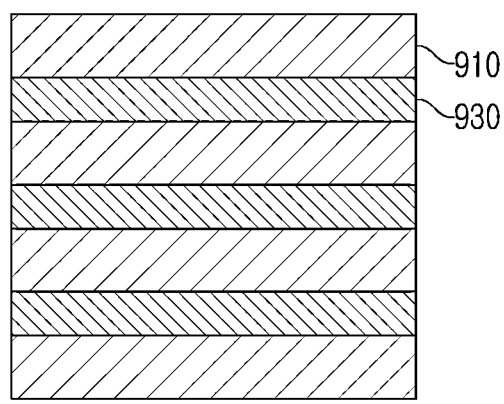

Referring to FIG. 9C, a conductive material is applied on a cell in which the plurality of passivation layers 920 are etched. For example, a plurality of horizontal electrode layers 930 may be formed by applying a conductive material on the cell in which the plurality of passivation layers 920 is etched. The conductive material may be polycrystalline silicon, tungsten (W), titanium (Ti), tantalum (Ta), or an alloy thereof.

Figure 9D:
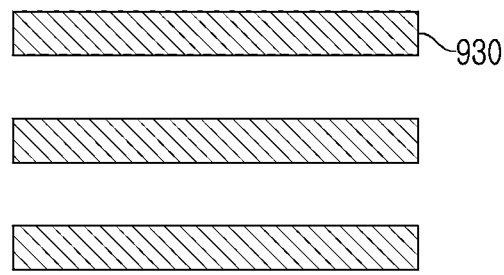

Thereafter, referring to FIG. 9D, the plurality of interlayer insulating layers 910 are etched.

In this case, the plurality of interlayer insulating layers 910 may be partially etched through a photolithography process and a dry etching process. However, a method of partially etching the interlayer insulating layers 910 is not limited thereto, and the method used in the existing technology is used.

Accordingly, the three-dimensional device according to an embodiment may include the plurality of stacked horizontal electrode layers 930, and the plurality of interlayer insulating layers 910 alternately disposed between the plurality of horizontal electrode layers 930 are etched.

Figure 11A:
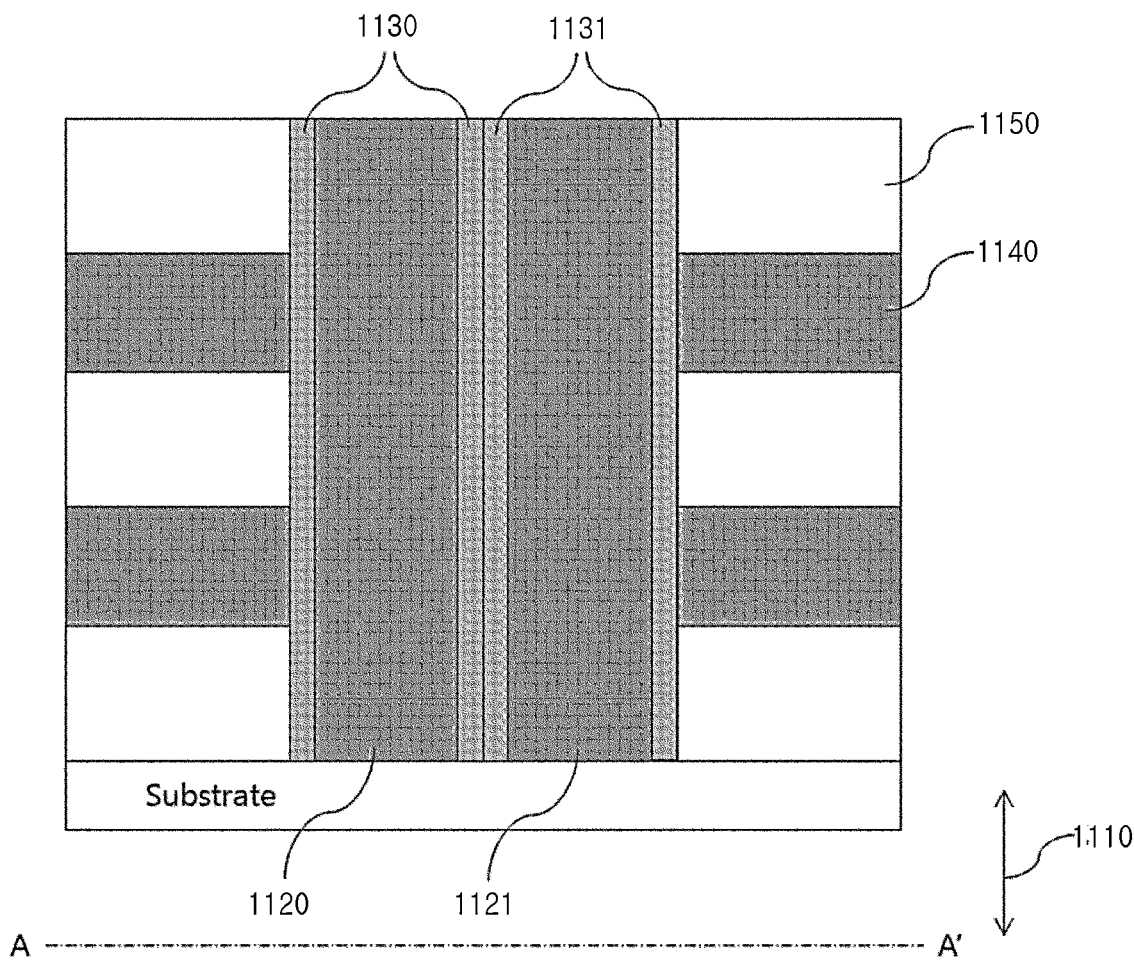
FIGS. 11A and 11B are views illustrating a three-dimensional flash memory according to one embodiment.
Figure 11B:
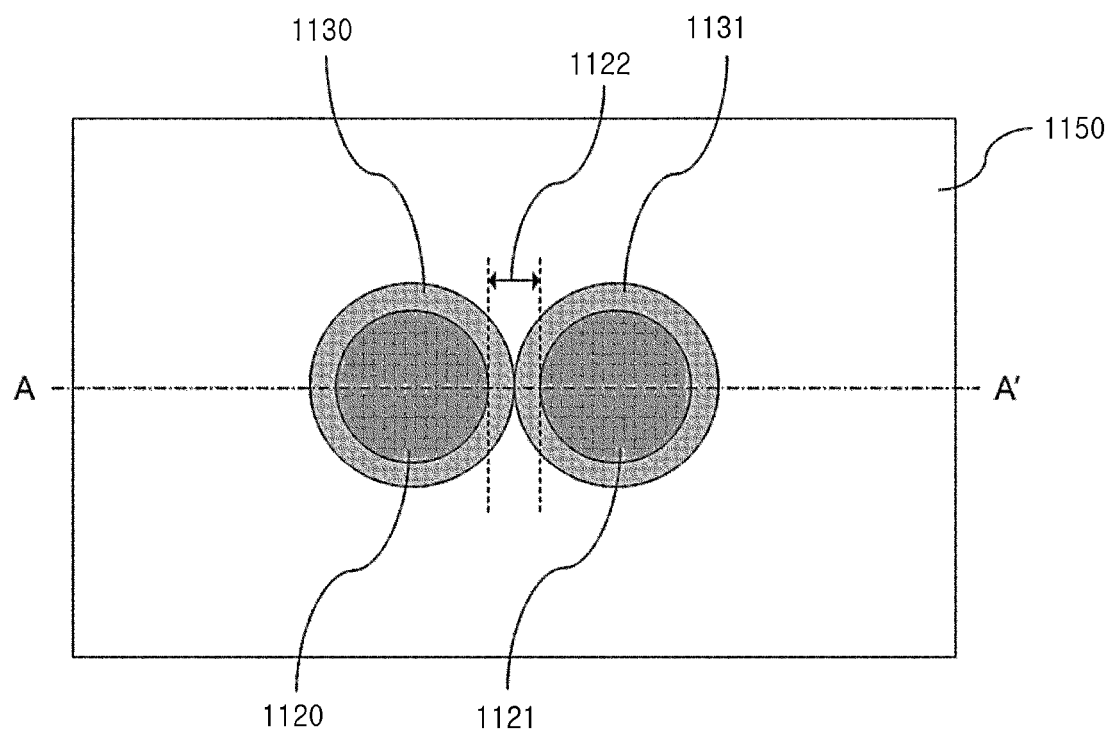

FIGS. 11A and 11B are views illustrating a three-dimensional flash memory according to one embodiment. In detail, FIG. 11A is a cross-sectional view illustrating a three-dimensional flash memory according to an embodiment and FIG. 11B is a top view illustrating a three-dimensional flash memory according to an embodiment.

Referring to FIGS. 11A and 11B, a three-dimensional flash memory 1100 according to an embodiment may include at least two channel layers 1120 and 1121 extending in one direction 1110, at least two oxide-nitride-oxide (ONO) layers 1130 and 1131 extending in one direction 1110 to surround the at least two channel layers 1120 and 1121, respectively, and a plurality of electrode layers 1140 stacked to be vertically connected to each of the at least two ONO layers 1130 and 1131 and may further include a plurality of interlayer insulating layers 1150 disposed alternately with the plurality of electrode layers 1140 and stacked to be vertically connected to each of the at least two ONO layers 1130 and 1131.

Hereinafter, in the drawings, the at least two ONO layers 1130 and 1131 are shown as being composed of one layer, but substantially, the ONO layers 1130 and 1131 may include three layers such as a first oxide layer, a nitride layer, and a second oxide layer.

In particular, the three-dimensional flash memory 1100 according to an embodiment is characterized in that the at least two ONO layers 1130 and 1131 are formed to be in contact with each other. Hereinafter, the at least two ONO layers 1130 and 1131 are in contact with each other, which means that the at least two ONO layers 1130 and 1131 are in contact with each other on the same horizontal plane.

As described above, when the at least two ONO layers 1130 and 1131 are in contact with each other, an inter-surface distance 1122 of the at least two channel layers 1120 and 1121 is equal to thickness of the at least two ONO layers 1130 and 1131. For example, when each of the at least two ONO layers 1130 and 1131 is formed to a thickness of 20 nm, the inter-surface distance 1122 of the at least two channel layers 1120 and 1121 has a value of 40 nm. As another example, when each of the at least two ONO layers 1130 and 1131 is formed to a thickness of 10 nm, the inter-surface distance 1122 of the at least two channel layers 1120 and 1121 has a value of 20 nm.

As described above, the three-dimensional flash memory 1100 according to an embodiment may form at least two ONO layers 1130 and 1131 to be in contact with each other, thereby increasing and improving horizontal integration degree as compared with a conventional three-dimensional flash memory.

In this case, because the three-dimensional flash memory 1100 has a structure in which the at least two ONO layers 1130 and 1131 are in contact with each other, the three-dimensional flash memory 1100 may perform a program and erase operation by applying a voltage lower than a voltage applied in the program and erase operations of the conventional three-dimensional flash memory.

As described above, the three-dimensional flash memory 1100 uses the ONO layers as a charge storage layer in which charges are stored, but the three-dimensional flash memory 1100 is not limited thereto, and various charge storage layers other than the ONO layer may be used. In this case, the three-dimensional flash memory includes at least two channel layers extending in one direction, at least two charge storage layers extending in one direction to surround each of the at least two channel layers, and a plurality of electrode layers stacked to be vertically connected to each of the at least two charge storage layers and the at least two charge storage layers may be formed to be in contact with each other.

A detailed description of the method of manufacturing the three-dimensional flash memory 1100 described above will be described with reference to FIGS. 13 to 15D.

Figure 12A:
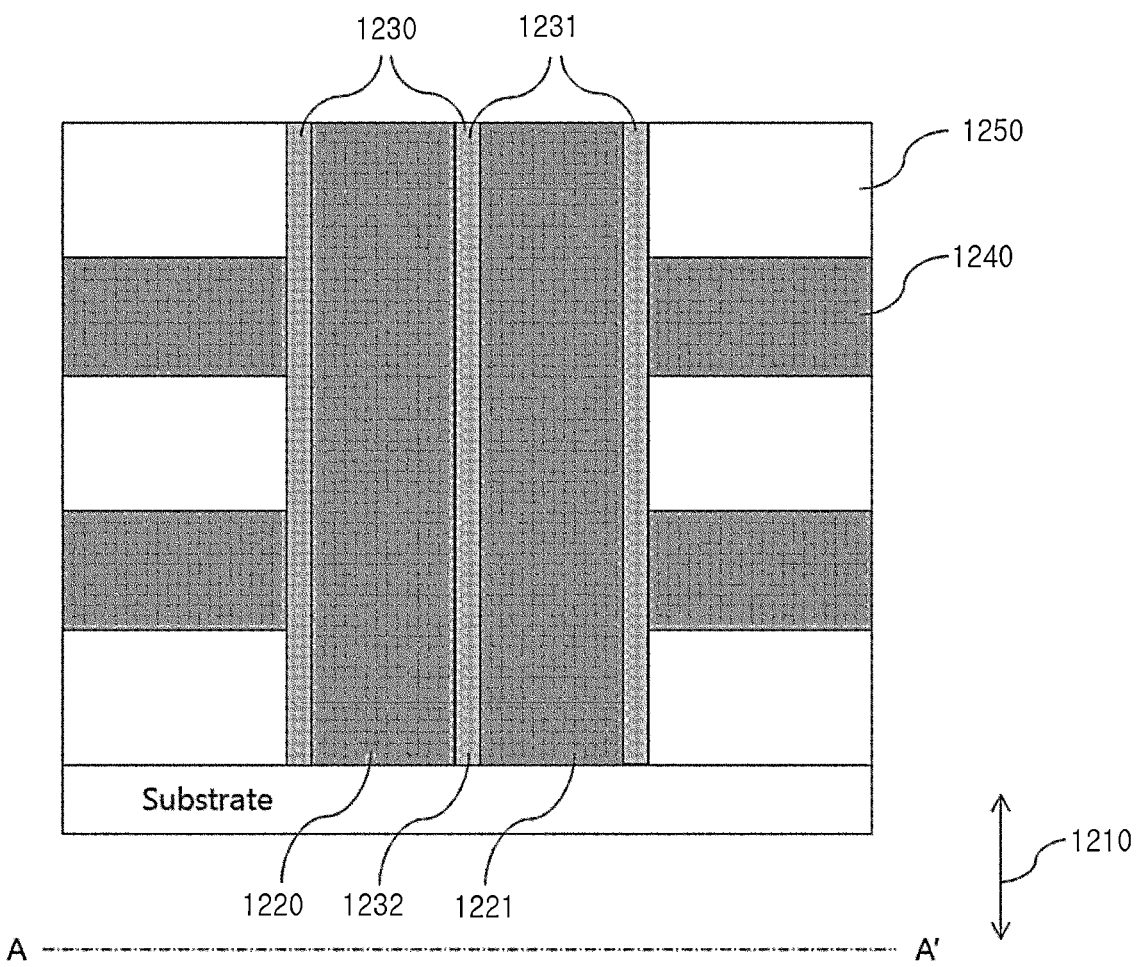
FIGS. 12A and 12B illustrate a three-dimensional flash memory according to another embodiment.
Figure 12B:
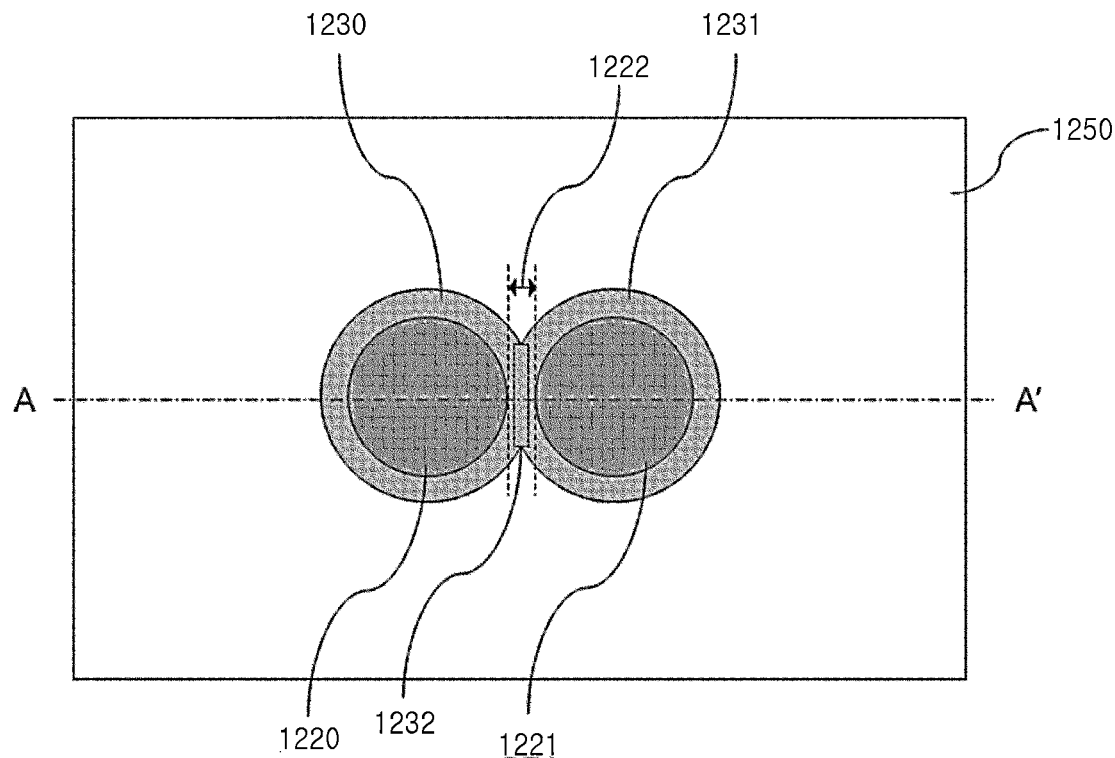

FIGS. 12A and 12B illustrate a three-dimensional flash memory according to another embodiment. In detail, FIG. 12A is a cross-sectional view illustrating the three-dimensional flash memory according to another embodiment and FIG. 12B is a top view illustrating the three-dimensional flash memory according to another embodiment.

Referring to FIGS. 12A and 12B, a three-dimensional flash memory 1200 according to another embodiment may include at least two channel layers 1220 and 1221 extending in one direction 1210, at least two ONO layers 1230 and 1231 extending in one direction 1210 to surround the at least two channel layers 1220 and 1221, respectively, and a plurality of electrode layers 1240 stacked to be vertically connected to each of the at least two ONO layers 1230 and 1231, and may further include a plurality of interlayer insulating layers 1250 disposed alternately with the plurality of electrode layers 1240 and stacked to be vertically connected to each of the at least two ONO layers 1230 and 1231.

Hereinafter, in the drawings, at least two ONO layers 1230 and 1231 are shown as being composed of one layer, but substantially, the ONO layers 1230 and 1231 may include three layers such as a first oxide layer, a nitride layer, and a second oxide layer.

In particular, the three-dimensional flash memory 1200 according to another embodiment is characterized in that at least a portion 1232 of the at least two ONO layers 1230 and 1231 overlap. Hereinafter, overlapping the at least a portion 1232 of the at least two ONO layers 1230 and 1231 means that the at least two ONO layers 1230 and 1231 share the at least a portion 1232 while being located on the same horizontal plane.

As described above, when the at least two ONO layers 1230 and 1231 have the at least a portion 1232 overlapping, an inter-surface distance 1222 of the at least two channel layers 1220 and 1221 is equal to a thickness (a thickness of the at least a portion 1232) of one of the ONO layers 1230 and 1231. For example, when each of the at least two ONO layers 1230 and 1231 is formed with a thickness of 20 nm, the thickness of the at least part 1232 is also 20 nm and the inter-surface distance 1222 of the at least two channel layers 1220 and 1221 has a value of 20 nm. In another example, when each of the at least two ONO layers 1230 and 1231 is formed to a thickness of 10 nm, the thickness of at least a portion 1232 is also 10 nm and the inter-surface distance 1222 of the at least two channel layers 1220 and 1221 has a value of 10 nm.

As described above, the three-dimensional flash memory 1200 according to another embodiment may form the at least two ONO layers 1230 and 1231 such that the at least a portion 1232 of the at least two ONO layers 1230 and 1231 overlap, thereby increasing and improving horizontal integration degree as compared with a conventional three-dimensional flash memory.

In this case, because the three-dimensional flash memory 1200 has a structure in which the at least a portion 1232 of the at least two ONO layers 1230 and 1231 overlap, the three-dimensional flash memory 1200 may perform a program and erase operation by applying a voltage lower than a voltage applied in the program and erase operations of the conventional three-dimensional flash memory.

As described above, the three-dimensional flash memory 1200 uses the ONO layer as the charge storage layer in which charges are stored, but the three-dimensional flash memory 1200 is not limited thereto, and various charge storage layers other than the ONO layer may be used. In this case, the three-dimensional flash memory includes at least two channel layers extending in one direction, at least two charge storage layers extending in one direction to surround each of the at least two channel layers, and a plurality of electrode layers stacked to be vertically connected to each of the at least two charge storage layers and at least a portion of the at least two charge storage layers may have a structure formed to overlap.

A detailed description of the method of manufacturing the three-dimensional flash memory 1200 described above will be described with reference to FIGS. 13 to 15D.

Figure 13:
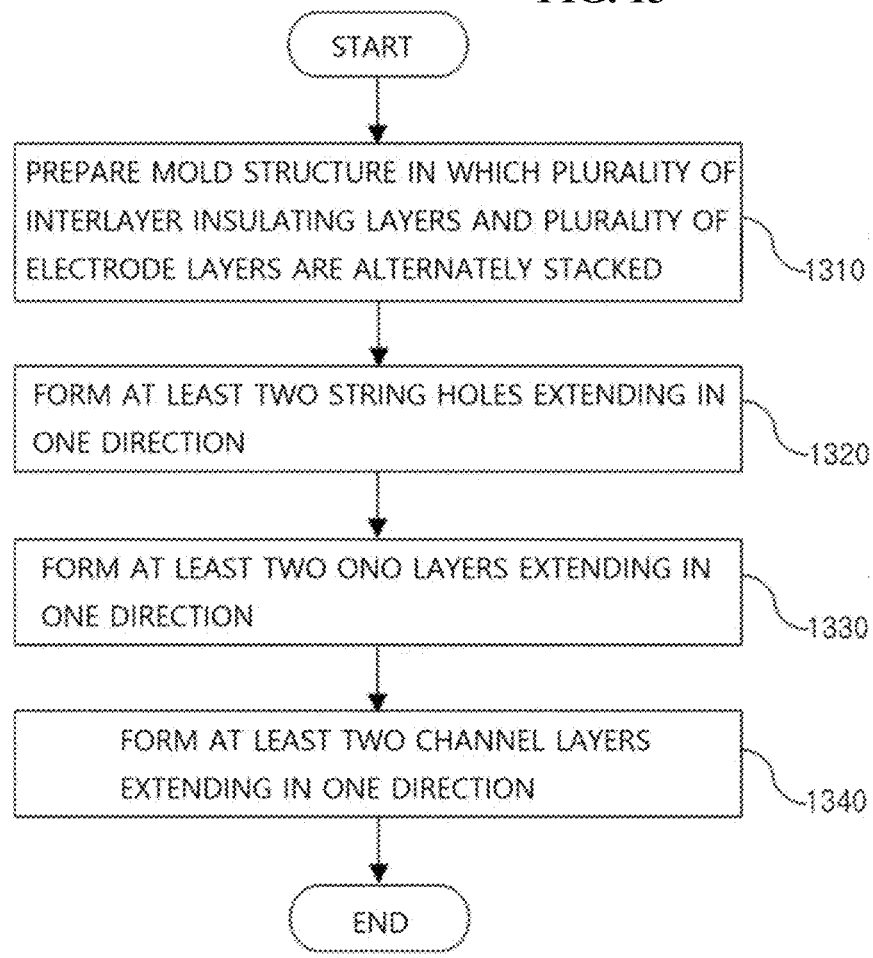
FIG. 13 is a flowchart illustrating a method of manufacturing a three-dimensional flash memory according to an embodiment.

FIG. 13 is a flowchart illustrating a method of manufacturing a three-dimensional flash memory according to an embodiment. FIGS. 14A through 14D are cross-sectional views illustrating a method of manufacturing a three-dimensional flash memory according to an embodiment, and FIGS. 15A to 15D are top views illustrating a method of manufacturing a three-dimensional flash memory according to an embodiment.

Hereinafter, a three-dimensional flash memory manufactured by the manufacturing method of the three-dimensional flash memory has a structure of the three-dimensional flash memory described above with reference to FIGS. 11A and 11B or a structure of the three-dimensional flash memory described above with reference to FIGS. 12A and 12B.

In addition, hereinafter, a subject performing a method of manufacturing a three-dimensional flash memory is a manufacturing system for manufacturing a three-dimensional flash memory, and because a method of manufacturing a three-dimensional flash memory according to an embodiment is performed based on a conventional process of manufacturing a three-dimensional flash memory, the system for performing the manufacturing process of the conventional three-dimensional flash memory may be used as the manufacturing system.

Figure 14A:
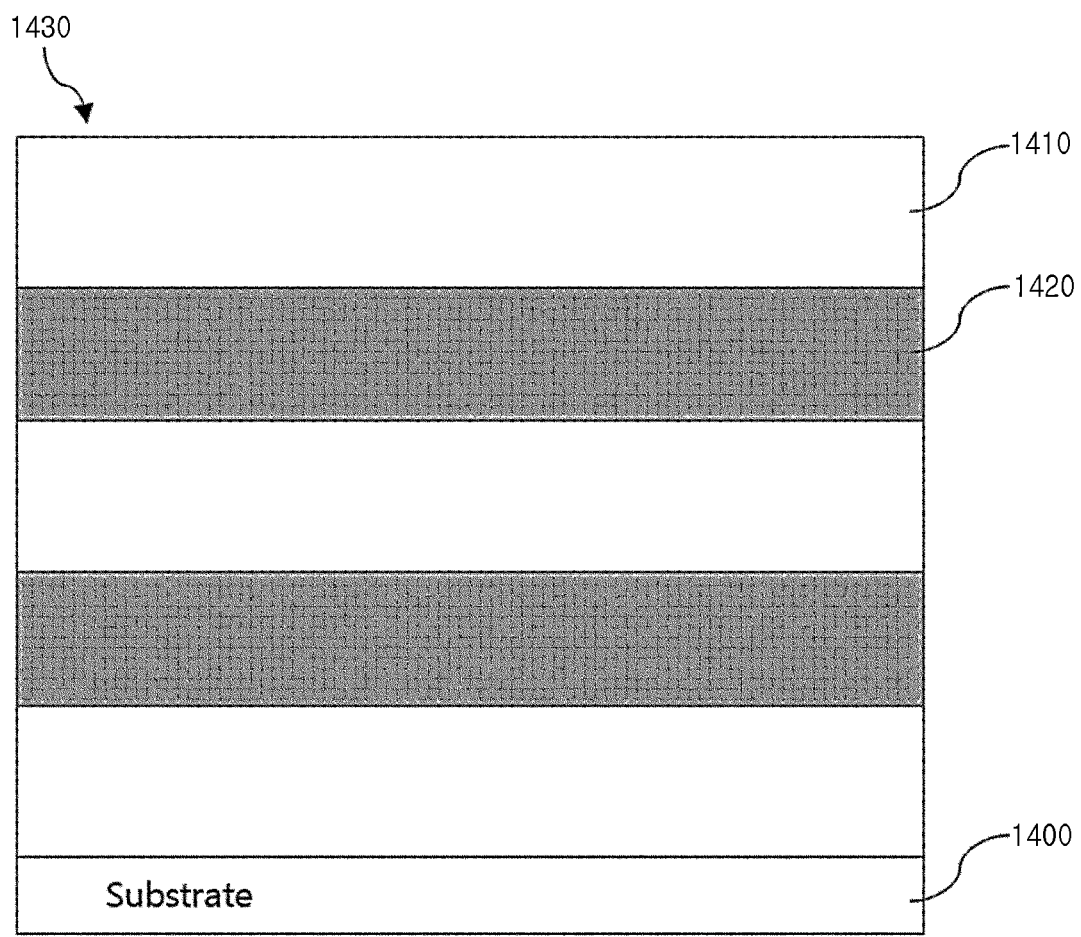
Figure 14B:
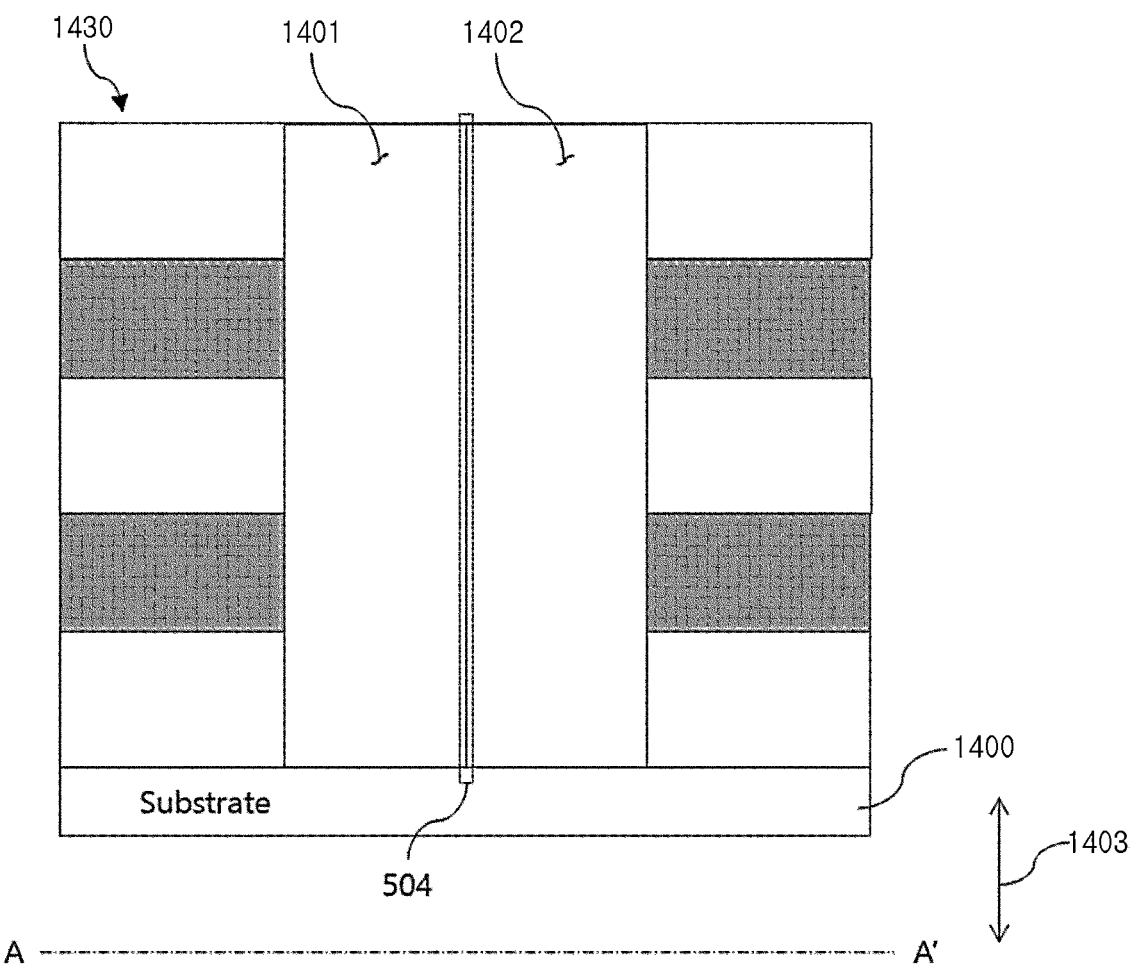
Figure 14D:
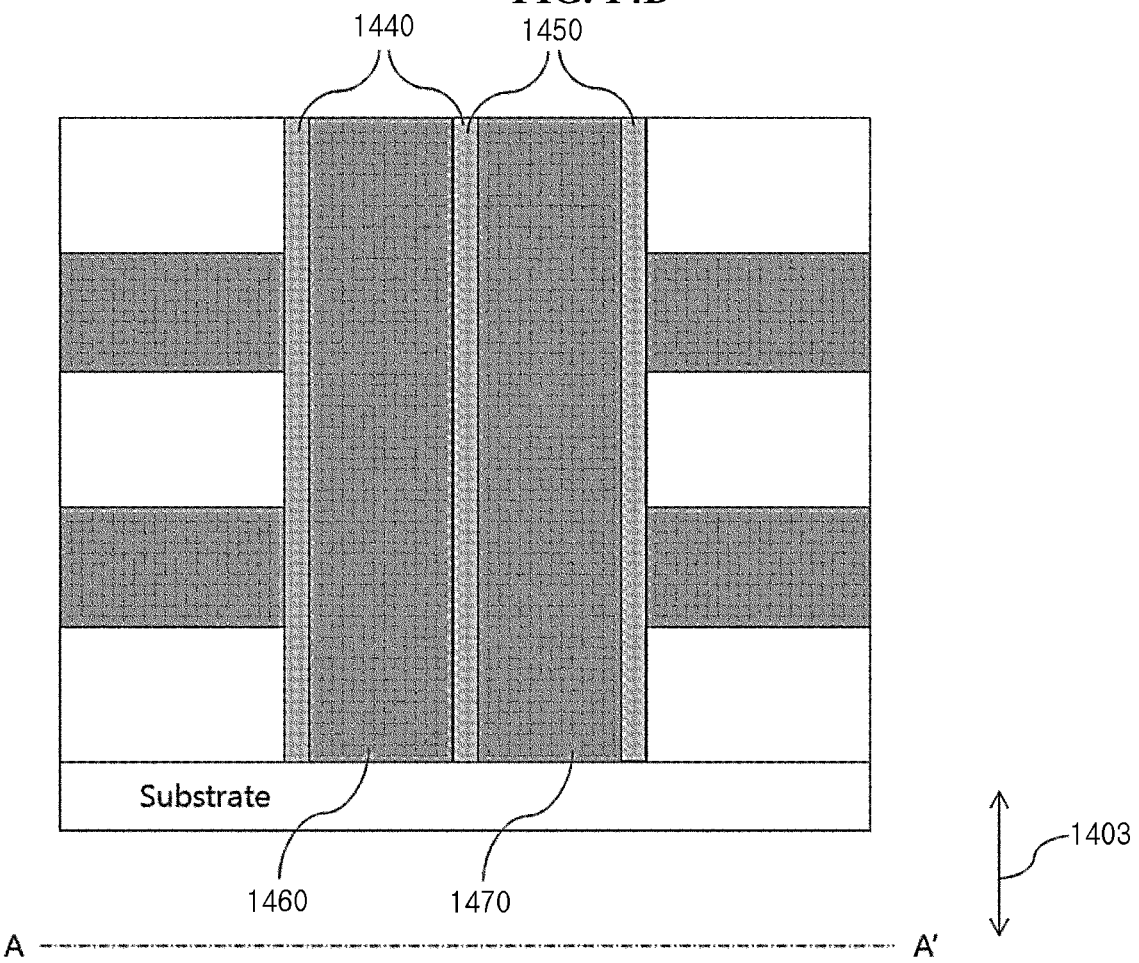
Figure 15A:
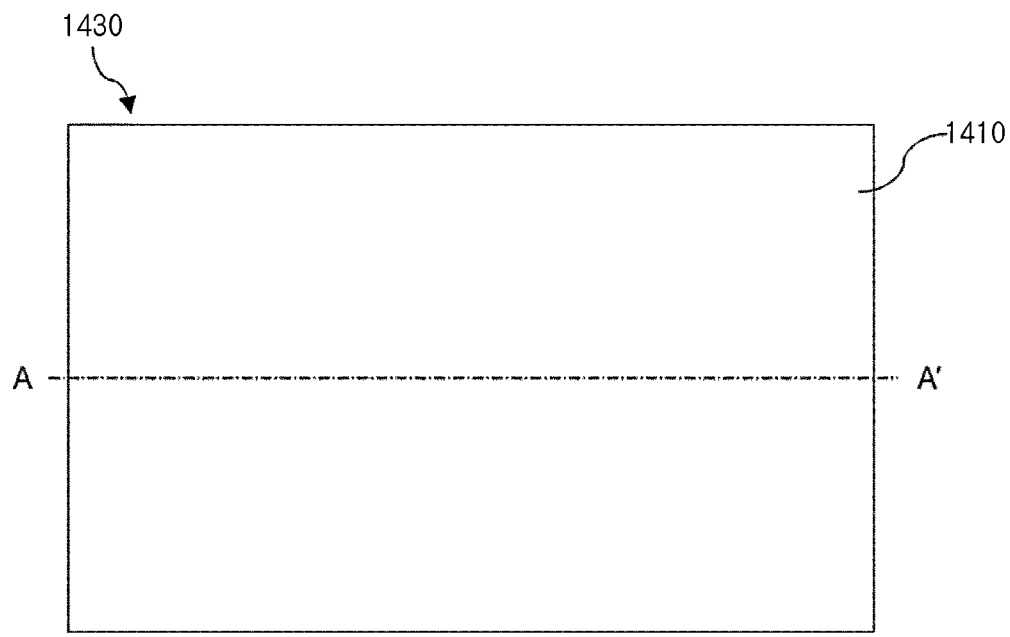

FIGS. 13 through 15D, in a manufacturing system of a three-dimensional flash memory according to an embodiment (hereinafter, referred to as a manufacturing system), a mold structure 1430 in which a plurality of interlayer insulating layers 1410 and a plurality of electrode layers 1420 are alternately stacked on a substrate 1400 as shown in FIGS. 14A and 15A, in operation 1310.

Figure 15B:
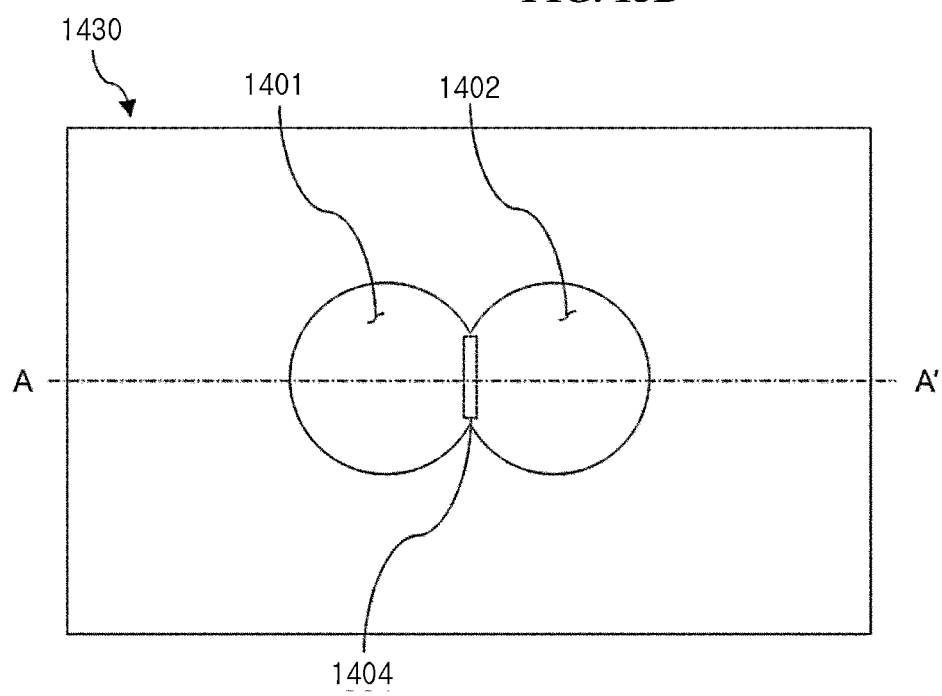

Subsequently, the manufacturing system forms at least two string holes 1401 and 1402 penetrating the mold structure 1430 to expose the substrate 1400 to extend in one direction 1403 as shown in FIGS. 14B and 15B, in operation 1320.

In particular, in operation 1320, the manufacturing system allows the at least two string holes 1401 and 1402 to extend in one direction 1403 such that the at least two string holes 1401 and 1402 are in contact with each other or at least a portion 1404 of the at least two string holes 1401 and 1402 to overlap.

Hereinafter, a case in which the at least two string holes 1401 and 1402 are formed to have the at least a portion 1404 overlapping is described with reference to the drawings, but not to be limited thereto, and a case in which the at least two string holes 1401 and 1402 are formed to be in contact with each other may be performed through the same operations.

Figure 15C:
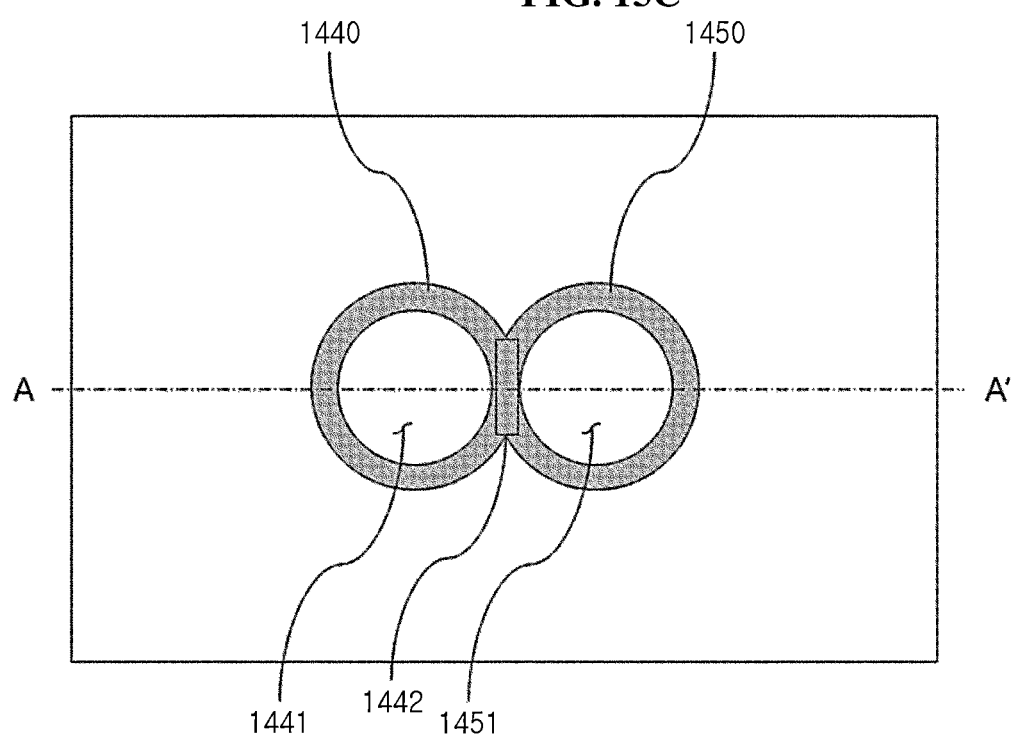

Next, the manufacturing system deposits oxide-nitride-oxide (ONO) in the at least two string holes 1401 and 1402, as shown in FIGS. 14C and 15C, to allow at least two ONO layers 1440 and 1450 including vertical holes 1441 and 1451 therein to be formed and to extend in one direction 1403, respectively, in operation 1330.

Hereinafter, in the drawings, the at least two ONO layers 1440 and 1450 are shown as being composed of one layer, but substantially, the ONO layers 1440 and 1450 may include three layers such as a first oxide layer, a nitride layer, and a second oxide layer.

In this case, because the at least two string holes 1401 and 1402 are formed to be in contact with each other or the at least a portion 1404 thereof is formed to overlap in operation 1320, the at least two ONO layers 1440 and 1450 may be in contact with each other or at least a portion 1442 thereof may be formed to overlap, in operation 1330.

Thereafter, the manufacturing system forms at least two channel layers 1460 and 470 in the vertical holes 1441 and 1451 of the at least two ONO layers 1440 and 1450 to extend in one direction, respectively, as shown in FIGS. 14D and 15D, in operation 1340.

Here, when the at least two channel layers 1460 and 1470 are formed to extend in one direction 1403 in operation 1340, the manufacturing system may properly perform operations 1320 and 1330 such that an inter-surface distance 1480 of the at least two channel layers 1460 and 1470 is 10 nm to 40 nm. That is, when the at least two channel layers 1460 and 1470 are formed to extend in one direction 1403 in operation 1340, the manufacturing system may adjust positions where the at least two string holes 1401 and 1402 are formed on the mold structure 1430 and a distance between the at least two string holes 1401 and 1402 in operation 1320 such that the inter-surface distance 1480 of the at least two channel layers 1460 and 1470 is 10 nm to 40 nm. When the at least two channel layers 1460 and 1470 are formed to extend in one direction 1403 in operation 1340, the manufacturing system may adjust a thickness at which the at least two ONO layers 1440 and 1450 are deposited in the at least two string holes 1401 and 1402 such that the inter-surface distance 1480 of the at least two channel layers 1460 and 1470 is 10 nm to 40 nm.

As described above, the three-dimensional flash memory manufactured through the operations 1310 to 1340 has the structure described above with reference to FIGS. 12A and 12B or the structure described above with reference to FIGS. 11A and 11B. In detail, when the two string holes 1401 and 1402 are formed to be in contact with each other in operation 1320, the three-dimensional flash memory manufactured through operations 1310 to 1340 may have the structure described above with reference to FIGS. 11A and 11B. When the two string holes 1401 and 1402 are formed to have the at least a portion 1404 overlapping each other in operation 1330, the three-dimensional flash memory manufactured through operations 1310 to 1340 may have the structure described above with reference to FIGS. 12A and 12B.

The manufacturing method described above is described as being limited to the case where the ONO layer is used as a charge storage layer for storing charge in the three-dimensional flash memory, but is not limited thereto, and a case where the three-dimensional flash memory uses various charge storage layers may also be performed through the same operations. In this case, operations 1310 to 1340 may be performed by applying various charge storage layers instead of the ONO layer.

Figure 16:
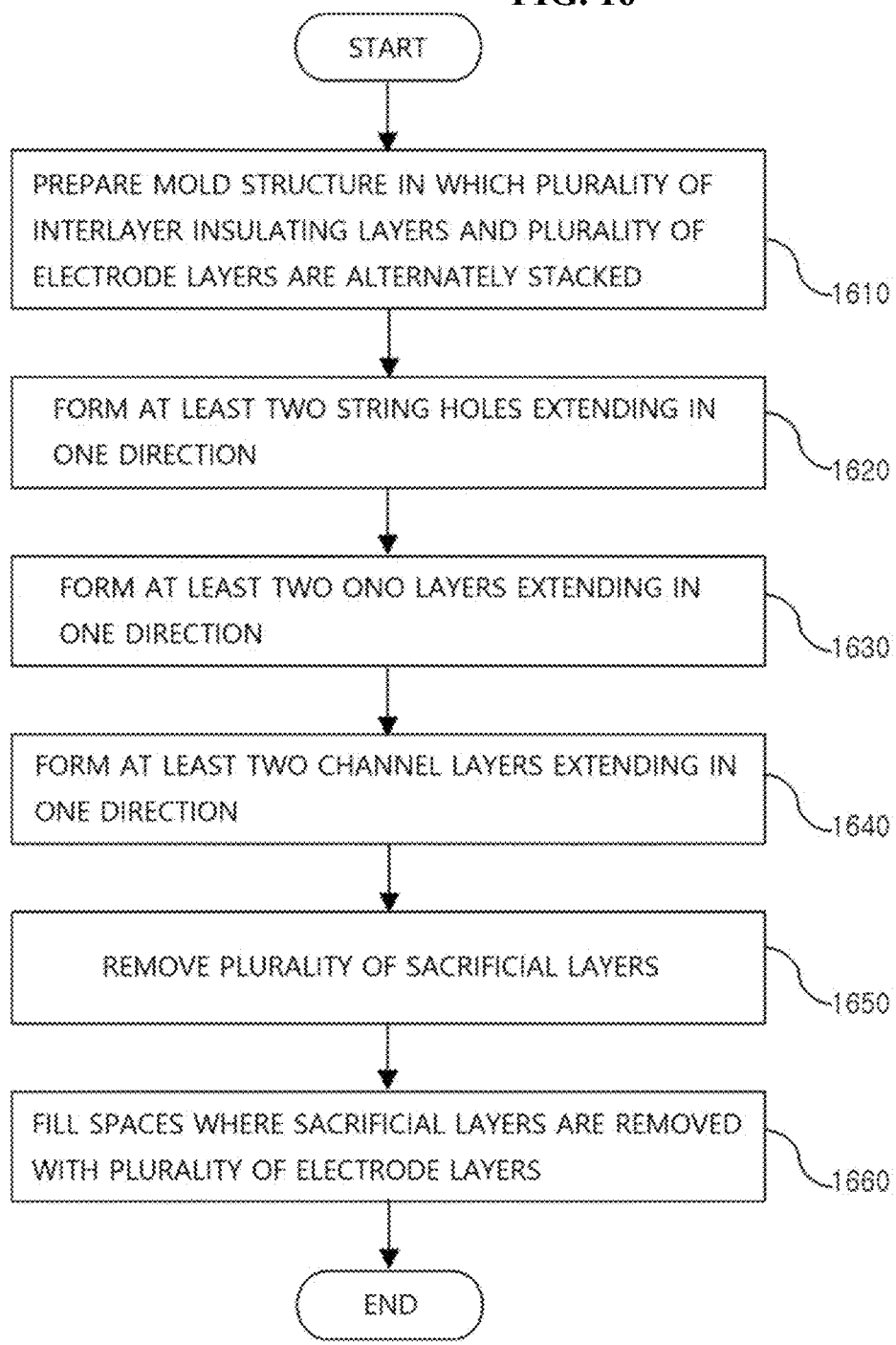
FIG. 16 is a flowchart of a method of manufacturing a three-dimensional flash memory according to another embodiment.

FIG. 16 is a flowchart illustrating a method of manufacturing a three-dimensional flash memory, according to another embodiment. FIGS. 17A to 17F are cross-sectional views illustrating a method of manufacturing a three-dimensional flash memory according to another embodiment. FIGS. 18A to 18D are top views illustrating a method of manufacturing a three-dimensional flash memory according to another embodiment.

Hereinafter, a three-dimensional flash memory manufactured by the manufacturing method of the three-dimensional flash memory has a structure of the three-dimensional flash memory described above with reference to FIGS. 11A and 11B or a structure of the three-dimensional flash memory described above with reference to FIGS. 12A and 12B.

The manufacturing method of the three-dimensional flash memory described below is similar to the manufacturing method described above with reference to FIGS. 13 to 15D, except that sacrificial layers are used.

Figure 17A:
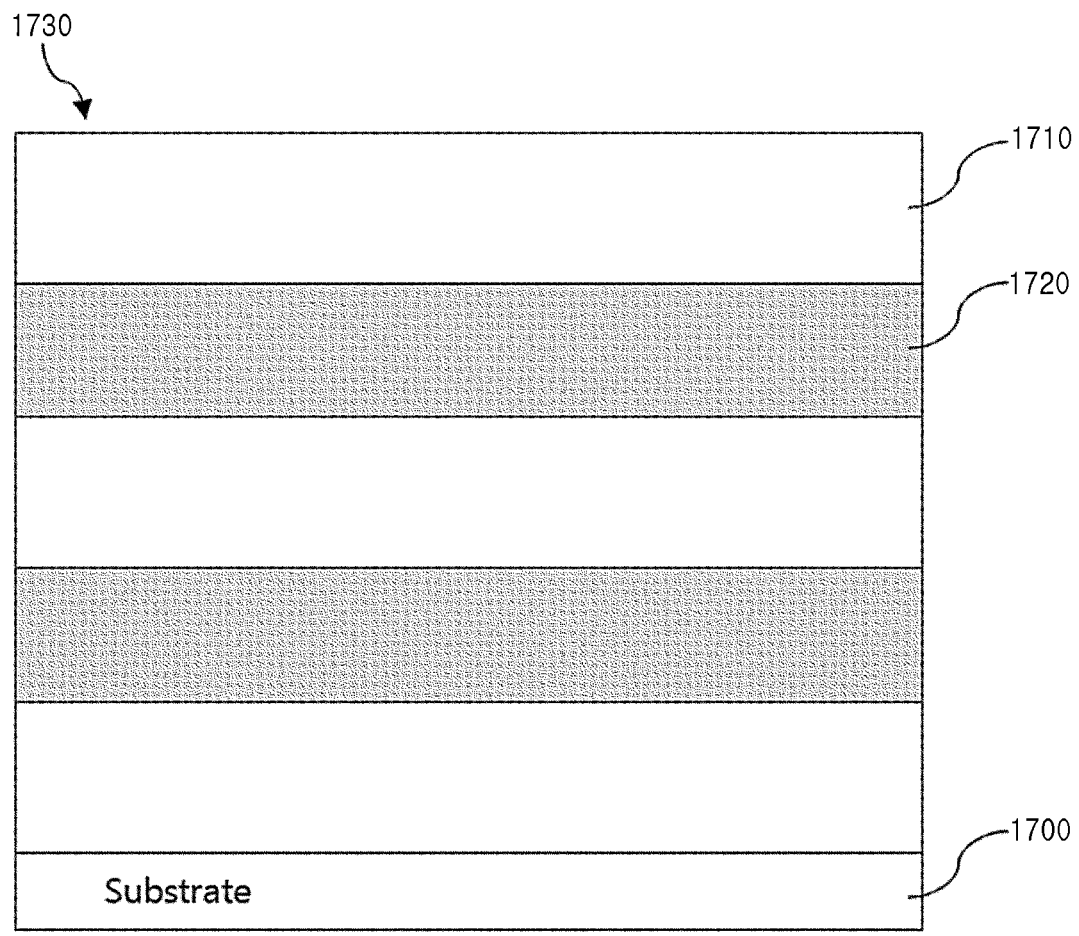
Figure 17B:
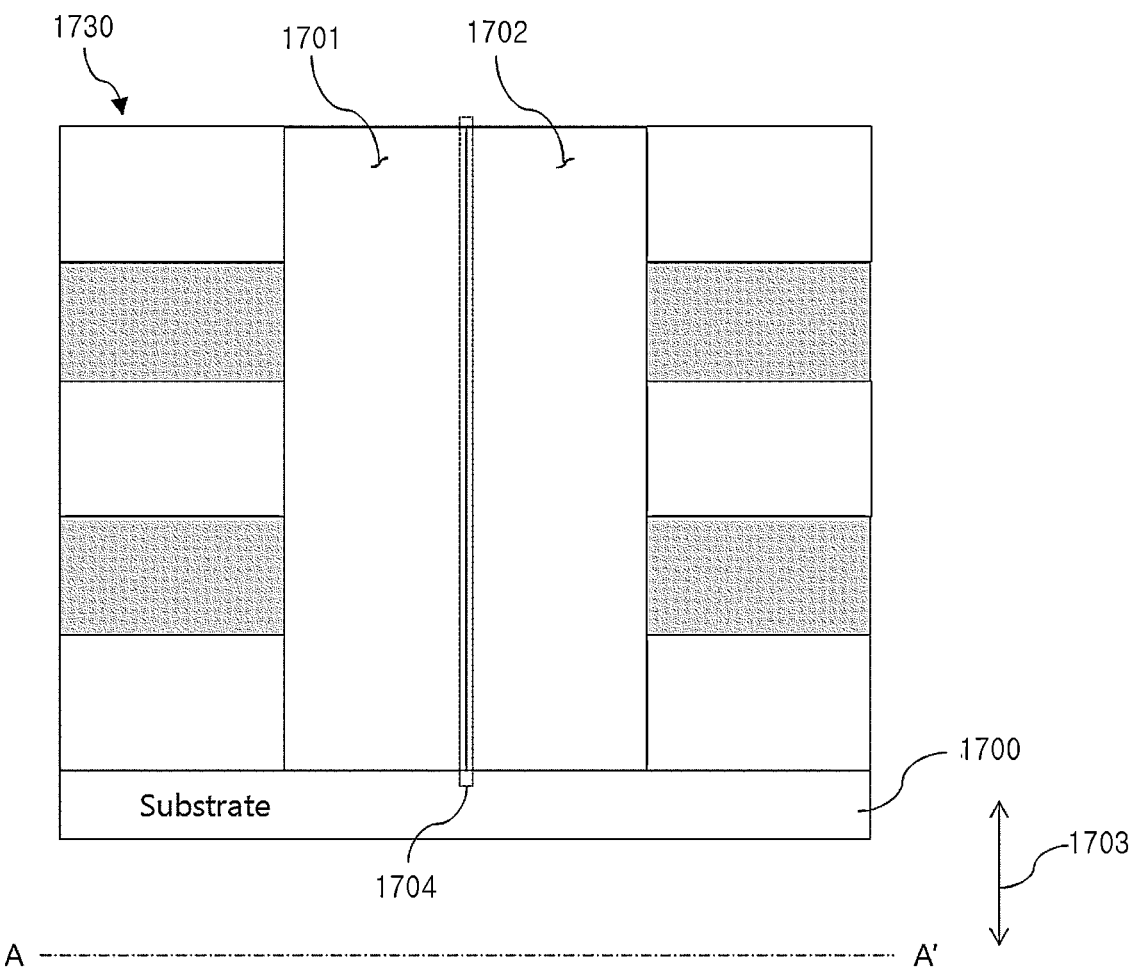
Figure 17C:
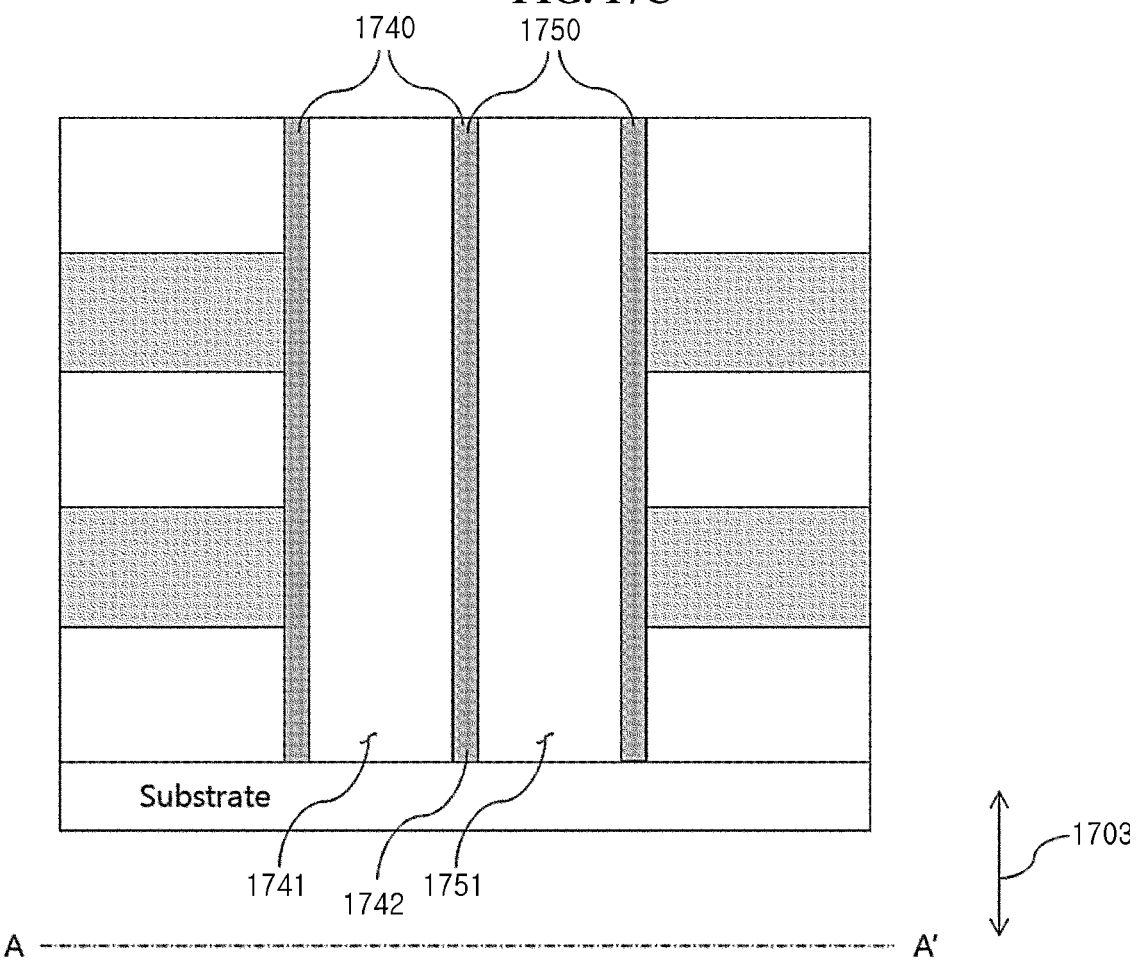
Figure 18A:
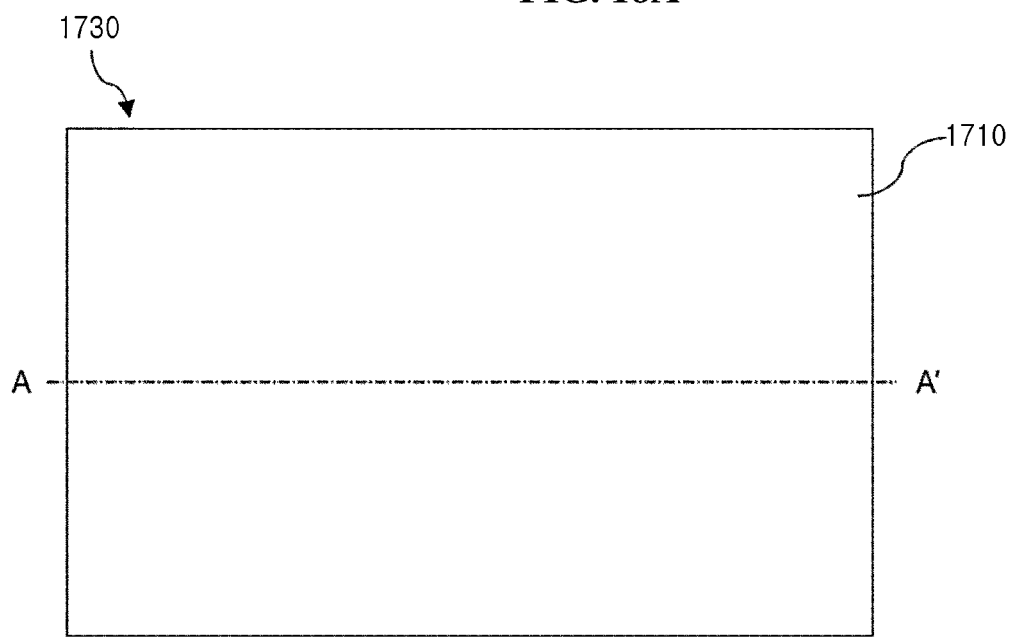
FIGS. 18A to 18D are top views illustrating a method of manufacturing a three-dimensional flash memory according to another embodiment.

Referring to FIGS. 16 to 18D, in a manufacturing system of a three-dimensional flash memory according to another embodiment (hereinafter, referred to as a manufacturing system), a mold structure 1730 in which a plurality of interlayer insulating layers 1710 and a plurality of sacrificial layers 1720 are alternately stacked on a substrate 1700 as shown in FIGS. 17A and 18A, in operation 1610.

Figure 18B:
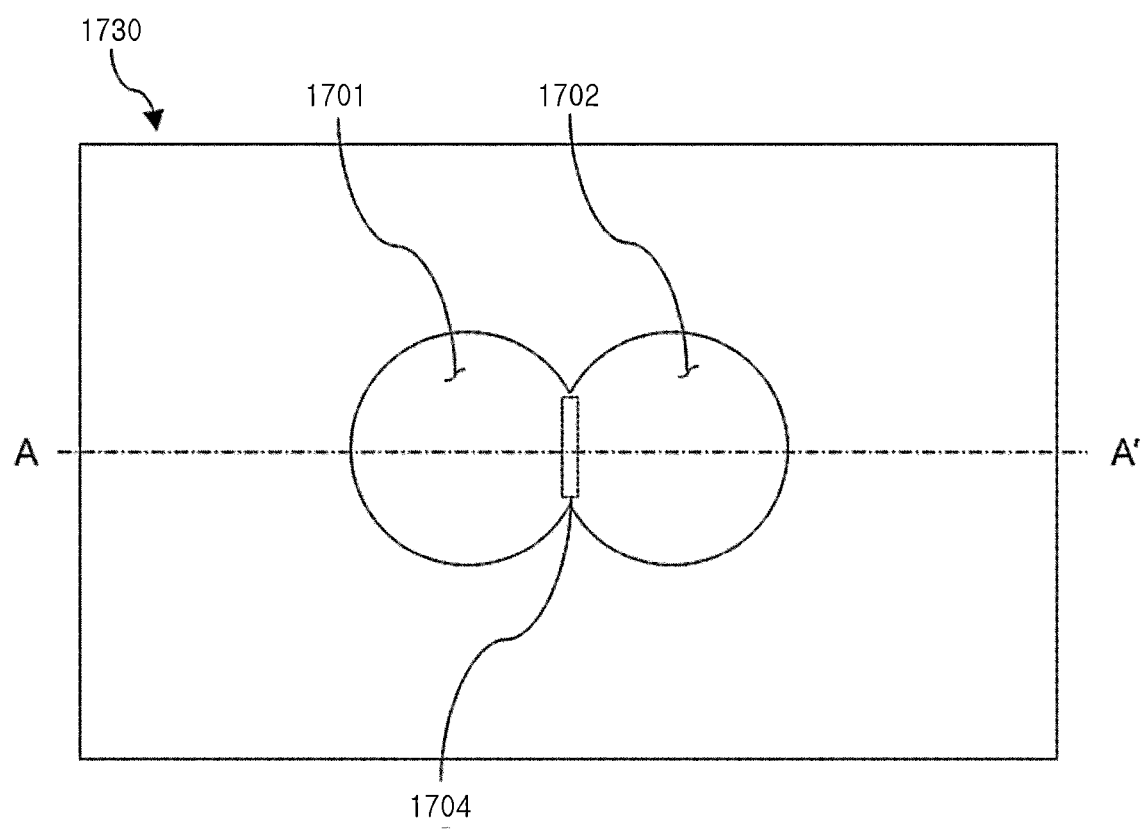

Subsequently, the manufacturing system forms at least two string holes 1701 and 1702 penetrating the mold structure 1730 to expose the substrate 1700 to extend in one direction 1703 as shown in FIGS. 17B and 18B, in operation 1620.

In particular, in operation 1620, the manufacturing system allows the at least two string holes 1701 and 1702 to extend in one direction 1703 such that the at least two string holes 1701 and 1702 are in contact with each other or at least a portion 1704 of the at least two string holes 1701 and 1702 to overlap.

Hereinafter, a case in which at least two string holes 1701 and 1702 are formed to have the at least a portion 1704 overlapping will be described with reference to the drawings, but not to be limited thereto, and a case in which the at least two string holes 1701 and 1702 are formed to be in contact with each other may be performed through the same operations.

Figure 18C:
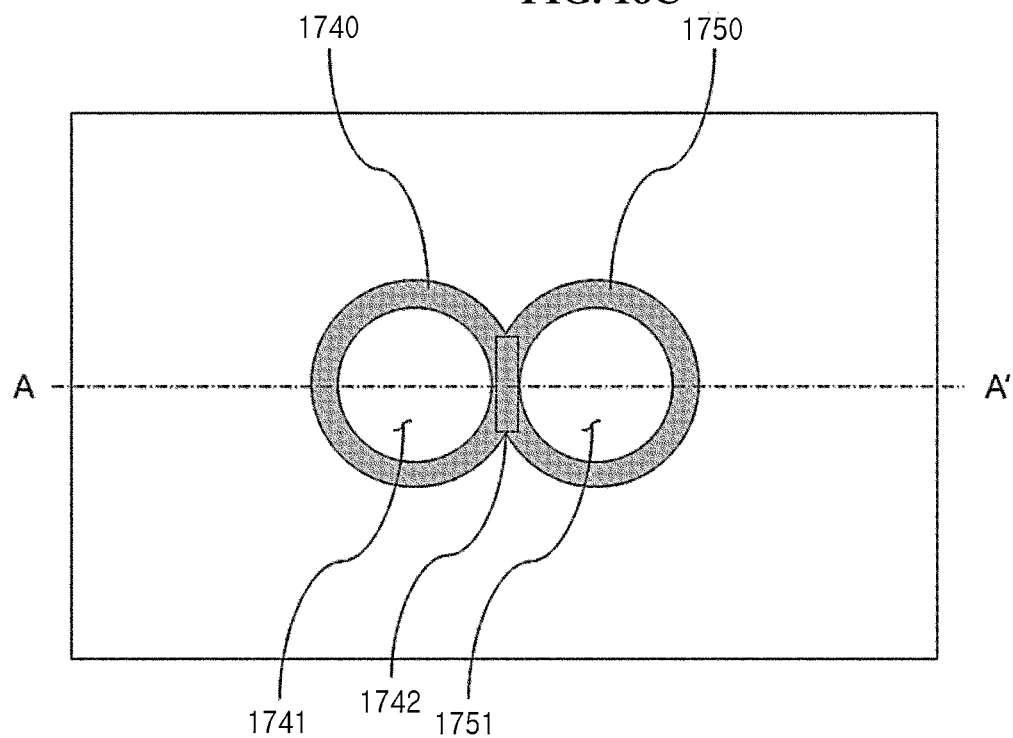

Next, the manufacturing system deposits oxide-nitride-oxide (ONO) in the at least two string holes 1701 and 1702, as shown in FIGS. 17C and 18C, to allow at least two ONO layers 1740 and 1750 including vertical holes 1741 and 1751 therein to be formed and to extend in one direction 1703, in operation 1630.

Hereinafter, in the drawings, the at least two ONO layers 1740 and 1750 are shown as being composed of one layer, but substantially, the ONO layers 1740 and 1750 may include three layers such as a first oxide layer, a nitride layer, and a second oxide layer.

In this case, because the at least two string holes 1701 and 1702 are formed to be in contact with each other or the at least a portion 1704 thereof is formed to overlap in operation 1620, the at least two ONO layers 1740 and 1750 may be in contact with each other or at least a portion 1742 thereof may be formed to overlap, in operation 1630.

Figure 18D:
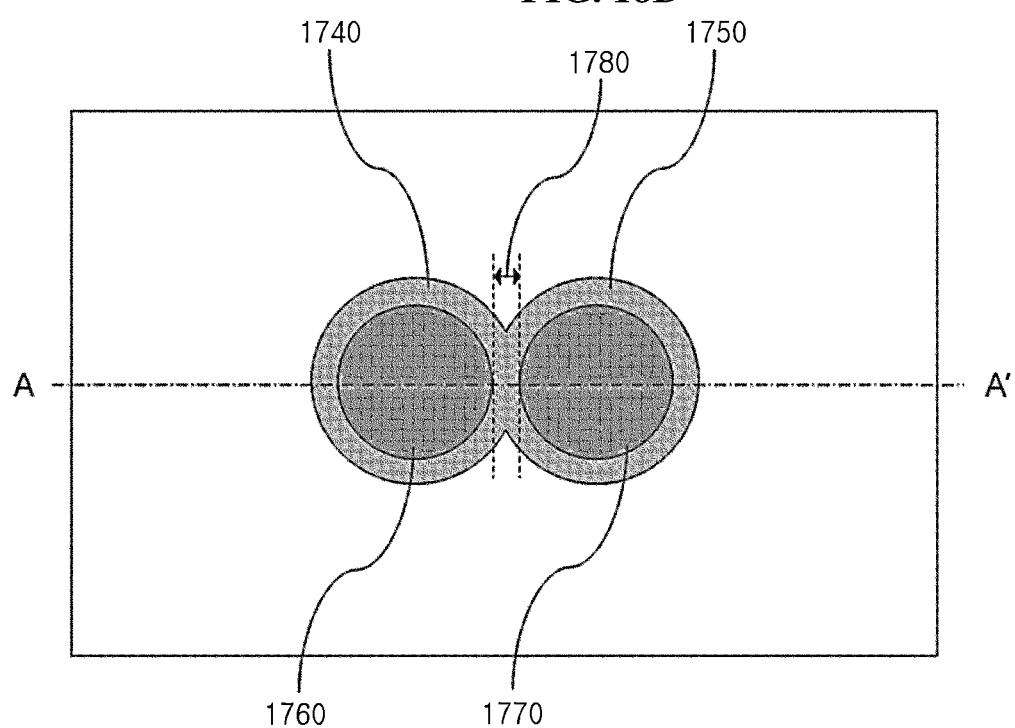
Figure 19:
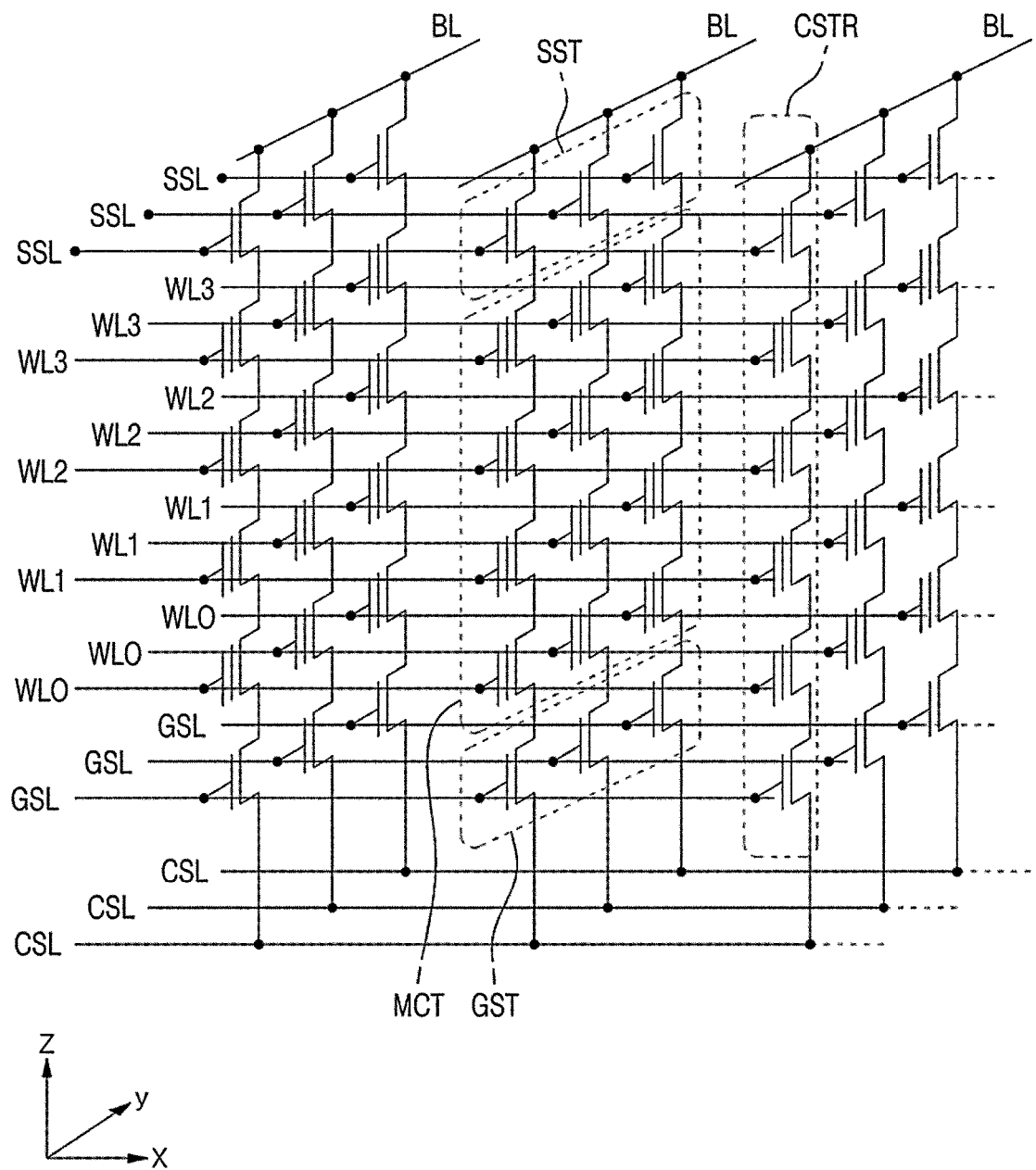
FIG. 19 is a simplified circuit diagram illustrating an array of the conventional three-dimensional flash memory.

Thereafter, the manufacturing system forms at least two channel layers 1760 and 1770 in the vertical holes 1741 and 1751 of the at least two ONO layers 1740 and 1750 to extend in one direction, respectively, as shown in FIGS. 17D and 18D, in operation 1640.

Here, when the at least two channel layers 1760 and 1770 are formed to extend in one direction 1703 in operation 1640, the manufacturing system may properly perform operations 1620 and 1630 such that an inter-surface distance 1780 of the at least two channel layers 1760 and 1770 is 10 nm to 40 nm. That is, when the at least two channel layers 1760 and 1770 are formed to extend in one direction 1703 in operation 1640, the manufacturing system may adjust positions where the at least two string holes 1701 and 1702 are formed on the mold structure 1730 and a distance between the at least two string holes 1701 and 1702 in operation 1620 such that the inter-surface distance 1780 of the at least two channel layers 1760 and 1770 is 10 nm to 40 nm. When the at least two channel layers 1760 and 1770 are formed to extend in one direction 1703 in operation 1640, the manufacturing system may adjust a thickness at which the at least two ONO layers 1740 and 1750 are deposited in the at least two string holes 1701 and 1702 such that the inter-surface distance 1780 of the at least two channel layers 1760 and 1770 is 10 nm to 40 nm.

Next, the manufacturing system removes the plurality of sacrificial layers 1720 as shown in FIG. 17E in operation 1650, and a plurality of electrode layers 1790 is filled in spaces 1721 from which the plurality of sacrificial layers 1720 are removed as shown in FIG. 17F, in operation 1660.

As described above, the three-dimensional flash memory manufactured through the operations 1610 to 1640 has the structure described above with reference to FIGS. 12A and 12B or the structure described above with reference to FIGS. 11A and 11B. In detail, when the two string holes 1701 and 1702 are formed to be in contact with each other in operation 1620, the three-dimensional flash memory manufactured through operations 1610 to 1660 may have the structure described above with reference to FIGS. 11A and 11B. When the two string holes 1701 and 1702 are formed to have the at least a portion 1704 overlapping each other in operation 1630, the three-dimensional flash memory manufactured through operations 1610 to 1640 may have the structure described above with reference to FIGS. 12A and 12B.

The manufacturing method described above is described as being limited to the case where the ONO layer is used as a charge storage layer for storing charge in the three-dimensional flash memory, but is not limited thereto, and a case where the three-dimensional flash memory uses various charge storage layers may also be performed through the same operations. In this case, operations 1610 to 1660 may be performed by applying various charge storage layers instead of the ONO layer.

Figure 21:
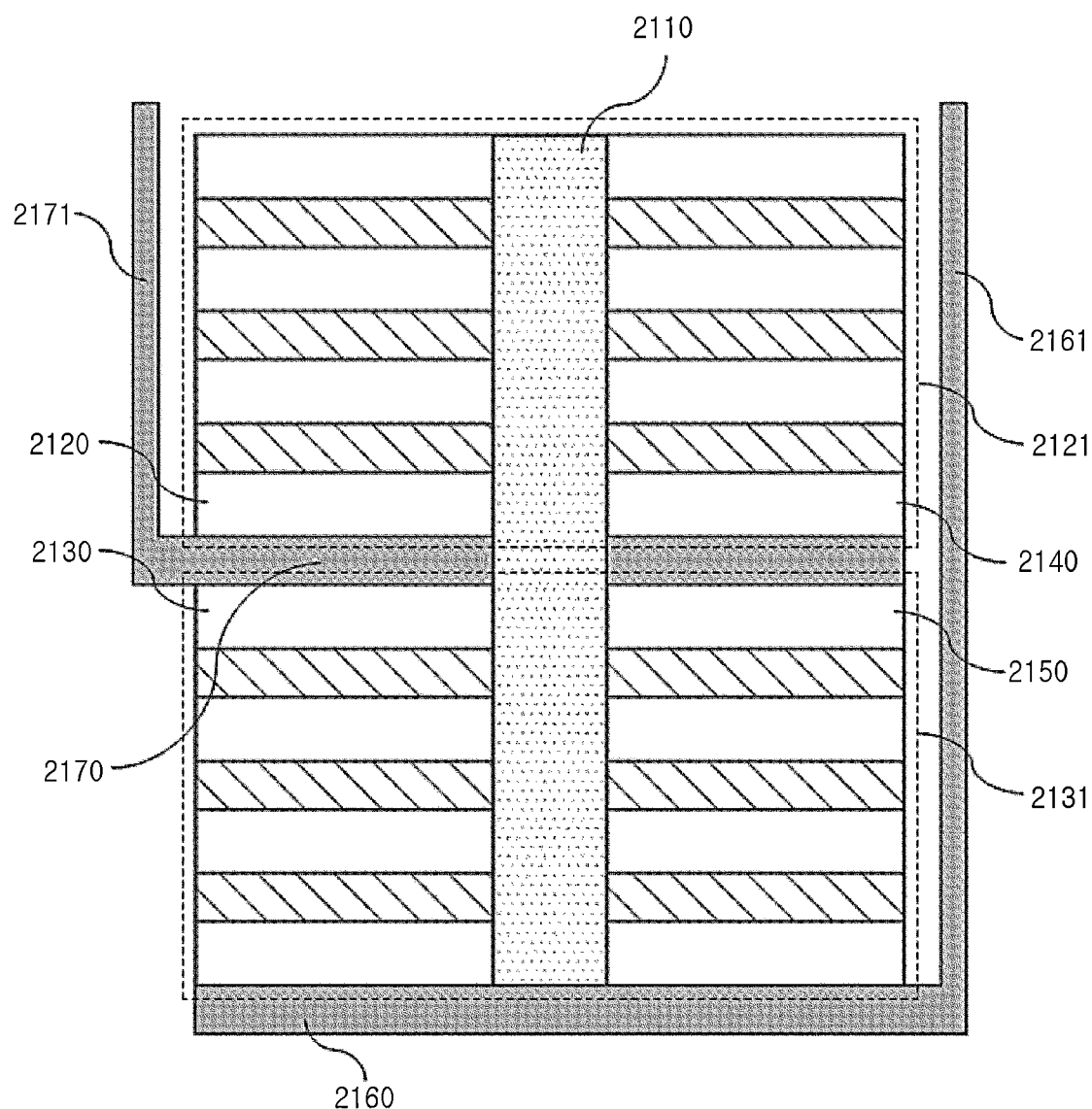
FIG. 21 is a cross-sectional view illustrating a three-dimensional flash memory according to an embodiment.
Figure 22:
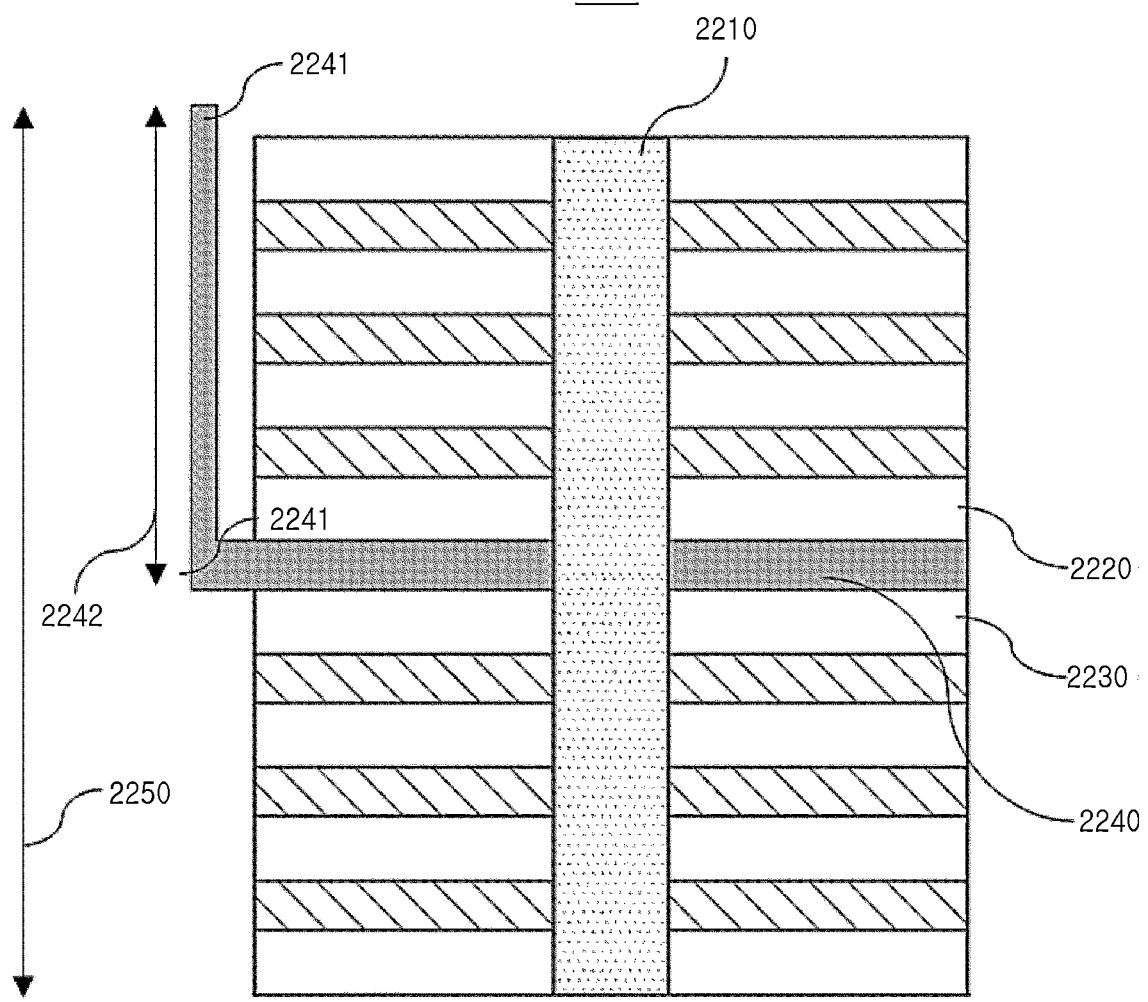
FIG. 22 is a cross-sectional view illustrating a three-dimensional flash memory according to another embodiment.

FIG. 21 is a cross-sectional view illustrating a three-dimensional flash memory according to an embodiment and FIG. 22 is a cross-sectional view illustrating a three-dimensional flash memory according to another embodiment.

Figure 20:
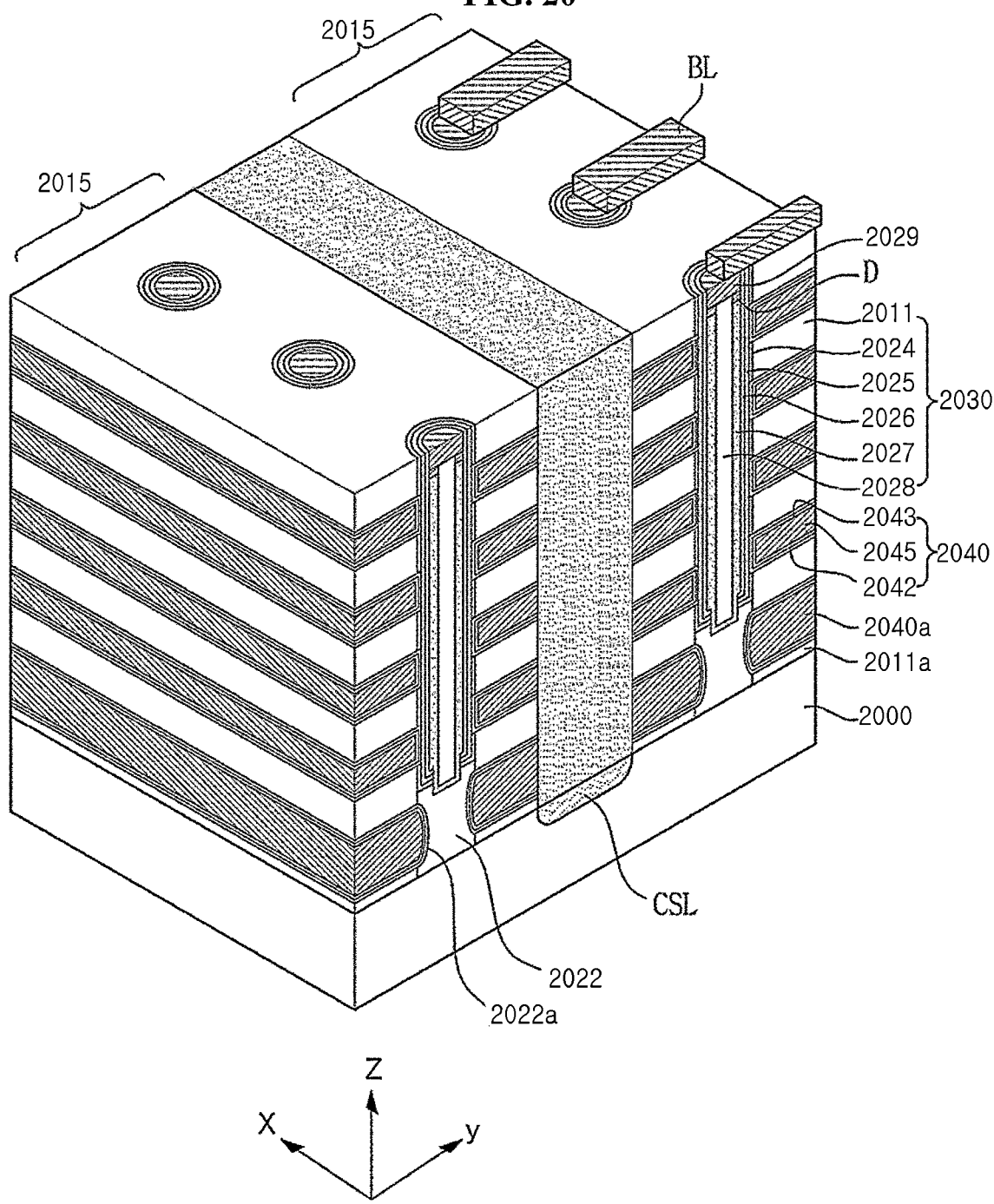
FIG. 20 is a perspective view illustrating a structure of the conventional three-dimensional flash memory.

Referring to FIG. 21, a three-dimensional flash memory 2100 according to an embodiment includes a common source line 2110 extending in one direction (e.g., the common source line 2110 may be formed to extend in a direction corresponding to the z-axis described with reference to FIG. 20), a plurality of electrode layers 2120, 2130, 2140, and 2150 stacked perpendicular to the common source line 2110 (e.g., the plurality of electrode layers 2120, 2130, 2140, and 2150 may be formed to extend in a direction corresponding to the x-axis described with reference to FIG. 20), a lower circuit layer 2160 disposed in a lower region of the common source line 2110, and at least one intermediate circuit layer 2170 disposed between the plurality of electrode layers 2120, 2130, 2140, and 2150 in an intermediate region of the common source line 2110.

Hereinafter, the plurality of electrode layers 2120, 2130, 2140, and 2150 are spaced apart from one another by the common source line 2110 and are grouped to form each of a first group 2120 and 2130 and a second group 2140 and 2150, which corresponds to the electrode structure described above with reference to FIG. 20. Therefore, although not shown in the drawing, in the three-dimensional flash memory 2100, the plurality of electrode layers 2120, 2130, 2140, and 2150 may be penetrated by a vertical structure for each group.

Further, hereinafter, the three-dimensional flash memory 2100 may be described as including the at least one intermediate circuit layer 2170, but is not limited thereto, and may be included in plurality.

The at least one intermediate circuit layer 2170 and the lower circuit layer 2160 may be formed of silicon to form a circuit element (the circuit element includes any one of a transistor, a diode, or a capacitor) for the plurality of electrode layers 2120, 2130, 2140, and 2150 thereon. However, it is not limited or restricted thereto, and various materials having semiconductor characteristics in addition to silicon may be used as the material constituting the at least one intermediate circuit layer 2170 and the lower circuit layer 2160.

In this case, the at least one intermediate circuit layer 2170 and the lower circuit layer 2160 may be provided to correspond to the plurality of grouped blocks 2121 and 2131, respectively while the plurality of electrode layers 2120, 2130, 2140, and 2150 are divided by the at least one intermediate circuit layer 2170. For example, while the plurality of electrode layers 2120, 2130, 2140, and 2150 are divided by the at least one intermediate circuit layer 2170, the plurality of electrode layers 2120, 2130, 2140, and 2150 may be grouped to include a first block 2121 including the first electrode 2120 and the third electrode 2140 and a second block 2131 including the second electrode 2130 and the fourth electrode 2150.

Accordingly, the lower circuit layer 2160 may be in charge of the second block 2131, which is a block located at the lowermost of the plurality of blocks 2121 and 2131, and the at least one intermediate circuit layer 2170 may be in charge of the first block 2121, which is at least one block located above the second block 2131, which is a lowermost block among the plurality of blocks 2121 and 2131. Hereinafter, a fact that the circuit layers 2160 and 2170 are in charge of the blocks 2121 and 2131 means that the circuit element (the circuit element includes any one of a transistor, a diode, or a capacitor) for the blocks 2121 and 2131 is formed in circuit layers 2160 and 2170 to allow the circuit layers 2160 and 2170 to be used by corresponding blocks 2121 and 2131.

The circuit layers 2160 and 2170 may be connected to external wires 2161 and 2171, respectively, and may be connected to the external wires in opposite directions, respectively, to reduce difficulty of a wiring process. In one example, the at least one intermediate circuit layer 2170 may be connected to the external wire 2171 (the external wire for the first block 2121, which is at least one block located above the second block 2131, which is the lowermost block) in a direction opposite to a direction in which the lower circuit layer 2160 is connected to the external wire 2161 (the external wire for the second block 2131, which is the lowermost block). As a more specific example, when the lower circuit layer 2160 is connected with the external wire 2161 in a right direction as shown in the drawing, the at least one intermediate circuit layer 2170 may be connected to the external wire 2171 in a left direction opposite to the right direction.

In the drawing, at least one intermediate circuit layer 2170 is shown as being at least partially penetrated by the common source line 2110, but is not limited thereto. In contrast, at least one intermediate circuit layer 2170 may be formed to at least partially penetrate the common source line 2110.

As described above, the three-dimensional flash memory 2100 according to an embodiment may include the at least one intermediate circuit layer 2170 in the intermediate region of the common source line 2110 to allow the lower circuit layer 2160 and the at least one intermediate circuit layer 2170 to be in charge of each of the plurality of blocks 2121 and 2131. Accordingly, lengths of the wires 2161 and 2171 may be reduced, and thus a problem of deterioration of chip characteristics such as operation speed and power consumption of the conventional three-dimensional flash memory may be solved.

As described above, the case in which the three-dimensional flash memory 2100 includes the lower circuit layer 2160 is described, but is not limited thereto, and the three-dimensional flash memory may include only the at least one intermediate circuit layer. For example, referring to FIG. 22 illustrating a three-dimensional flash memory 2200 according to another embodiment, the three-dimensional flash memory 2200 according to another embodiment may include a common source line 2210 extending in one direction, a plurality of electrode layers 2220 and 2230 stacked perpendicular to the common source line 2210 (e.g., the plurality of electrode layers 2220 and 2230 may be formed to extend in a direction of an x-axis described with reference to FIG. 20), and at least one intermediate circuit layer 2240 disposed between the plurality of electrode layers 2220 and 2230 in an intermediate region of the common source line 2210. In this case, the at least one intermediate circuit layer 2240 may be in charge of the plurality of electrode layers 2220 and 2230 included in the three-dimensional flash memory 2200.

Likewise, in this case, the three-dimensional flash memory 2200 may reduce a length of an external wire 2241 connected to the circuit layer 2240. This is because, in the conventional three-dimensional flash memory, a circuit layer is formed on a substrate positioned at the lowermost region of a plurality of electrode layers and a wire is formed to extend in a vertical direction toward an upper portion of the plurality of electrode layers, thereby having a length equal to 2250 in the drawing, but in the 3D flash memory 2200 according to another embodiment, the circuit layer 2240 is disposed in the intermediate region of the common source line 2210 between the plurality of electrode layers 2220 and 2230 to allow the wire 2241 extending in a vertical direction toward the upper portions of the plurality of electrode layers 2220 and 2230 to have a length equal to 2242.

Figure 23:
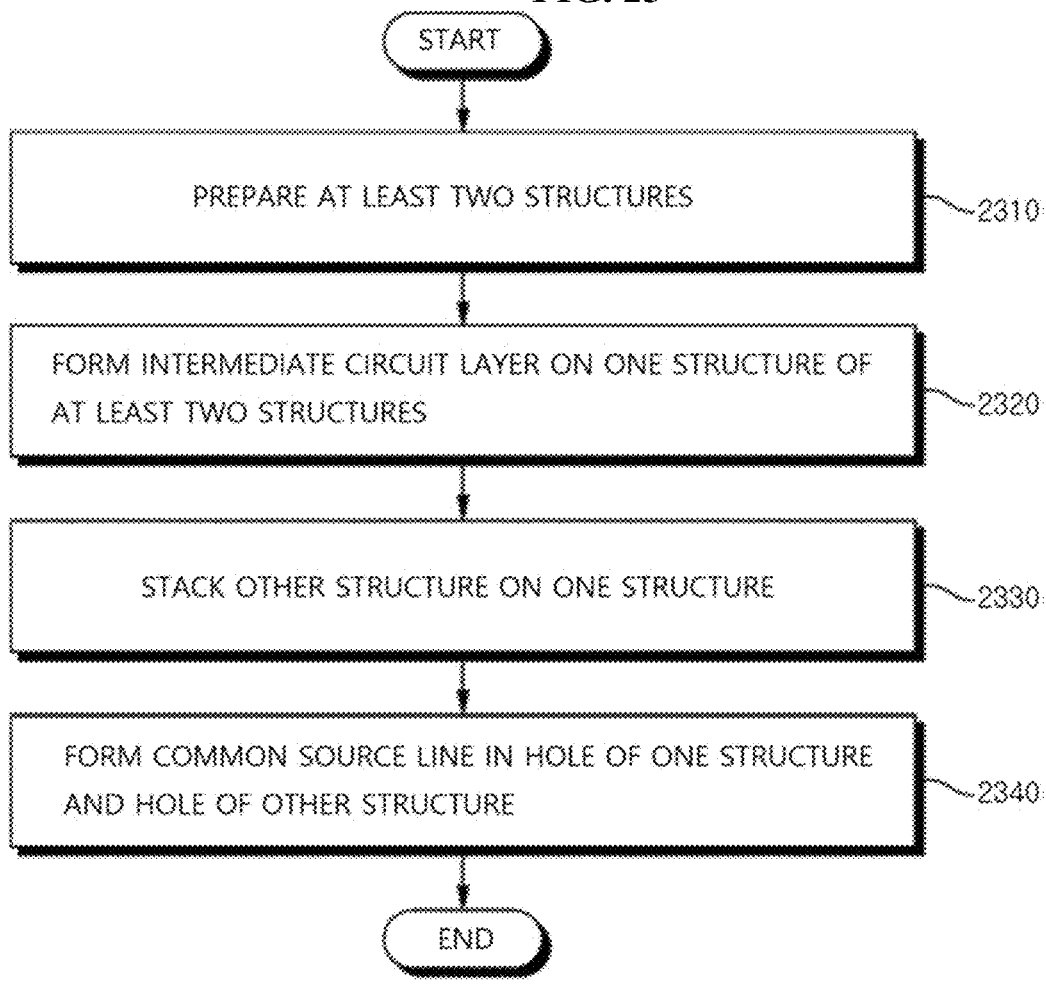
FIG. 23 is a flowchart of a method of manufacturing a three-dimensional flash memory according to an embodiment.
Figure 24:
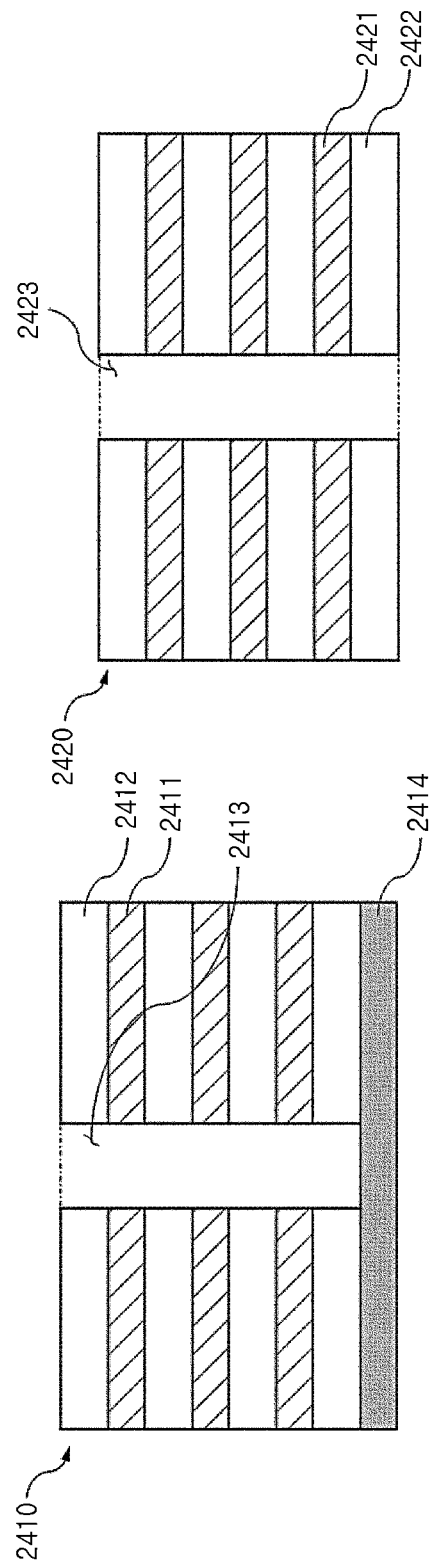
FIGS. 24 to 28 are diagrams for describing a method of manufacturing a three-dimensional flash memory according to an embodiment.

FIG. 23 is a flowchart illustrating a method of manufacturing a three-dimensional flash memory according to an embodiment, and FIGS. 24 to 28 are diagrams illustrating a method of manufacturing a three-dimensional flash memory according to an embodiment.

Referring to FIGS. 23 to 28, a method of manufacturing a three-dimensional flash memory according to an embodiment is performed by a three-dimensional flash memory manufacturing system (hereinafter, referred to as a manufacturing system) and a three-dimensional flash memory device manufactured through the manufacturing method has the structure described above with reference to FIGS. 21 to 22. Hereinafter, a method of manufacturing a three-dimensional flash memory including one of at least one intermediate circuit layer will be described, but, when including a plurality of intermediate circuit layers, a method may performed through operations similar to operations S2310 to S2340 to be described below. For example, in the method of manufacturing the three-dimensional flash memory including the plurality of intermediate circuit layers, after operation S2320 is performed for each of the plurality of structures, a plurality of structures in which the intermediate circuit layers are formed may be sequentially stacked, in operation S2330. In addition, the manufacturing method is not limited or restricted to operations described below, and various operations may be applied such that the three-dimensional flash memory device has the structures described above with reference to FIGS. 21 and 22.

First, in operation S2310, the manufacturing system prepares at least two structures 2410 and 2420 including a plurality of electrode layers 2411 and 2421 and a plurality of interlayer insulating layers 2412 and 2422, which are alternately stacked, and holes 2413 and 2423 extending to penetrate the plurality of the electrode layers 2411 and 2421 and the plurality of interlayer insulating layers 2412 and 2422 in one direction (the z-axis direction described with reference to FIG. 20).

In particular, when the three-dimensional flash memory having the structure described above with reference to FIG. 21 is manufactured, in operation S2310, the manufacturing system may prepare the first structure 2410 which has a silicon base 2414 (the silicon base 2414 is used as a lower circuit layer) below and the second structure 2420 including only the plurality of electrode layers 2421, the plurality of interlayer insulating layers 2242, and the hole 2423, as described above.

When the three-dimensional flash memory having the structure described above with reference to FIG. 22 is manufactured, in operation S2310, the manufacturing system may prepare the first structure 2410 including only the plurality of electrode layers 2411, the plurality of interlayer insulating layers 2412, and a hole 2413, and the second structure 2420 including only the plurality of electrode layers 2421, the plurality of interlayer insulating layers 2422, and a hole 2423.

Hereinafter, operations S2320 to S2340 will be described as a case of manufacturing the three-dimensional flash memory having the above-described structure with reference to FIG. 3, but for a case of manufacturing the three-dimensional flash memory having the above-described structure with reference to FIG. 22, the same operations S2320 to S2340 may be performed.

Figure 25:
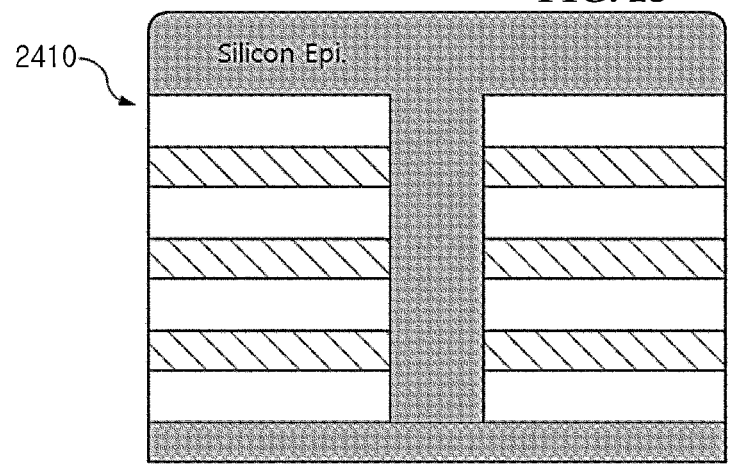
Figure 26:
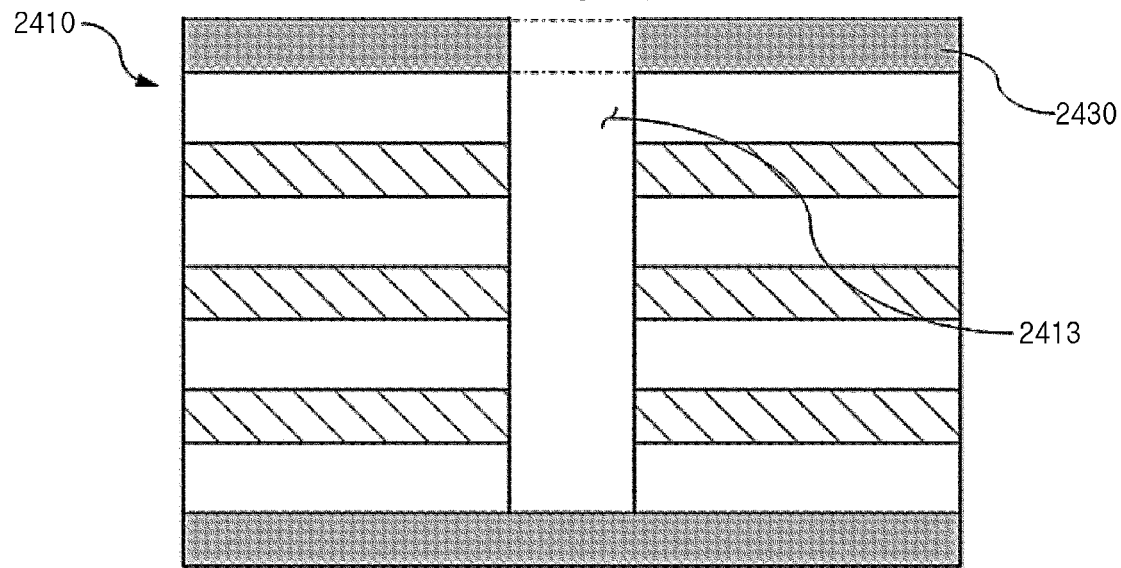

Subsequently, in operation S2320, the manufacturing system generates an intermediate circuit layer 2430 of silicon on any one of the at least two structures 2410 and 2420, as shown in FIGS. 25 and 26. In this case, when the three-dimensional flash memory having the structure described above with reference to FIG. 21 is manufactured, any one structure 2410 in which the intermediate circuit layer 2430 is generated may be the first structure 2410 below which the silicon base 2414 is disposed as shown in the drawing.

In detail, in operation S2320, the manufacturing system epitaxially grows silicon to cover an upper portion of the structure 2410 and the hole 2413 with silicon as shown in FIG. 25, and then silicon filled in the hole 2413 may be etched to allow the intermediate circuit layer 2430 formed of silicon only to remain on the upper portion of the structure 2410 as shown in FIG. 26. The manufacturing system may perform a partial etching process on a portion of silicon remaining on the upper portion of the structure 2410 to make silicon remaining on the upper portion of the structure 2410 the planarized intermediate circuit layer 2430.

Further, in operation 2320, the manufacturing system may form a circuit element, which includes at least one of a transistor, a diode, or a capacitor, on the intermediate circuit layer 2430.

Figure 27:
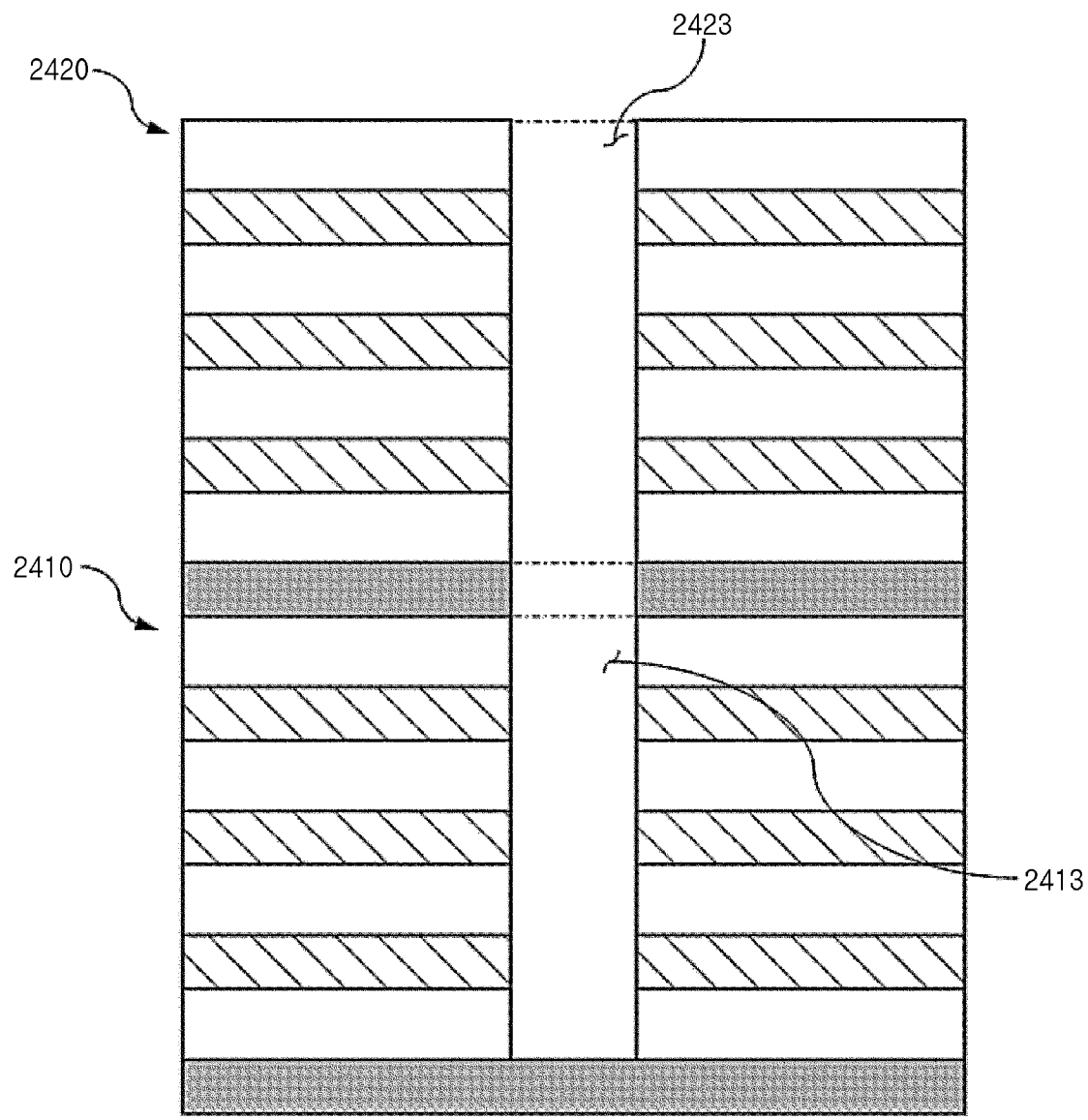

Next, in operation S2330, the manufacturing system stacks the other structure 2420 of the at least two structures 2410 and 2420 on the upper portion of one structure 2410 as shown in FIG. 27. In this case, the manufacturing system may align the one structure 2410 with the other structure 2420 to allow the hole 2413 of the one structure 2410 and the hole 2423 of the other structure 2420 to be in contact with and connected to each other.

Figure 28:
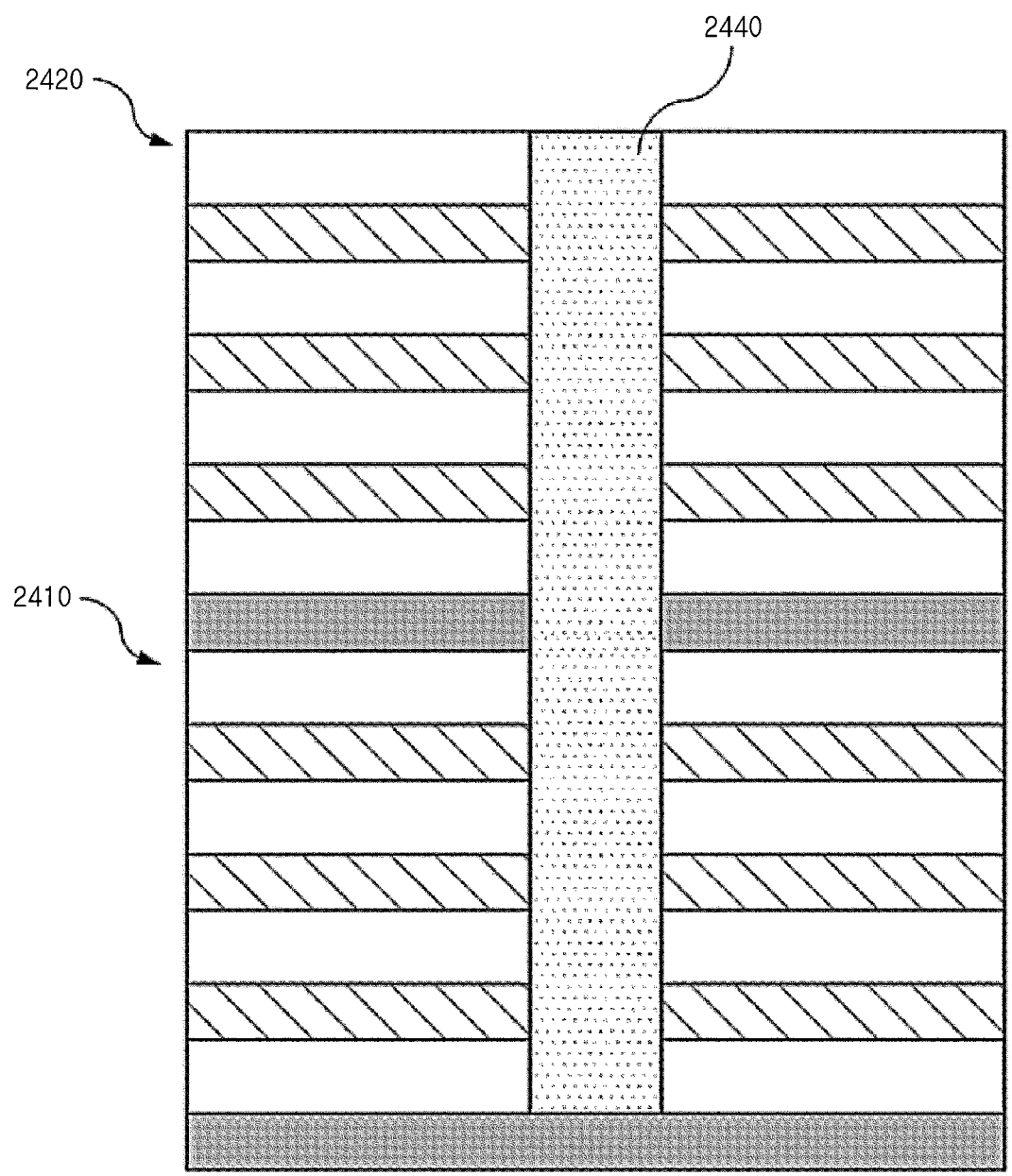

Thereafter, in operation S2340, the manufacturing system fills a metal material into the hole 2413 of the one structure 2410 and the hole 2423 of the other structure 2420, as shown in FIG. 28 to form a common source line 2440. In this case, at least one of W (tungsten), Ti (titanium), Ta (tantalum), Au (copper) or Au (gold) may be used as the metal material forming the common source line 2440. However, it is not limited or restricted thereto, and the material forming the common source line 2440 may be formed of a conductive non-metallic material as well as a metallic material or a mixed material of the metallic material and the non-metallic material.

In addition, although not shown in the drawings, the manufacturing system may connect the intermediate circuit layer 2430 and an external wire while performing operations S2320 to S2340. Here, when the three-dimensional flash memory having the structure described above with reference to FIG. 21 is to be manufactured, the manufacturing system may also connect the silicon base 2414 (the lower circuit layer) to an external wire, and in particular, the intermediate circuit layer 2430 may be connected to the external wire in a direction opposite to a direction in which the silicon base 2414 is connected to the external wire.

While this disclosure includes specific examples, it will be apparent to one of ordinary skill in the art that various changes in form and details may be made in these examples without departing from the spirit and scope of the claims and their equivalents. Suitable results may be achieved if the described techniques are performed in a different order, and/or if components in a described system, architecture, device, or circuit are combined in a different manner, and/or replaced or supplemented by other components or their equivalents.

Accordingly, other implementations, other embodiments, and the equivalents of the claims belong to the scope of the claims.

The invention claimed is:

1. A method of manufacturing a three-dimensional flash memory comprising:
preparing at least two structures each including a plurality of electrode layers and a plurality of interlayer insulating layers which are alternately stacked, and each including a hole penetrating the plurality of electrode layers and the plurality of interlayer insulating layers to extend in one direction;
forming an intermediate circuit layer of silicon on one of the at least two structures;
stacking another of the at least two structures on the one of the at least two structures such that the intermediate circuit layer is between the one of the at least two structures and the other of the at least two structures; and
filling a metal material in a hole of the one of the at least two structures and a hole of the other of the at least two structures to form a common source line.

2. The method of claim 1, wherein the one of the at least two structures comprises a lower circuit layer below the plurality of electrode layers and the plurality of interlayer insulating layers of the one of the at least two structures, and
the intermediate circuit layer and the lower circuit layer correspond to a plurality of blocks grouped with a plurality of electrode layers divided by the intermediate circuit layer, respectively.

3. The method of claim 2, wherein the lower circuit layer is in charge of a first block positioned in a lowermost region of the plurality of blocks, and
wherein the intermediate circuit layer is in charge of a second block positioned above the first block.

4. The method of claim 2, further comprising forming at least two external wires connected to the intermediate circuit layer and the lower circuit layer, respectively.

5. A method of manufacturing a three-dimensional device of a three-dimensional flash memory comprising:
forming a string hole in a plurality of horizontal electrode layers stacked to constitute at least a first vertical cell group and a second vertical cell group stacked over the first vertical cell group; and
filling the string hole with a channel material to form a vertical channel layer,
wherein the forming the string hole comprises:
forming, in a first process, a first through hole corresponding to the first vertical cell group stacked over the second vertical cell group such that the first through hole has a first hole size, and
forming, in a second process, a second through hole corresponding to the second vertical cell group such that the second through hole has a second hole size, and
wherein the first hole size of the first through hole is different from the second hole size of the second through hole, and
wherein the first process is performed separately from the second process.

6. The method of claim 5, wherein the first hole size is greater than the second hole size.

7. The method of claim 5, wherein the forming the string hole further comprises
forming a first stand of the first through hole, and
the forming the first stand is performed before the forming the second through hole.

8. The method of claim 5, wherein the forming the string hole further comprises forming a third through hole corresponding to a third vertical cell group over which the second vertical cell group is stacked, and
the third through hole has a third hole size different from the second hole size.

9. The method of claim 8, wherein the second hole size is greater than the third hole size.

10. The method of claim 8, wherein the forming the string hole further comprises forming a second stand of the second through hole, and
the forming the second stand is performed before the forming the third through hole.

11. The method of claim 5, wherein the first vertical cell group and the second vertical cell group correspond to a first block and a second block, respectively.

12. The method of claim 5, further comprises removing materials between the plurality of horizontal electrode layers to form a plurality of air gaps.

13. The method of claim 12, further comprising:
alternatively stacking a plurality of interlayer insulating layers and a plurality of passivation layers on a substrate; and
forming a string line penetrating the plurality of interlayer insulating layers and the plurality of passivation layers;
etching the plurality of passivation layers; and
applying a conductive material on the etched plurality of passivation layers and the string line;
wherein the removing materials between the plurality of horizontal electrode layers comprises etching the plurality of interlayer insulating layers.

14. The method of claim 13, wherein the forming the string line comprises:
forming a contact hole line penetrating the plurality of interlayer insulating layers and the plurality of passivation layers; and
forming insulating walls on inner sides of the contact hole line.

15. A method of manufacturing a three-dimensional flash memory improving integration comprising:
- preparing a mold structure in which a plurality of first layers and a plurality of second layers are alternately stacked on a substrate;
- forming at least two string holes penetrating the mold structure to expose the substrate and extending in one direction;
- applying a charge storage material in the at least two string holes to form at least two charge storage layers such that each of the at least two charge storage layers includes a vertical hole therein and extends in the one direction; and
- forming at least two channel layers in the vertical hole of each of the at least two charge storage layers and extending in the one direction;
- wherein the forming of the at least two string holes to extend in the one direction includes extending the at least two string holes in the one direction such that the at least two string holes are in contact with each other or a portion of the at least two string holes overlap, and
- wherein each of the plurality of first layers is an interlayer insulating layer, and each of the plurality of second layers is an electrode layer.

16. The method of claim 15, wherein a portion of the charge storage material between the at least two channel layers is in contact with the at least two channel layers.

17. The method of claim 15, wherein the charge storage material is oxide-nitride-oxide (ONO).

* * * * *